US008871589B2

(12) United States Patent
Heineck et al.

(10) Patent No.: US 8,871,589 B2
(45) Date of Patent: Oct. 28, 2014

(54) METHODS OF FORMING SEMICONDUCTOR CONSTRUCTIONS

(71) Applicant: Micron Technology, Inc., Boise, ID (US)

(72) Inventors: Lars P Heineck, Garden City, ID (US); Shyam Surthi, Boise, ID (US); Jaydip Guha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/030,880

(22) Filed: Sep. 18, 2013

(65) Prior Publication Data

US 2014/0017865 A1 Jan. 16, 2014

Related U.S. Application Data

(62) Division of application No. 13/117,408, filed on May 27, 2011, now Pat. No. 8,569,831.

(51) Int. Cl.
*H01L 29/66* (2006.01)
*H01L 27/108* (2006.01)
*H01L 29/78* (2006.01)

(52) U.S. Cl.
CPC .... *H01L 29/66666* (2013.01); *H01L 27/10876* (2013.01); *H01L 27/10823* (2013.01); *H01L 27/10802* (2013.01); *H01L 29/7841* (2013.01); *H01L 27/10885* (2013.01)
USPC ............. 438/267; 438/268; 438/270; 257/71; 257/329; 257/296; 257/E21.41

(58) Field of Classification Search
CPC .................. H01L 27/10802; H01L 27/10823; H01L 29/66666; H01L 27/10885; H01L 29/7841; H01L 27/10876
USPC ............ 438/267, 268, 270; 257/71, 329, 296, 257/E21.41
See application file for complete search history.

(56) References Cited

U.S. PATENT DOCUMENTS 3,562,022 A 2/1971 Shifrin
3,865,624 A 2/1975 Wilde
(Continued)

FOREIGN PATENT DOCUMENTS

KR 10-2004-0055142 6/2004
WO 2013/051662 11/2013

OTHER PUBLICATIONS

Bernstein et al., "Effects of Dopant Deposition on p+/- and n+/- Shallow Junctions Formed by Plasma Immersion Ion Implanatation", IEEE, 2000, pp. 464-467.

(Continued)

*Primary Examiner* — Thinh T Nguyen
(74) *Attorney, Agent, or Firm* — Wells St. John P.S.

(57) ABSTRACT

Some embodiments include memory arrays. The memory arrays may have digit lines under vertically-oriented transistors, with the digit lines interconnecting transistors along columns of the array. Each individual transistor may be directly over only a single digit line, with the single digit line being entirely composed of one or more metal-containing materials. The digit lines can be over a deck, and electrically insulative regions can be directly between the digit lines and the deck. Some embodiments include methods of forming memory arrays. A plurality of linear segments of silicon-containing material may be formed to extend upwardly from a base of the silicon-containing material. The base may be etched to form silicon-containing footings under the linear segments, and the footings may be converted into metal silicide. The linear segments may be patterned into a plurality of vertically-oriented transistor pedestals that extend upwardly from the metal silicide footings.

14 Claims, 43 Drawing Sheets

(56) References Cited

U.S. PATENT DOCUMENTS

| | | | |
|---|---|---|---|
| 4,673,962 A | 6/1987 | Chatterjee et al. | |
| 4,764,394 A | 8/1988 | Conrad | |
| 4,920,390 A | 4/1990 | Fuse et al. | |
| 5,374,456 A | 12/1994 | Matossian et al. | |
| 5,508,212 A | 4/1996 | Wang et al. | |
| 5,627,390 A | 5/1997 | Maeda et al. | |
| 5,672,541 A | 9/1997 | Booske et al. | |
| 5,828,094 A | 10/1998 | Lee | |
| 5,897,363 A | 4/1999 | Gonzalez et al. | |
| 6,137,713 A | 10/2000 | Kuroda et al. | |
| 6,225,151 B1 | 5/2001 | Gardner et al. | |
| 6,329,686 B1 | 12/2001 | Lowrey et al. | |
| 6,417,040 B2 | 7/2002 | Noble | |
| 6,492,245 B1 | 12/2002 | Liu et al. | |
| 6,504,201 B1 | 1/2003 | Noble et al. | |
| 6,563,162 B2 | 5/2003 | Han et al. | |
| 6,582,998 B2 | 6/2003 | Nitta | |
| 6,593,612 B2 | 7/2003 | Gruening et al. | |
| 6,600,191 B2 | 7/2003 | Lowrey et al. | |
| 6,639,846 B2 | 10/2003 | Nikutta | |
| 6,689,660 B1 | 2/2004 | Noble et al. | |
| 6,716,727 B2 | 4/2004 | Walther | |
| 6,977,417 B2 | 12/2005 | Momiyama et al. | |
| 6,992,349 B2 | 1/2006 | Lee et al. | |
| 7,015,091 B1 | 3/2006 | Wu | |
| 7,052,941 B2 | 5/2006 | Lee | |
| 7,074,656 B2 | 7/2006 | Yeo et al. | |
| 7,099,174 B2 | 8/2006 | Thompson et al. | |
| 7,129,538 B2 | 10/2006 | Lee et al. | |
| 7,166,479 B2 | 1/2007 | Zhu et al. | |
| 7,179,703 B2 | 2/2007 | Gonzalez et al. | |
| 7,365,384 B2 | 4/2008 | Tran et al. | |
| 7,456,068 B2 | 11/2008 | Kavalieros et al. | |
| 7,491,641 B2 | 2/2009 | Southwick et al. | |
| 7,501,676 B2 | 3/2009 | Doyle | |
| 7,518,182 B2 * | 4/2009 | Abbott et al. | 257/329 |
| 7,592,212 B2 | 9/2009 | Qin et al. | |
| 7,713,823 B2 | 5/2010 | Sung et al. | |
| 7,736,969 B2 | 6/2010 | Abbott et al. | |
| 7,737,010 B2 | 6/2010 | Qin et al. | |
| 7,768,073 B2 | 8/2010 | Wells | |
| 7,939,409 B2 | 5/2011 | Figura et al. | |
| 7,948,064 B2 | 5/2011 | Barth et al. | |
| 7,956,402 B2 | 6/2011 | Chen et al. | |
| 8,008,158 B2 | 8/2011 | Chang et al. | |
| 2002/0110039 A1 | 8/2002 | Forbes et al. | |
| 2003/0096490 A1 | 5/2003 | Borland et al. | |
| 2003/0107911 A1 | 6/2003 | Nishihara et al. | |
| 2003/0186519 A1 | 10/2003 | Downey et al. | |
| 2004/0132232 A1 | 7/2004 | Noble | |
| 2004/0195594 A1 | 10/2004 | Tran et al. | |
| 2005/0017281 A1 | 1/2005 | Lowrey | |
| 2005/0079721 A1 | 4/2005 | Buerger Jr., et al. | |
| 2005/0260838 A1 | 11/2005 | Downey et al. | |
| 2006/0017088 A1 * | 1/2006 | Abbott et al. | 257/302 |
| 2006/0059449 A1 | 3/2006 | Yang et al. | |
| 2006/0081884 A1 | 4/2006 | Abbott et al. | |
| 2006/0249770 A1 | 11/2006 | Huo et al. | |
| 2007/0087574 A1 | 4/2007 | Gupta et al. | |
| 2007/0243680 A1 | 10/2007 | Harari et al. | |
| 2008/0142931 A1 | 6/2008 | Sasaki et al. | |
| 2008/0217655 A1 | 9/2008 | Baumann et al. | |
| 2008/0268628 A1 | 10/2008 | Kohli et al. | |
| 2008/0277738 A1 | 11/2008 | Ananthan | |
| 2009/0121268 A1 | 5/2009 | Lee et al. | |
| 2009/0256187 A1 | 10/2009 | Kim | |
| 2010/0237423 A1 | 9/2010 | Yun et al. | |
| 2011/0019486 A1 | 1/2011 | Jang et al. | |
| 2011/0215391 A1 | 9/2011 | Takaishi | |
| 2011/0215408 A1 | 9/2011 | Tang et al. | |
| 2011/0220994 A1 | 9/2011 | Parekh et al. | |
| 2012/0104491 A1 | 5/2012 | Heineck et al. | |
| 2012/0214285 A1 | 8/2012 | Guha et al. | |
| 2013/0168757 A1 | 7/2013 | Hong | |

OTHER PUBLICATIONS

Gras-Marti, "Recoil Implanatation Yields and Depth Profiles", Phys. Stat. Sol. 76(1), 1983, pp. 621-627.

Oh et al., "Characterization of B2H6 Plasma Doping for Converted p+ Poly-Si Gate", Ion Implantation Technology, 2006, pp. 25-28.

Qin et al., "Comparative Study of Self-Sputtering Effects of Different Boron-Based Low-Energy Doping Techniques", IEEE, 2009, pp. 1760-1766.

Rucker et al., "Dopant Diffusion in C-Doped and Si and SiGe: Physical Model and Experimental Verification"; Institution for Semiconductor Physics; 1999; 4 pp.

* cited by examiner

METHODS OF FORMING SEMICONDUCTOR CONSTRUCTIONS

RELATED PATENT DATA

This patent resulted from a divisional of U.S. patent application Ser. No. 13/117,408, which was filed May 27, 2011, and which is hereby incorporated herein by reference.

TECHNICAL FIELD

Memory arrays, semiconductor constructions, and methods of forming semiconductor constructions.

BACKGROUND

Memory is one type of integrated circuitry, and is used in computer systems for storing data. Memory may be fabricated in one or more arrays of individual memory cells. The memory cells are written to, or read from, utilizing digit lines (which may also be referred to as bitlines or sense lines) and access lines (which may also be referred to as wordlines). The digit lines may electrically interconnect memory cells along columns of the array, and the access lines may electrically interconnect memory cells along rows of the array. Thus, each memory cell may be uniquely addressed through the combination of a digit line and an access line.

Example memory cells are dynamic random access memory (DRAM) cells. A DRAM unit cell may comprise a transistor coupled with a charge-storage device, such as a capacitor. Other example memory cells may lack the capacitors of conventional DRAM, and instead may utilize electrically floating transistor bodies. Memory which utilizes electrically floating transistor bodies to store data may be referred to as zero-capacitor-one-transistor (0C1T) memory, as capacitor-less memory, or as ZRAM™ (zero capacitance DRAM), and may be formed to much higher levels of integration than DRAM.

A continuing goal of integrated circuit fabrication is to increase the level of integration. There may be corresponding goals to decrease the size of memory devices, to simplify memory devices, and/or to reduce the complexity and amount of wiring associated with memory devices. Another continuing goal of integrated circuit fabrication is to reduce the number of steps of a fabrication process, which can improve throughput and which may possibly reduce costs. Yet another goal is to achieve low resistance wiring, which can improve speed.

It would be desired to develop new memory architecture, and new methods of forming memory architecture, which further some or all of the above-discussed goals.

DETAILED DESCRIPTION OF THE ILLUSTRATED EMBODIMENTS

Some embodiments include memory array architectures having digit lines beneath vertically-oriented transistors, with the digit lines comprising only metal-containing material. Such digit lines can have low electrical resistance compared to conventional digit lines, and thus can improve speed and reliability relative to conventional digit lines. The transistors may be electrically coupled to charge-storage devices (for instance, capacitors), and thus the memory array architecture may be a DRAM array. Alternatively, the transistors may comprise floating bodies, and thus the memory array architecture may be a ZRAM array.

Some embodiments include methods of forming memory array architectures. Some example methods may include formation of metal silicide footers beneath semiconductor material segments, with such metal silicide footers ultimately being incorporated into digit lines. The semiconductor material segments may be patterned into vertically-oriented transistor pedestals, with such pedestals being directly against the metal silicide of the digit lines. Some example methods may include formation of semiconductor material bridges over a deck. Subsequently, metal-containing material may be formed along the bottoms of the bridges to create digit lines, with such digit lines being spaced from the deck by gaps. The gaps may be left empty, or may be filled with electrically insulative material that is solid, or at least semisolid.

Example embodiments are described with reference to FIGS. 1-43.

Figure 1:
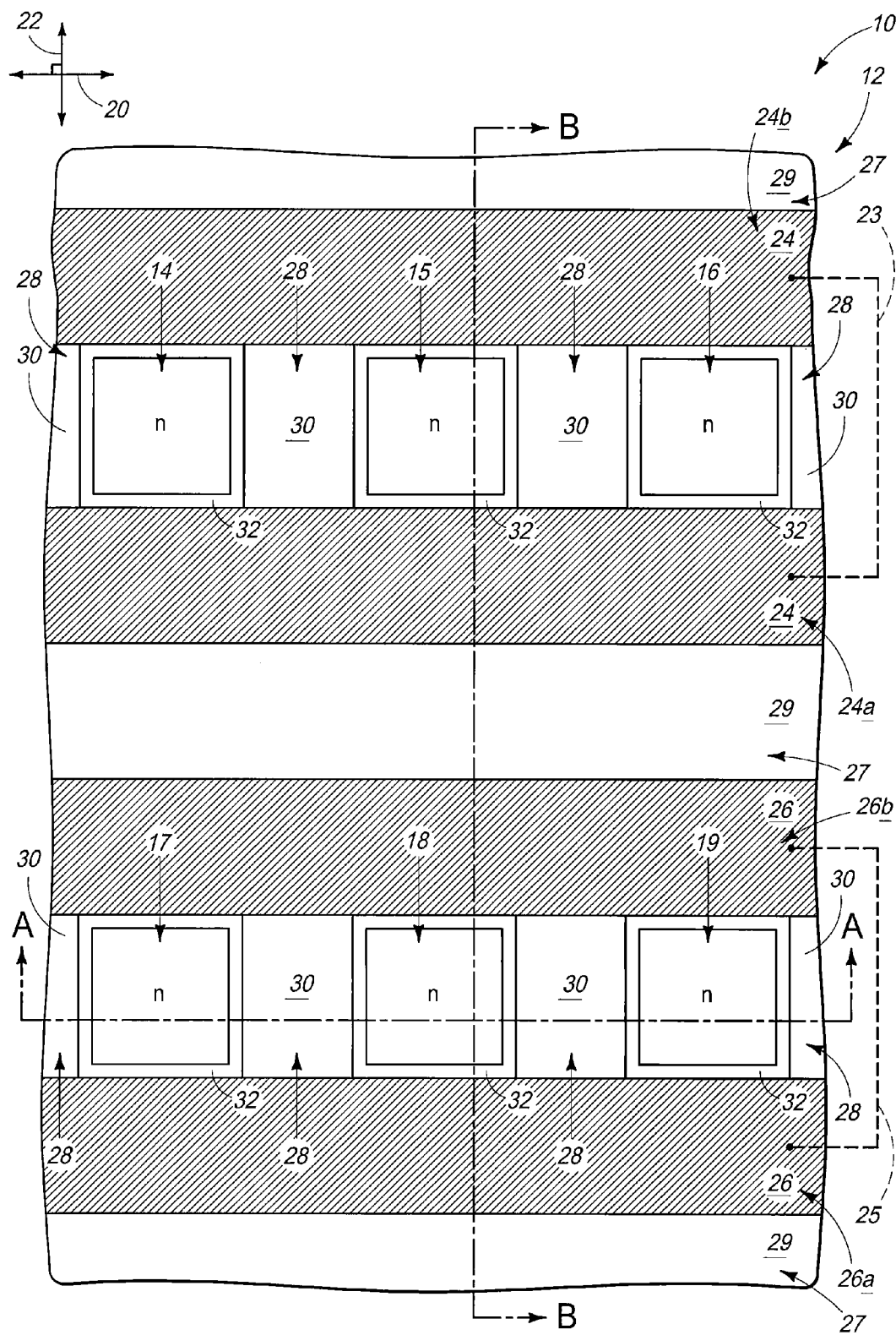
FIG. 1 is a diagrammatic top view of a portion of a semiconductor construction illustrating an example embodiment memory array architecture.

Referring initially to FIG. 1, a fragment of a semiconductor construction 10 is shown in top view. Such fragment comprises a portion of a memory array 12. The memory array includes a plurality of vertically-oriented transistor pedestals 14-19. The transistor pedestals may be considered to be arranged in rows and columns within the array, and in the shown embodiment the rows extend parallel to a first axis 20, while the columns extend parallel to a second axis 22 that is substantially orthogonal to the first axis. In the shown embodiment, the tops of the transistor pedestals are n-type doped source/drain regions.

Access lines 24 and 26 extend along the rows of the memory array, and interconnect transistor pedestals along such rows. The individual access lines are shown to split into two segments that are on opposing sides of the individual rows. Specifically, access line 24 is shown split into segments 24a and 24b, and access line 26 is shown split into segments 26a and 26b. The segments of the individual access lines join to one another at a periphery of the array, as diagrammatically illustrated with dashed lines 23 and 25.

The access line 24 is spaced from the access line 26 by an electrically insulative region 27 comprising electrically insulative material 29.

Adjacent transistor pedestals are spaced from one another by electrically insulative regions 28 that comprise electrically insulative material 30. In some embodiments, electrically insulative materials 29 and 30 may be a same composition as one another, and in other embodiments the electrically insulative materials 29 and 30 may differ in composition relative to one another. In some embodiments, the insulative material 30 may be omitted, and the access lines may be within the regions 28 in gate all-around type constructions (which may be alternatively referred to as gate wrap-around type constructions).

Gate dielectric material 32 is around the transistor pedestals, and spaces the access lines 24 and 26 from the pedestals. In operation, the gate dielectric, access lines, and transistor pedestals together form a plurality of vertically-oriented transistors within the memory array.

Digit lines are under the transistor pedestals and interconnect the transistor pedestals along the columns of the memory array 12, (the digit lines are not visible in the top view of FIG. 1, but example digit lines are shown in FIGS. 2-5). Each of the transistors of the memory array may be uniquely addressed through the combination of an access line and a digit line.

Figure 2:
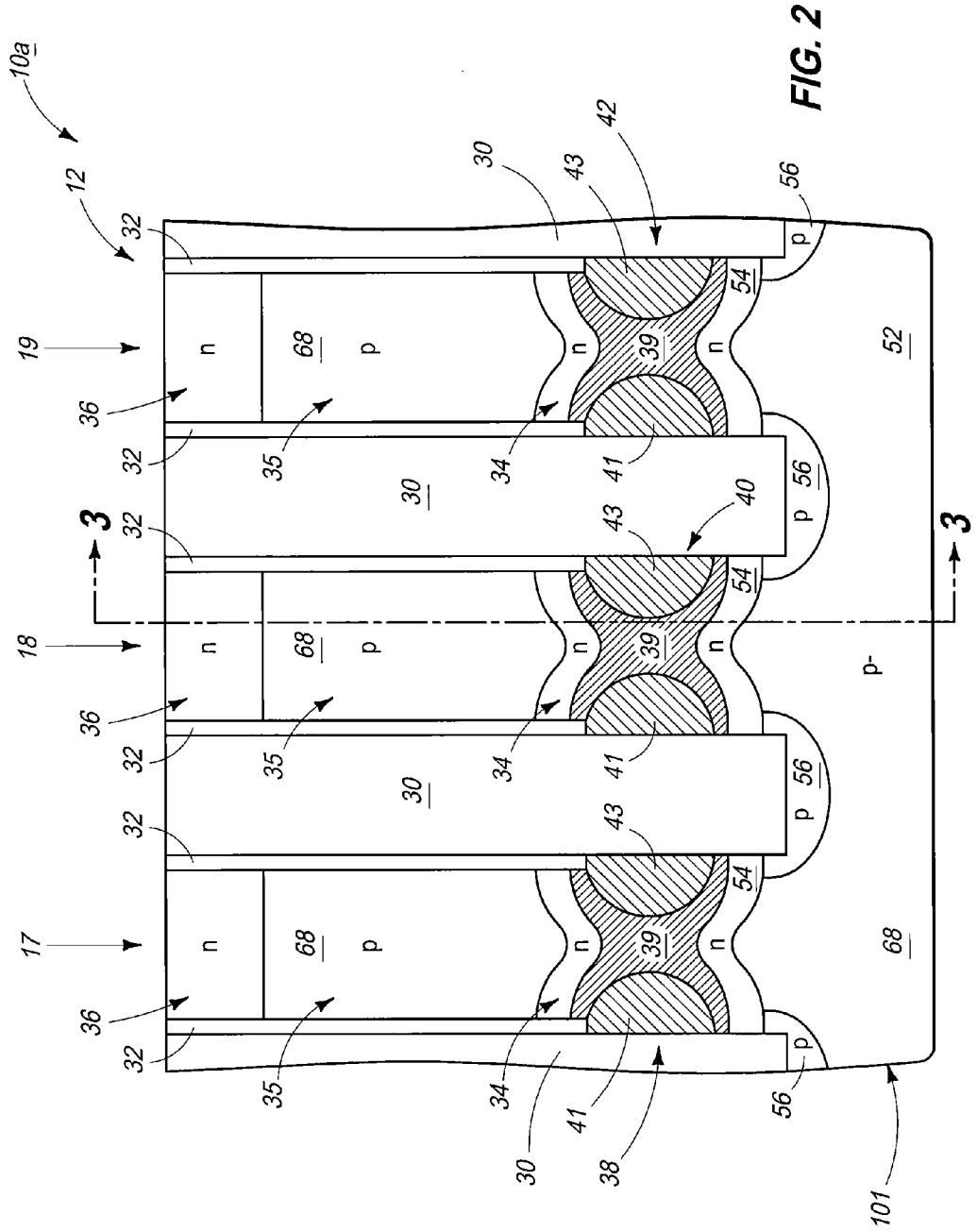
FIGS. 2 and 3 are diagrammatic cross-sectional side views along the lines A-A and B-B of FIG. 1, respectively, of one example embodiment of memory architecture that may have the top view of FIG. 1.
Figure 3:
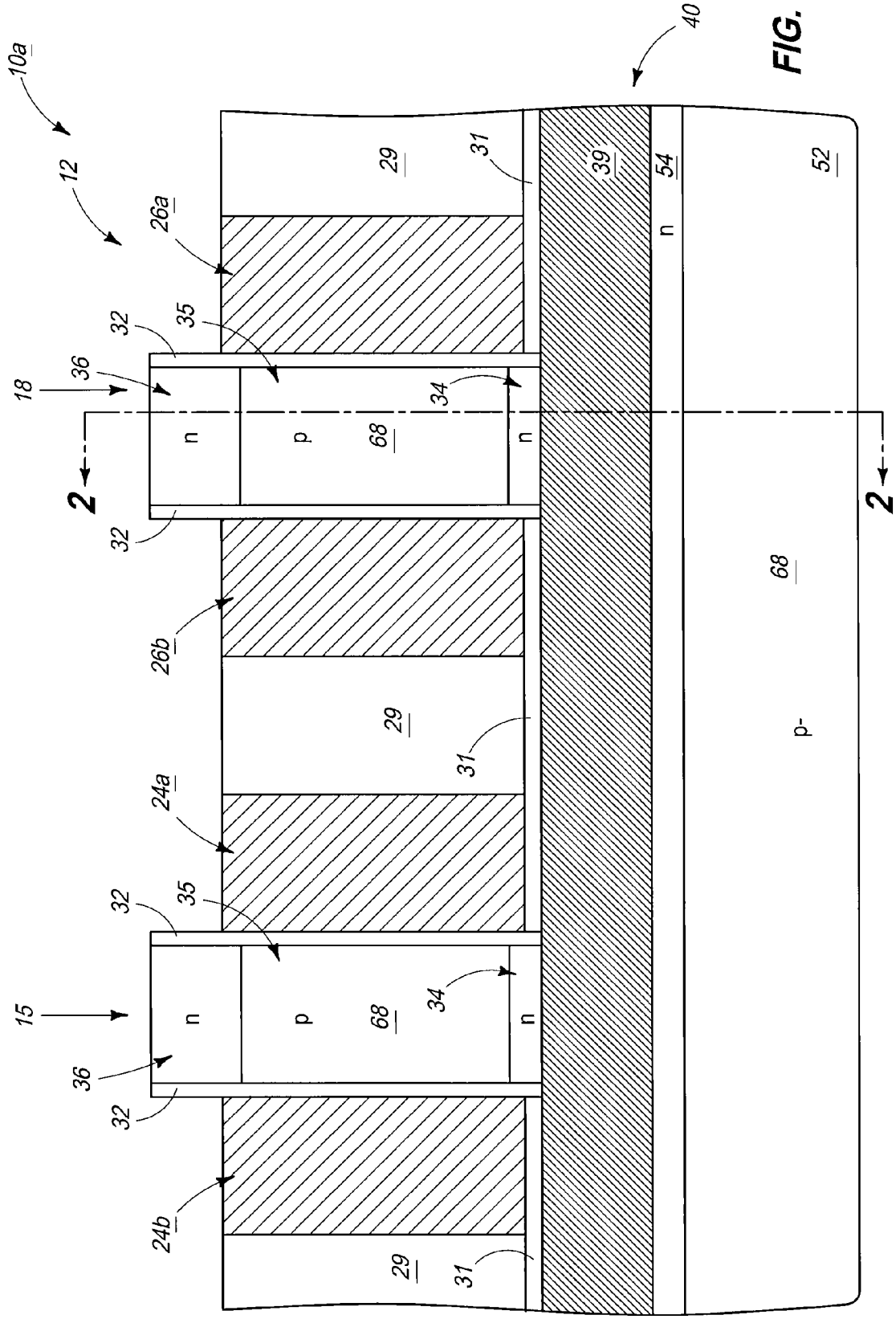
Figure 4:
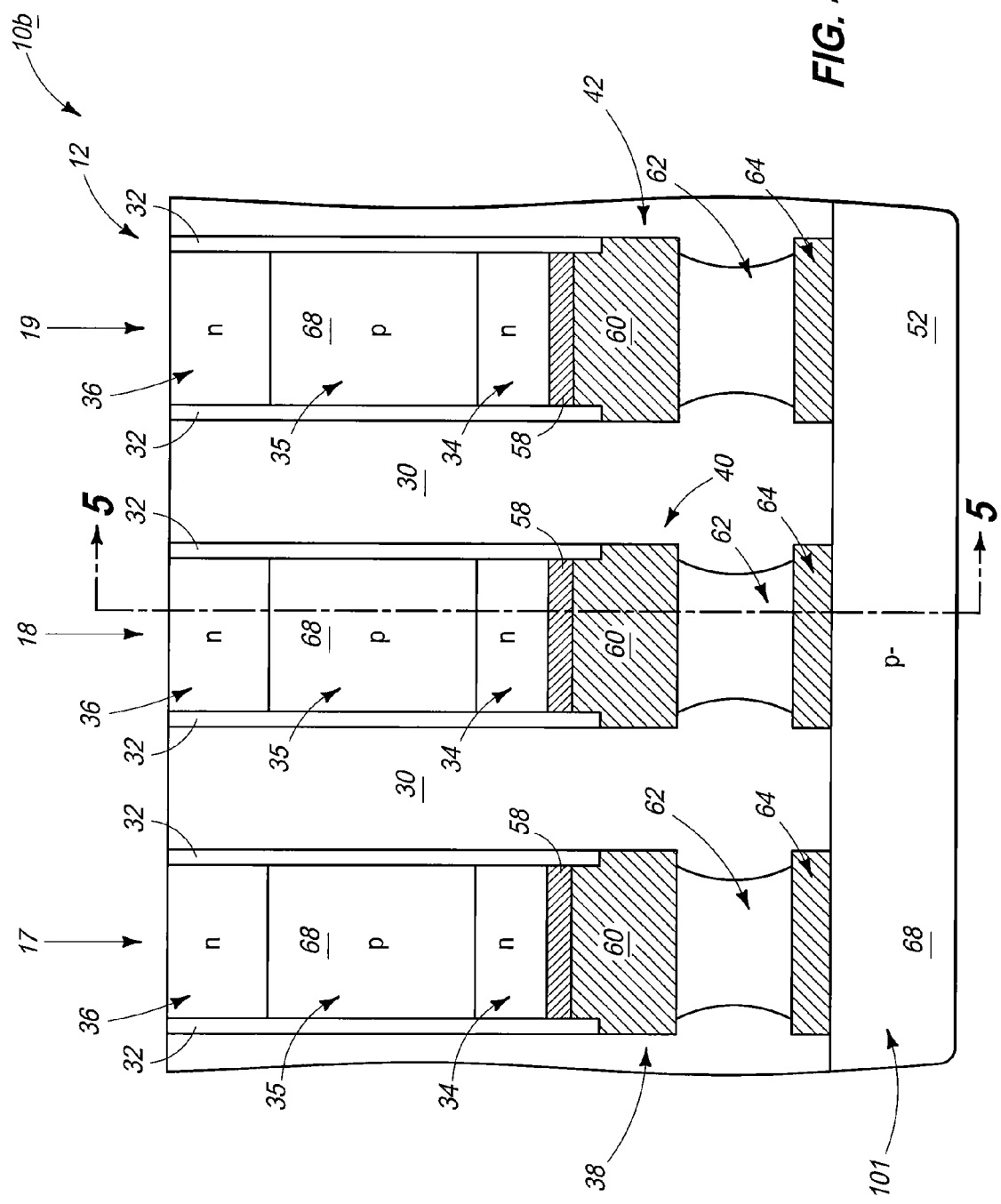
FIGS. 4 and 5 are diagrammatic cross-sectional views along the lines A-A and B-B of FIG. 1, respectively, of another example embodiment of memory architecture that may have the top view of FIG. 1.
Figure 5:
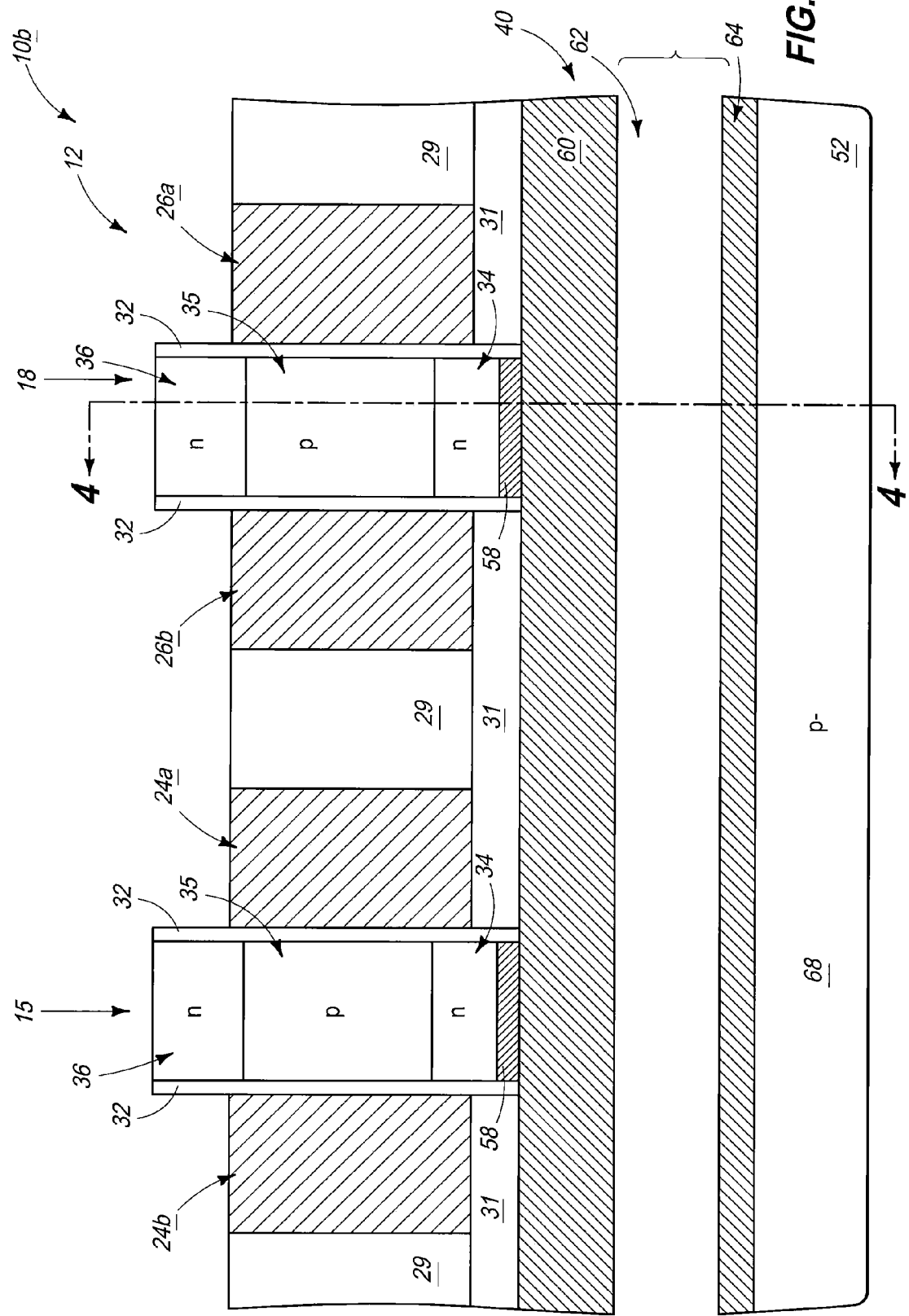

The digit lines utilized in the memory array 12 of FIG. 1 may be entirely composed of one or more metal-containing materials so that such digit lines may advantageously have relatively low resistance as compared to digit lines comprising non-metal-containing materials. Two example embodiments of digit line configurations are described with reference to FIGS. 2-5. FIGS. 2 and 3 show cross-sectional views along the lines A-A and B-B, respectively, of FIG. 1 and illustrate a first example configuration; and FIGS. 4 and 5 show cross-sectional views along the lines A-A and B-B, respectively, of FIG. 1 and illustrate a second example configuration.

Referring to FIGS. 2 and 3, a semiconductor construction 10a is illustrated, with such semiconductor construction having the arrangement of FIG. 1 when viewed from the top. The cross-section of FIG. 3 is along the line 3-3 of FIG. 2, and the cross-section of FIG. 2 is along the line 2-2 of FIG. 3.

The semiconductor construction 10a comprises the vertically-oriented transistor pedestals 14-19. The pedestals 17-19 are visible in the cross-section of FIG. 2, and the pedestals 15 and 18 are visible in the cross-section of FIG. 3. The pedestals comprise conductively-doped semiconductor material 68 (for instance, conductively-doped silicon). In the shown embodiment, each pedestal comprises a pair of n-type doped source/drain regions 34 and 36, with such source/drain regions being spaced from one another by a p-type doped channel region 35. In other embodiments, the relative doping of the source/drain regions and the channel regions may be reversed, so that the source/drain regions are p-type doped and the channel regions are n-type doped.

The source/drain regions 34 are beneath the source/drain regions 36 in the illustrated orientation, and accordingly the source/drain regions 34 and 36 may be referred to as bottom and top source/drain regions, respectively.

The access line segments 24a, 24b, 26a and 26b extend along sidewalls of the transistor pedestals as shown in FIG. 3. The access line segments are supported by electrically insulative material 31 to position the access line segments to be along the channel regions 35. The access line segments are shown to partially overlap the top and bottom source/drain regions 34 and 36. The access line segments form transistor gates that gatedly couple the top and bottom source/drain regions 34 and 36 through the channel regions 35. The upper surfaces of the access line segments are shown to be exposed in the views of FIGS. 1-3. However, such upper surfaces would typically be covered with insulative material at a subsequent processing stage so that the access lines may be electrically isolated from other circuitry (not shown) that may be subsequently formed over the access lines.

Digit lines 38, 40 and 42 extend beneath the transistor pedestals and are electrically coupled to the bottom source/drain regions. In the shown embodiment, the digit lines 38, 40 and 42 are directly against the bottom source/drain regions 34. The individual digit lines comprise a central metal-containing composition 39 sandwiched between, and directly against, a pair of outer metal-containing compositions 41 and 43. In some embodiments, the central metal-containing composition may be considered to be a first line, and the outer metal-containing compositions may be considered to form rails or second lines extending along such first line.

In some embodiments, the central metal-containing composition 39 may comprise, consist essentially of, or consist of metal/semiconductor material, such as metal silicide (for instance, titanium silicide, tungsten silicide, etc.) and the outer metal-containing compositions 41 and 43 may comprise, consist essentially of, or consist of elemental metal (for instance, titanium, tungsten, aluminum, copper, etc.), metal mixtures (for instance, alloys of two or more different metals), or metal-containing compositions. An example metal-containing composition is metal nitride. In some embodiments, the outer compositions 41 and 43 may comprise, consist essentially of, or consist of titanium nitride, tungsten nitride, etc. The outer compositions 41 and 43 may be the same as one another in composition, or may differ from one another in composition.

Although the digit lines are shown comprising multiple compositions (specifically, the compositions 39, 41 and 43), in other embodiments the digit lines may comprise a single composition, and may, for example, comprise, consist essentially of, or consist of metal/semiconductor material (as described below with reference to FIGS. 29 and 30). It can be advantageous that metal/semiconductor material (for instance, metal silicide) of the digit lines directly contacts the bottom source/drain regions 34 in order to obtain good electrical coupling between the digit lines and the conductively-doped semiconductor material of the transistor pedestals.

In the shown embodiment, the same semiconductor material (specifically, semiconductor material 68) is within the vertically-oriented pedestals and also beneath the digit lines 38, 40 and 42. The semiconductor material 68 beneath the digit lines supports the memory array 12, and in some embodiments may be considered to form a semiconductor deck 101 supporting the digit lines and other structures of the memory array.

The semiconductor material 68 may be any suitable semiconductor material, such as, for example monocrystalline silicon. The semiconductor material 68 may be considered to correspond to a semiconductor substrate, or at least to a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material structures (either alone or in assemblies comprising other structures). The term "substrate" refers to any supporting structure, including, but not limited to, the semiconductive substrates described above. In some embodiments, the semiconductor material 68 beneath the digit lines may be part of a semiconductor substrate containing one or more materials associated with integrated circuit fabrication. In such embodiments, such materials may correspond to one or more of refractory metal materials, barrier materials, diffusion materials, insulator materials, etc.

In the illustrated embodiment, multiple doped regions are formed within the semiconductor material 68 of the deck 101. Specifically, the material 68 of the deck includes a region 52 background-doped with p-type dopant to a "p-" dopant level; includes n-type doped regions 54 provided directly beneath the digit lines 38, 40 and 42; and includes p-type doped regions 56 provided directly beneath insulative material 30 and between adjacent n-type doped regions 54. The p-type doped regions 52 and 56 can alleviate or prevent cross-talk between adjacent n-type doped regions 54 by providing npn junctions relative to such adjacent n-type doped regions. The relative doping of the various regions 52, 54 and 56 may be reversed in some embodiments, so that regions 54 are p-type doped and the regions 52 and 56 are n-type doped. In such embodiments, region 52 may be part of an n-well formed in a semiconductor substrate that is otherwise background p-type doped.

Referring to FIGS. 4 and 5, a semiconductor construction 10b is illustrated, with such semiconductor construction having the arrangement of FIG. 1 when viewed from the top. The cross-section of FIG. 4 is along the line 4-4 of FIG. 5, and the cross-section of FIG. 5 is along the line 5-5 of FIG. 4. Identical numbering will be utilized to describe the various structures of FIGS. 4 and 5 as was utilized above to describe the structures of FIGS. 2 and 3, where appropriate.

The semiconductor construction 10b comprises the vertically-oriented transistor pedestals 14-19. The pedestals 17-19 are visible in the cross-section of FIG. 4, and the pedestals 15 and 18 are visible in the cross-section of FIG. 5. Each pedestal comprises the bottom and top n-type doped source/drain regions 34 and 36 spaced from one another by the p-type doped channel region 35.

The digit lines 38, 40 and 42 extend beneath the transistor pedestals. The digit lines 38, 40 and 42 of the embodiment of FIGS. 4 and 5 have a different configuration than those of the embodiment of FIGS. 2 and 3. Specifically, the individual digit lines of the embodiment of FIGS. 4 and 5 comprise an upper metal-containing composition 58 and a lower metal-containing composition 60. In some embodiments, the upper composition 58 may comprise, consist essentially of or consist of metal/semiconductor material, such as metal silicide (for instance, titanium silicide, tungsten silicide, etc.), and the lower composition 60 may comprise, consist essentially of or consist of elemental metal (for instance, titanium, tungsten, aluminum, copper, etc.), metal mixtures (for instance, alloys of two or more different metals), or metal-containing compositions (for instance, titanium nitride, tungsten nitride, etc.). Although the digit lines of FIGS. 4 and 5 are shown comprising multiple compositions, in other embodiments the digit lines may comprise a single composition, and may, for example, comprise, consist essentially of, or consist of metal/semiconductor material (such as, for example, metal silicide).

The metal/semiconductor material of the upper metal-containing composition 58 is shown to be directly against the semiconductor material of the bottom source/drain regions. In some embodiments the upper metal-containing composition 58 may comprise, consist essentially of, or consist of metal silicide; and the semiconductor material 68 of the bottom source/drain regions may comprise silicon that is directly against metal silicide of the upper metal-containing composition 58.

The semiconductor material 68 is beneath the digit lines 38, 40 and 42, and may be considered to form a semiconductor deck 101 under the digit lines.

The embodiment of FIGS. 4 and 5 has electrically insulative regions 62 directly between the digit line material 60 and the underlying deck 101. Such insulative regions may be include gas-filled cavities in some embodiments, and in other embodiments may be entirely composed of electrically insulative material that is at least semisolid (with suitable electrically insulative materials including silicon dioxide, silicon nitride, silicon oxynitride, borophosphosilicate glass, etc.).

In the shown embodiment, metal-containing segments 64 are between the electrically insulative regions 62 and the semiconductor material 68 of the deck 101. Such metal-containing segments may comprise a same composition as digit line material 60, and may be formed residually during the formation of digit lines 38, 40 and 42 (as described below with reference to FIG. 37). The embodiment of FIGS. 4 and 5 only illustrates metal-containing segments 64 along the deck 101. In other embodiments, there may be doped regions and/or silicide also along the deck, as shown below in an example embodiment of FIG. 41. In yet other embodiments, the digit lines may be formed under conditions which do not leave the illustrated metal-containing segments 64 along the upper surface of the deck.

Example methods for fabricating constructions analogous to those shown in FIGS. 1-5 are described with reference to FIGS. 6-43. Specifically, FIGS. 6-30 describe example methods for forming constructions analogous to those illustrated in FIGS. 1-3, and FIGS. 31-43 illustrate example methods for forming constructions analogous to those illustrated in FIGS. 1, 4 and 5. Similar numbering will be utilized to describe FIGS. 6-43 as is utilized above in describing FIGS. 1-5, where appropriate.

Figure 6:
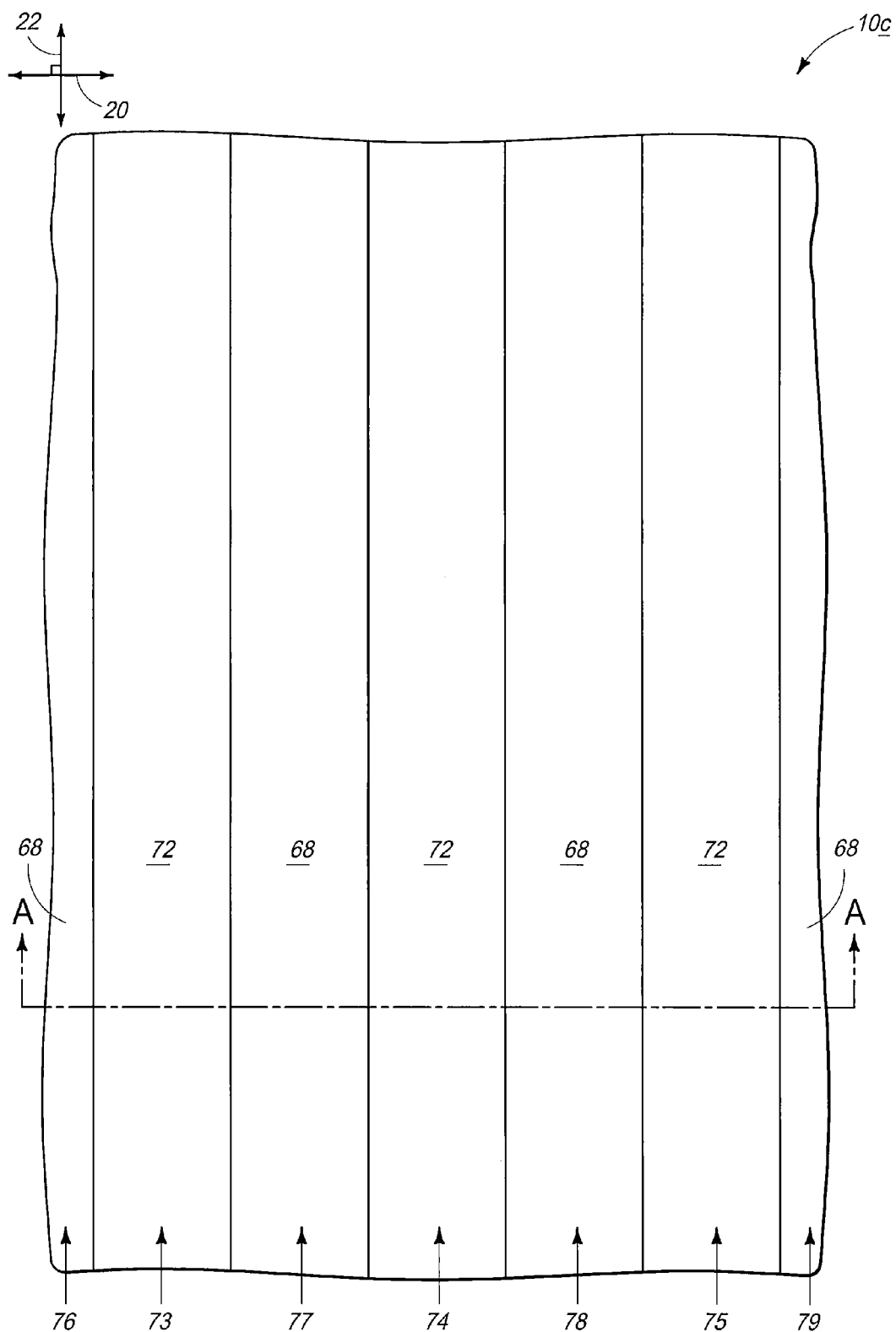
FIGS. 6 and 7 are a diagrammatic top view, and a cross-sectional side view of a portion of a semiconductor construction at a processing stage of an example embodiment method of forming a memory array. The cross-sectional side view of FIG. 7 is along line A-A of FIG. 6.
Figure 7:
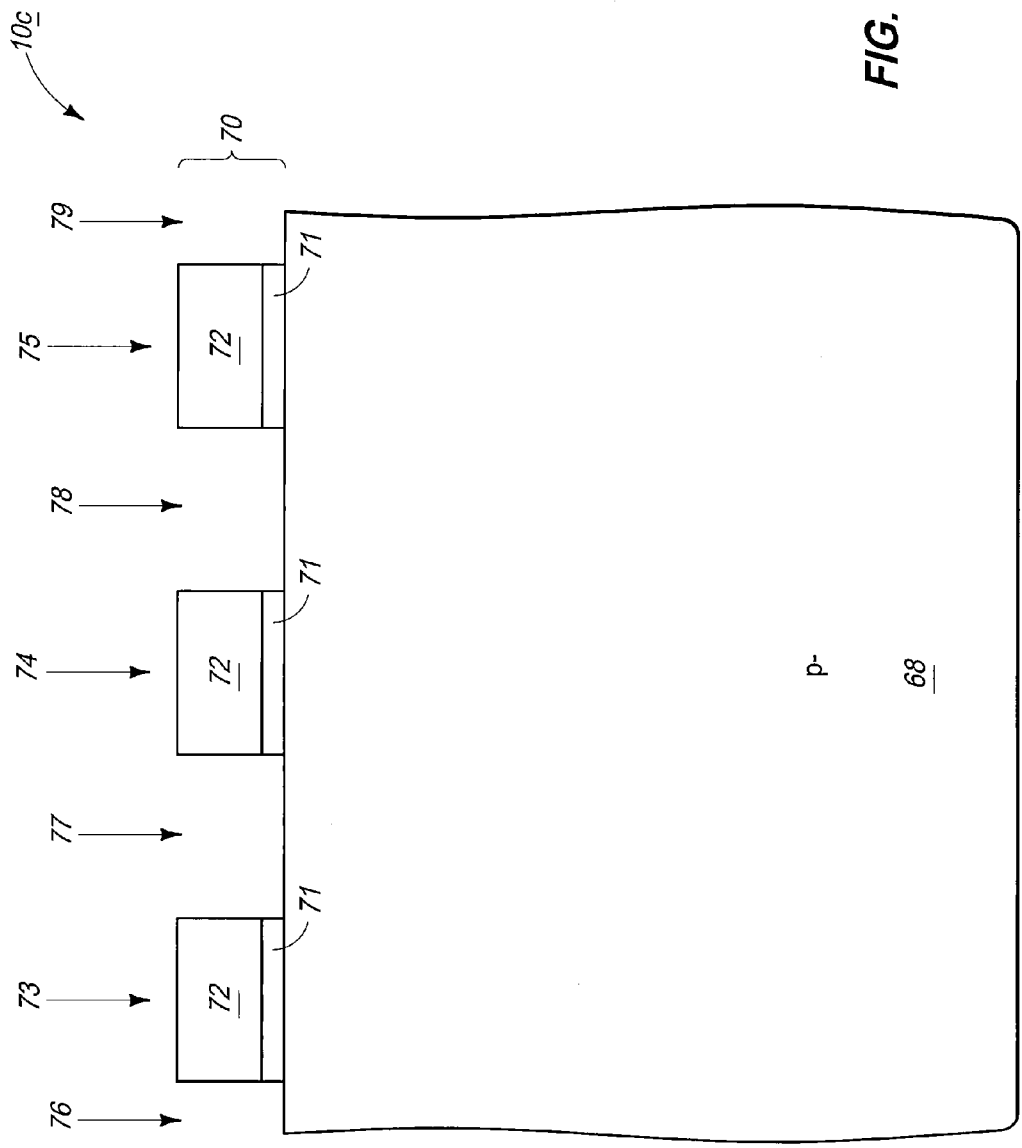

Referring to FIGS. 6 and 7, a semiconductor construction 10c is shown to comprise the semiconductor material 68 having a patterned mask 70 thereover.

The illustrated example semiconductor material 68 is lightly p-type doped (i.e., is doped to a "p-" dopant level). In some embodiments, the semiconductor material may comprise, consist essentially of, or consist of monocrystalline silicon, which may or may not be lightly doped. The semiconductor material 68 may be considered to be part of a semiconductor substrate in some embodiments.

The illustrated example patterned mask comprises a silicon nitride-containing material 72 over a silicon dioxide-containing material (which may be referred to as a pad oxide) 71. The patterned mask 70 may be formed by providing materials 71 and 72 entirely across an upper surface of semiconductor material 68, and subsequently patterning such materials with a photolithographically-patterned photoresist mask (not shown) and/or with one or more structures (not shown) fabricated using pitch-multiplication methodologies.

The patterned mask 70 comprises a plurality of linear features 73-75 which are separated from one another by intervening spaces 76-79. In the shown embodiment, the linear features 73-75 extend along the same direction 22 as the digit lines of FIGS. 1-3. The linear features 73-75 may have any suitable widths, and in some embodiments may have widths within a range of from about 20 nanometers to about 40 nanometers.

Figure 8:
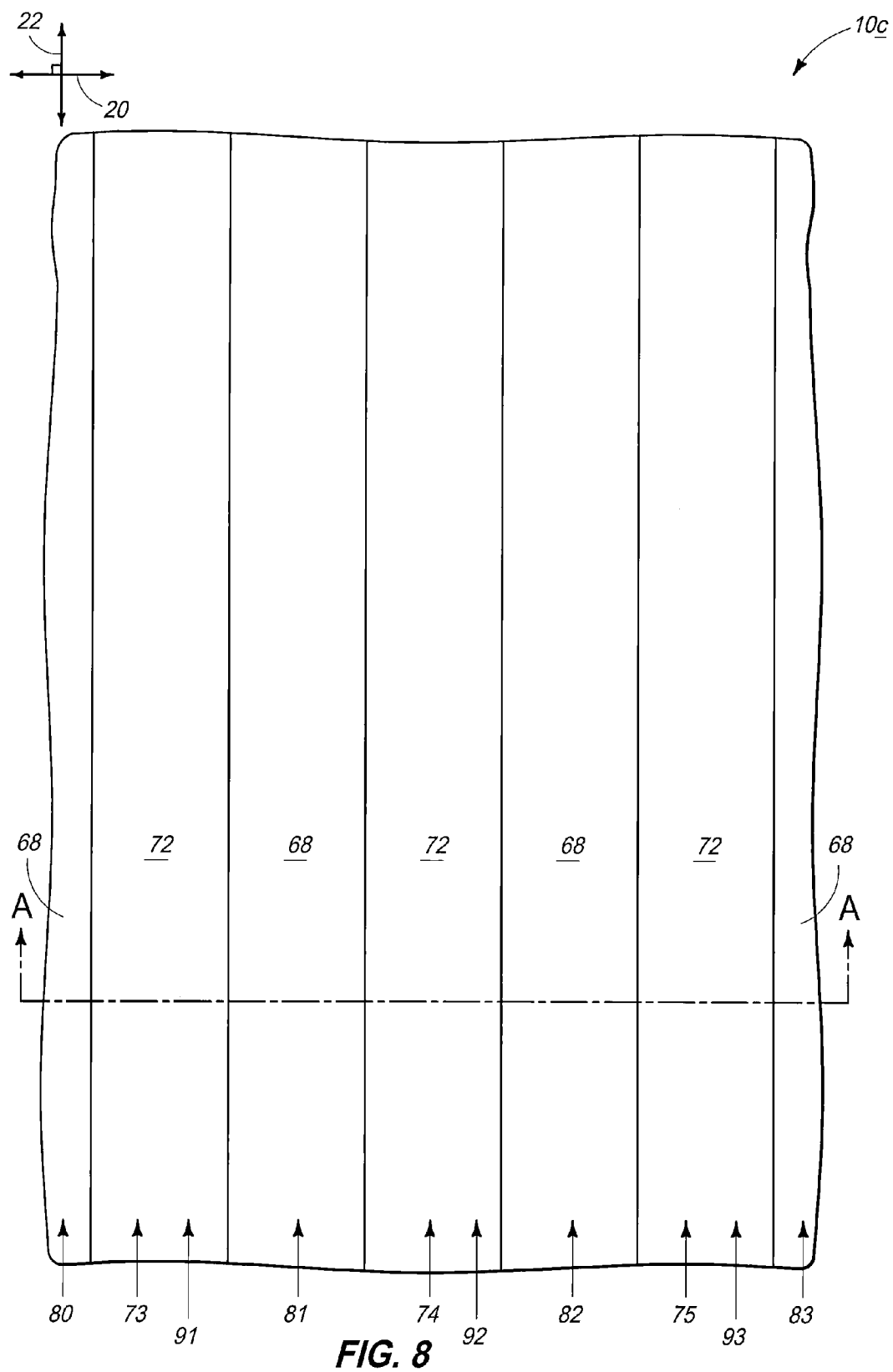
FIGS. 8 and 9 are a diagrammatic top view, and a cross-sectional side view of a portion of a semiconductor construction at a processing stage subsequent to that of FIGS. 6 and 7 of an example embodiment method of forming a memory array. The cross-sectional side view of FIG. 9 is along line A-A of FIG. 8.
Figure 9:
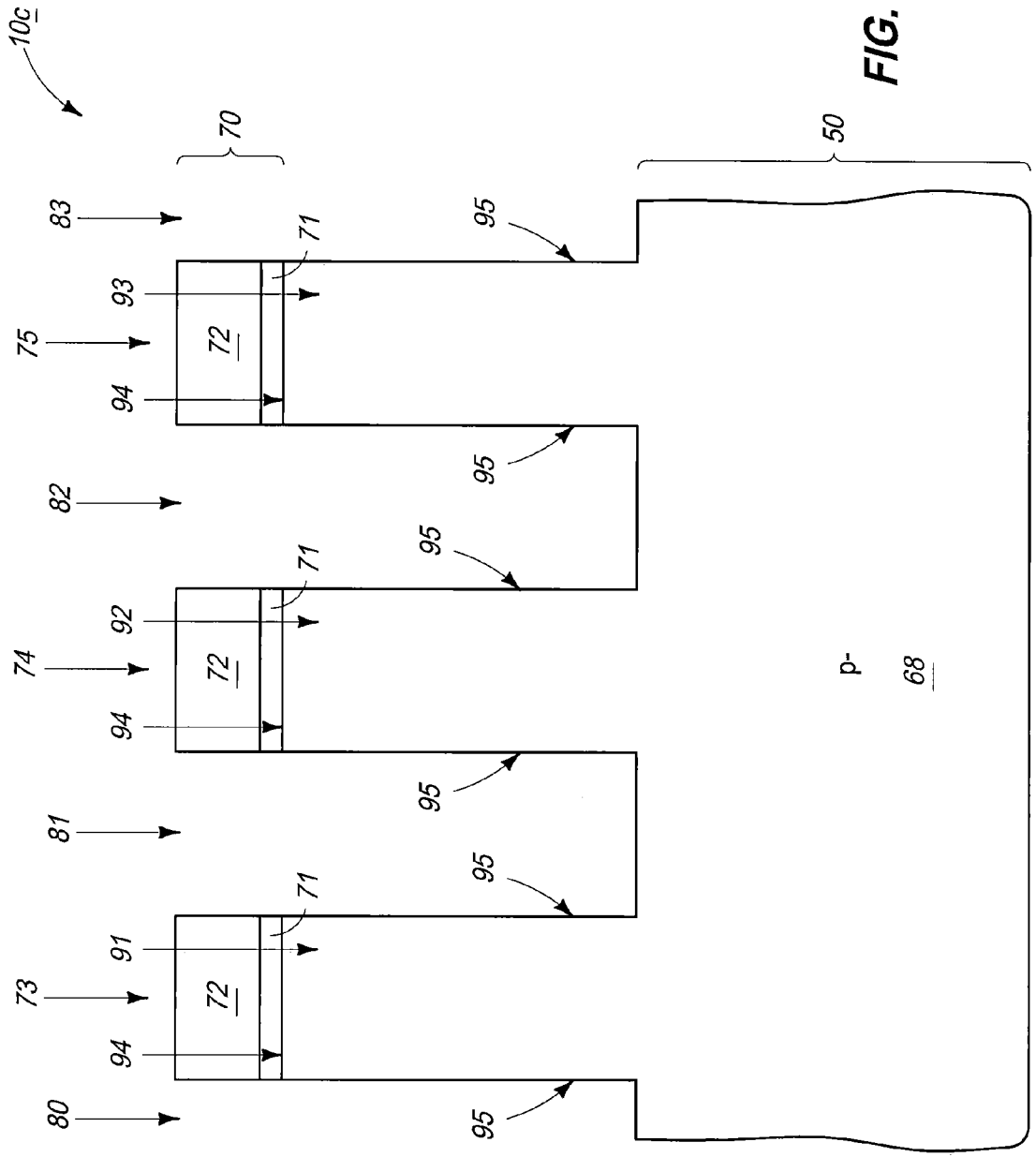

Referring to FIGS. 8 and 9, one or more suitable etches are utilized to extend a pattern of mask 70 into semiconductor material 68. Such etching forms a plurality of trenches 80-83 extending into the semiconductor material. The etching also forms semiconductor material 68 to comprise a plurality of linear segments 91-93 beneath the masking features 73-75, respectively; with the linear segments 91-93 being spaced from one another by the intervening trenches 80-83. In some embodiments, the construction of FIGS. 8 and 9 may be considered to comprise a semiconductor base 50 corresponding to the lower region of semiconductor material 68 (as labeled in FIG. 9), and to comprise the linear segments 91-93 extending upwardly from such base.

The trenches 80-83 may be formed to any suitable depths, and in some embodiments may be formed to depths within a range of from about 150 nanometers to about 250 nanometers (such as, for example, a depth of about 180 nanometers).

The linear segments 91-93 comprise top surfaces 94 covered by masking features 73-75, and comprise sidewall surfaces 95 along the trenches 81-83. The sidewall surfaces may be cleaned subsequent to the formation of the trenches to expose a surface of semiconductor material 68.

Figure 10:
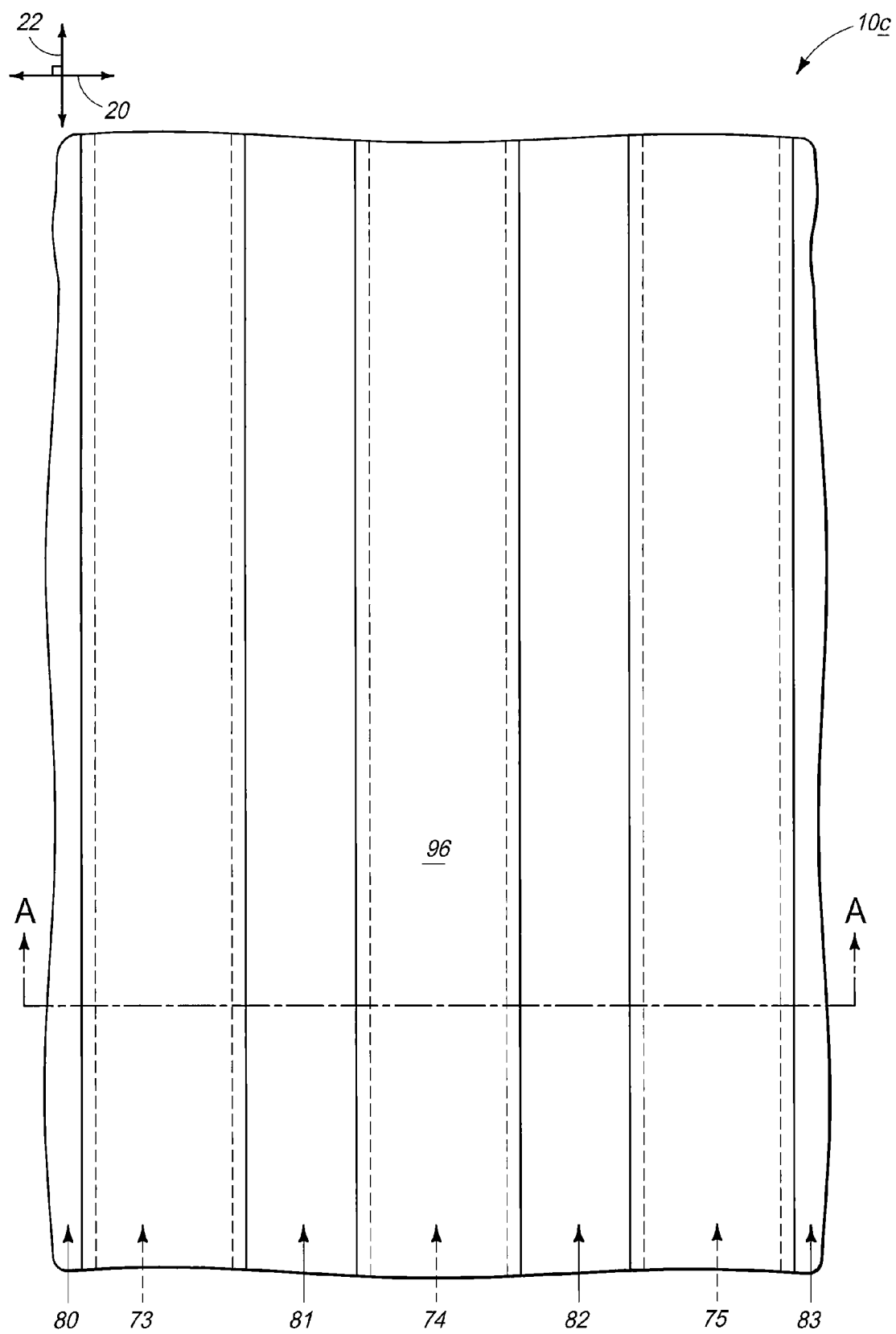
FIGS. 10 and 11 are a diagrammatic top view, and a cross-sectional side view of a portion of a semiconductor construction at a processing stage subsequent to that of FIGS. 8 and 9 of an example embodiment method of forming a memory array. The cross-sectional side view of FIG. 11 is along line A-A of FIG. 10.
Figure 11:
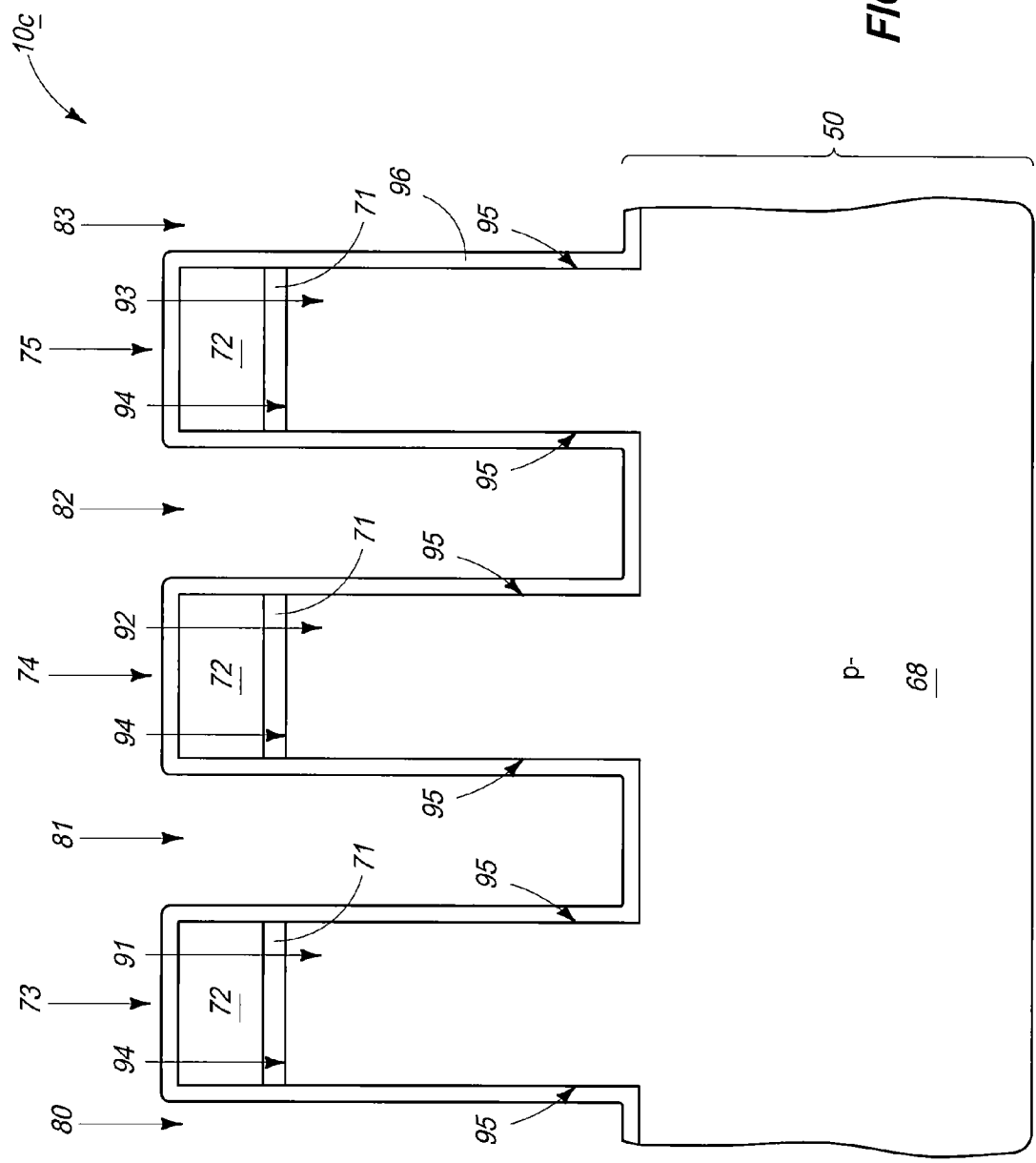

Referring to FIGS. 10 and 11, protective material 96 is formed within the trenches 81-83, and over the linear segments 91-93. The masking features 73-75 are shown in dashed-line view in FIG. 10 to indicate that such features are beneath protective material 96.

The protective material 96 may comprise any suitable composition or combination of compositions; and in some embodiments may comprise, consist essentially of, or consist of one or both of silicon dioxide and silicon nitride. In some embodiments, the protective material is a sacrificial material, which is ultimately removed and replaced with gate dielectric along sidewalls of linear segments 91-93. In other embodiments, the protective material may be suitable to be utilized as gate dielectric, and some of material 96 may remain along the sidewalls of linear segments 91-93 as gate dielectric in a finished memory array. In the shown embodiment, the protective material 96 is formed directly against sidewall surfaces 95 of the linear segments 91-93.

The protective material 96 may be formed utilizing any suitable methodology; including, for example, one or more of oxidative oxidation of the semiconductor material along the sidewall surfaces of linear segments 91-93 (in which case, the protective material may or may not form along sidewalls of the mask structure), atomic layer deposition (ALD) and chemical vapor deposition (CVD). In some embodiments, the protective material 96 may have a thickness within a range of from about 5 nanometers to about 10 nanometers.

Figure 12:
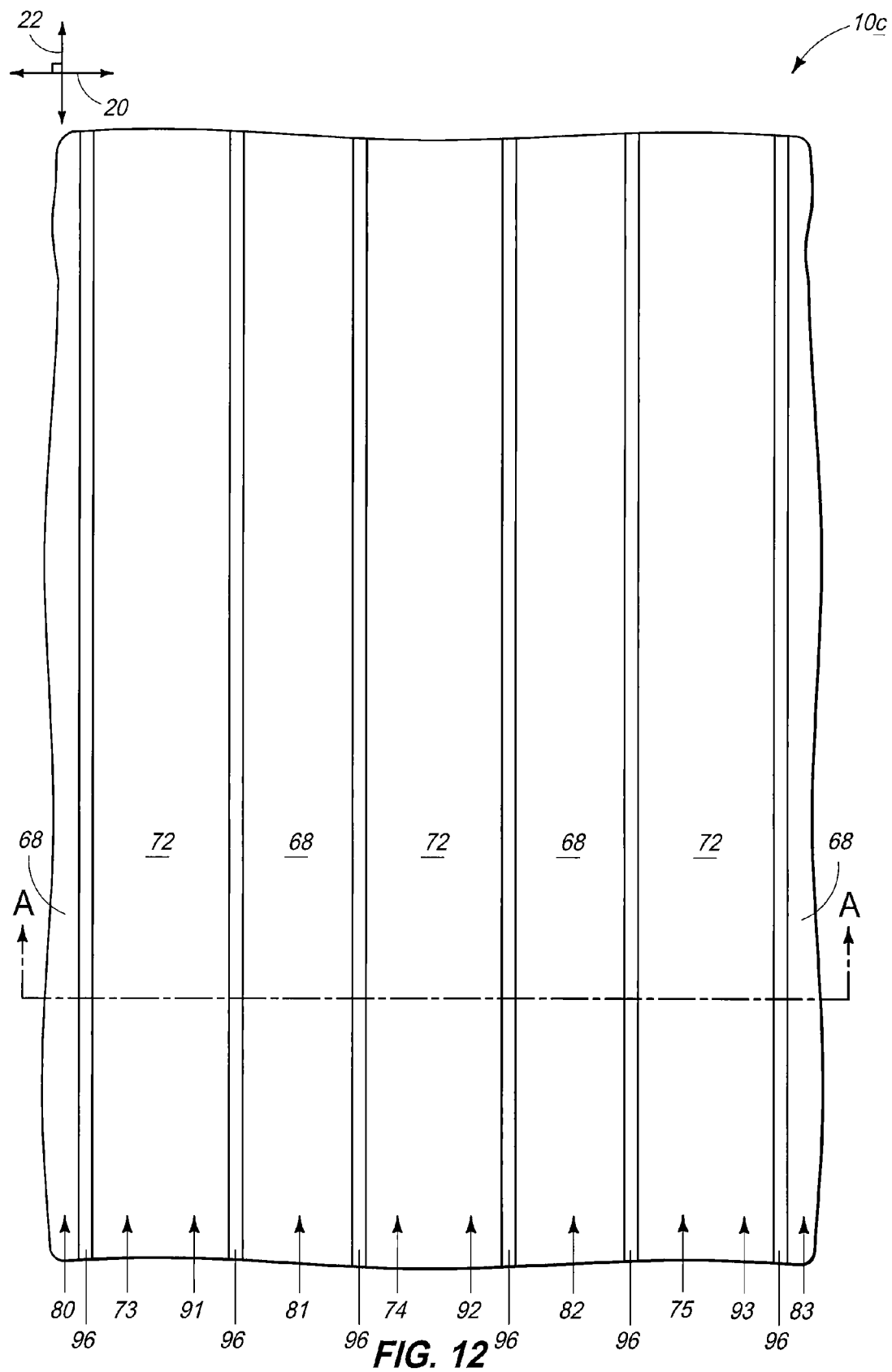
FIGS. 12 and 13 are a diagrammatic top view, and a cross-sectional side view of a portion of a semiconductor construction at a processing stage subsequent to that of FIGS. 10 and 11 of an example embodiment method of forming a memory array. The cross-sectional side view of FIG. 13 is along line A-A of FIG. 12.
Figure 13:
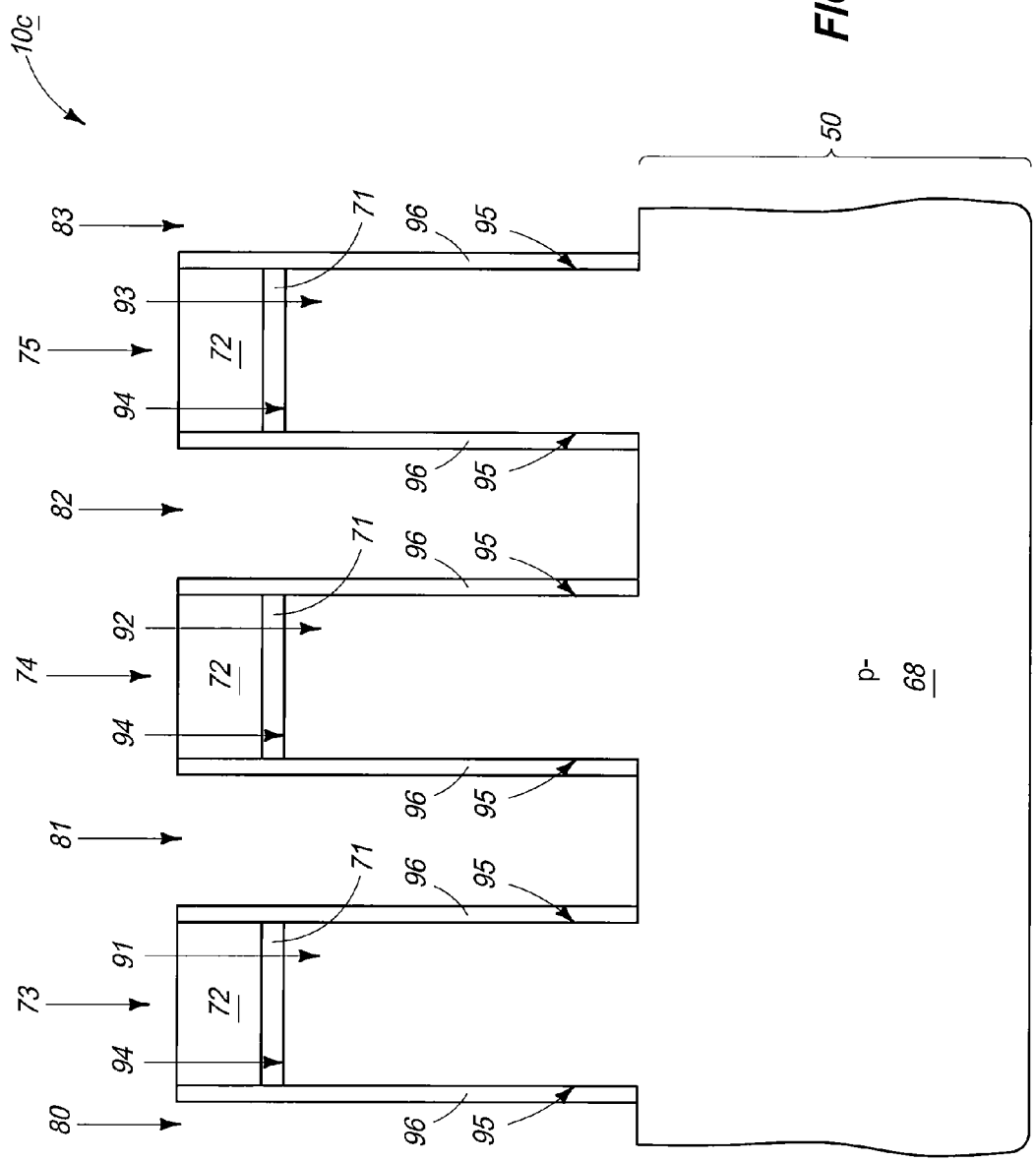

Referring to FIGS. 12 and 13, the protective material 96 is exposed to an anisotropic etch which removes the protective material from over horizontal surfaces, while leaving the protective material along vertical surfaces. The etch exposes an upper surface of base 50 at the bottoms of the trenches 80-83, while leaving the protective material 96 along the sidewall surfaces 95 of the linear segments 91-93.

Figure 14:
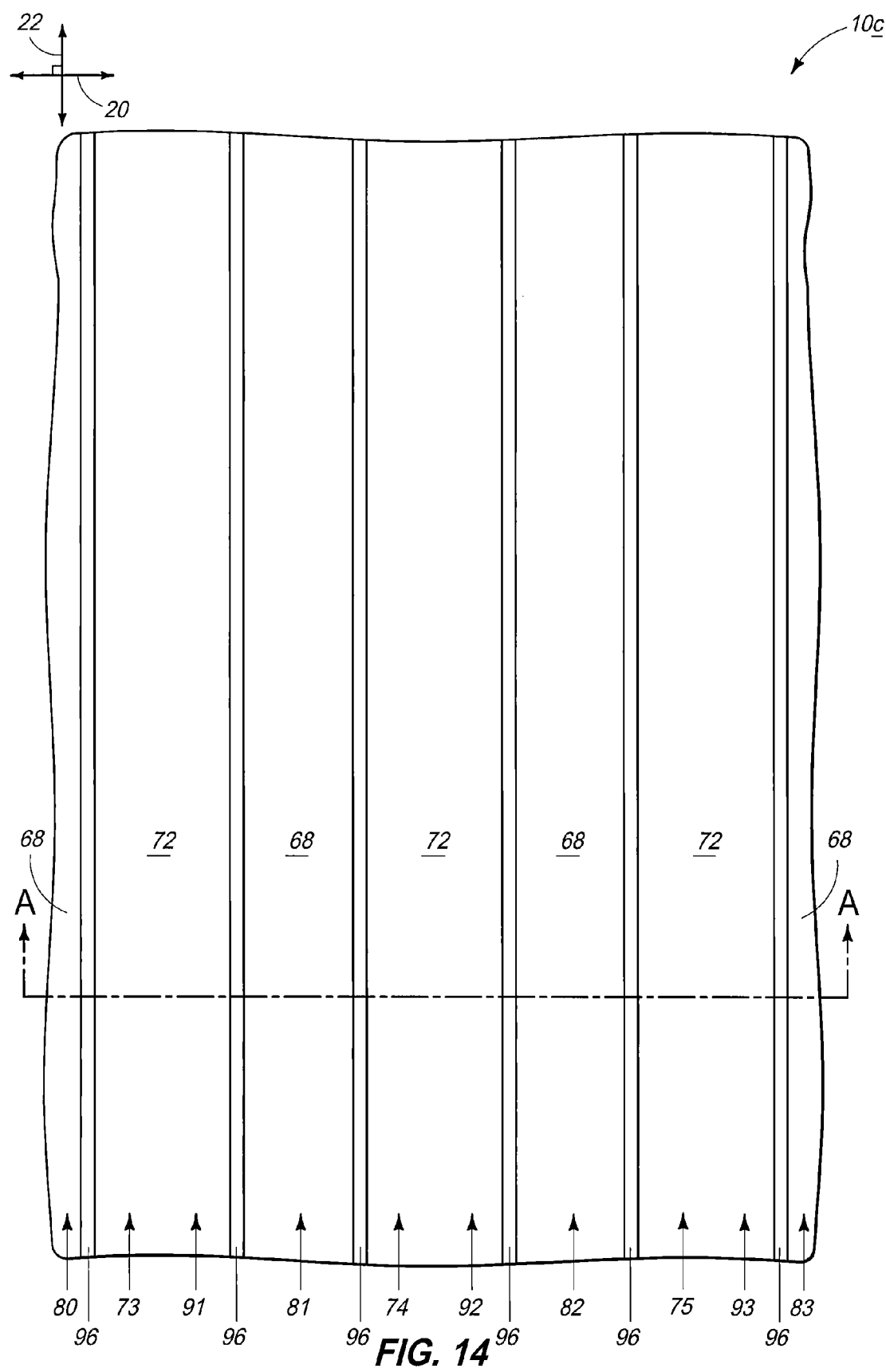
FIGS. 14 and 15 are a diagrammatic top view, and a cross-sectional side view of a portion of a semiconductor construction at a processing stage subsequent to that of FIGS. 12 and 13 of an example embodiment method of forming a memory array. The cross-sectional side view of FIG. 15 is along line A-A of FIG. 14.
Figure 15:
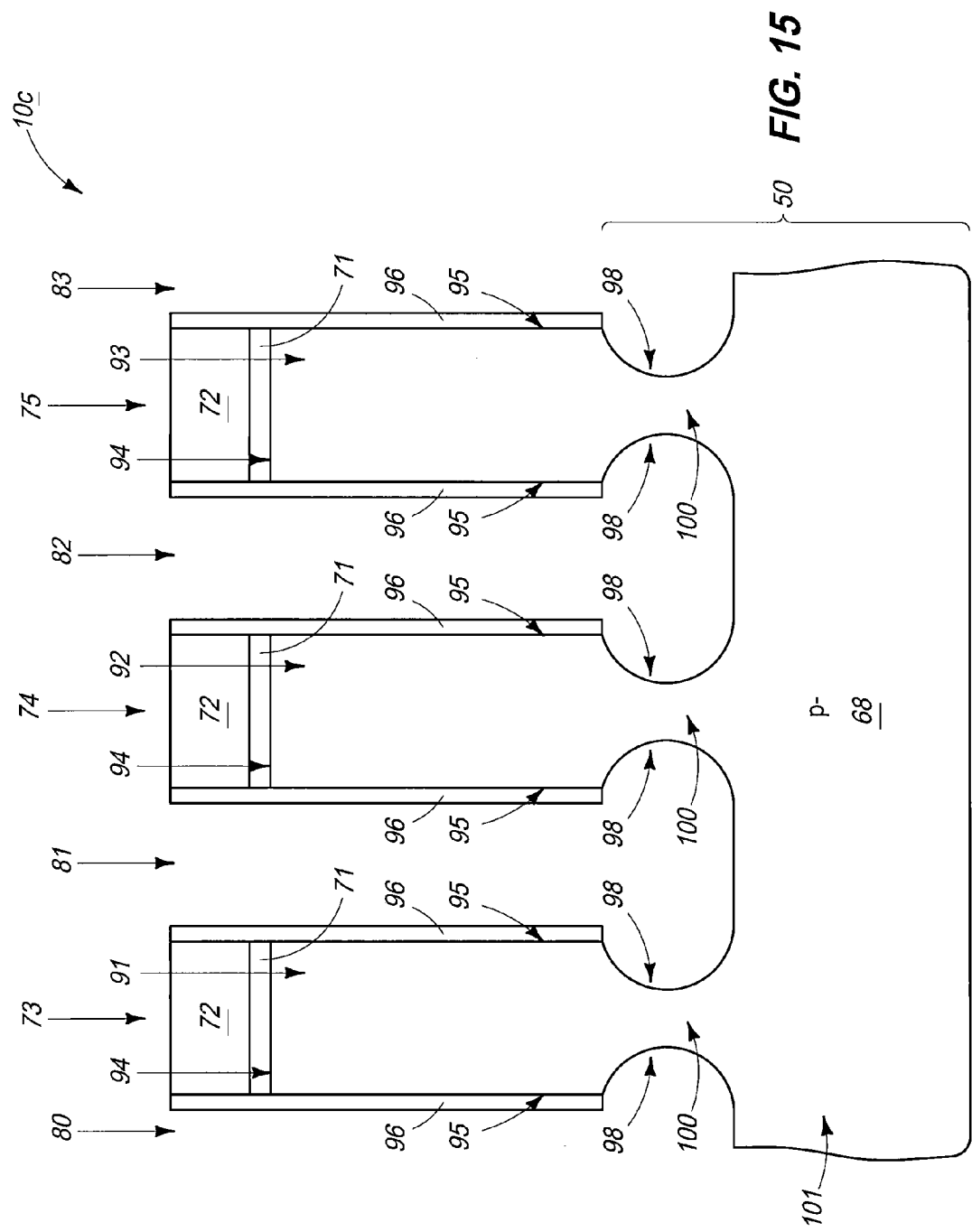

Referring to FIGS. 14 and 15, one or more etches are conducted into base 50 while using protective material 96 to protect the sidewall surfaces 95 of the linear segments 91-93. The etches partially undercut the linear segments 91-93, and thus form cavities 98 extending to underneath the linear segments. The etching may comprise one or both of an isotropic etch and an anisotropic etch, with etches having greater isotropic character generally forming cavities that extend further under the linear segments than do etches having greater anisotropic character. In some embodiments, the etching may comprise an initial anisotropic etch to extend the trenches 81-83 downwardly, followed by an isotropic etch to etch the cavities 98 to under the linear segments 91-93.

In some embodiments, the etching into base 50 may be considered to form footings 100 from an upper portion of base 50, with such footings supporting the linear segments 91-93 thereover. In such embodiments, a lower portion of the base 50 may be considered to correspond to a deck 101 beneath the footings.

Figure 16:
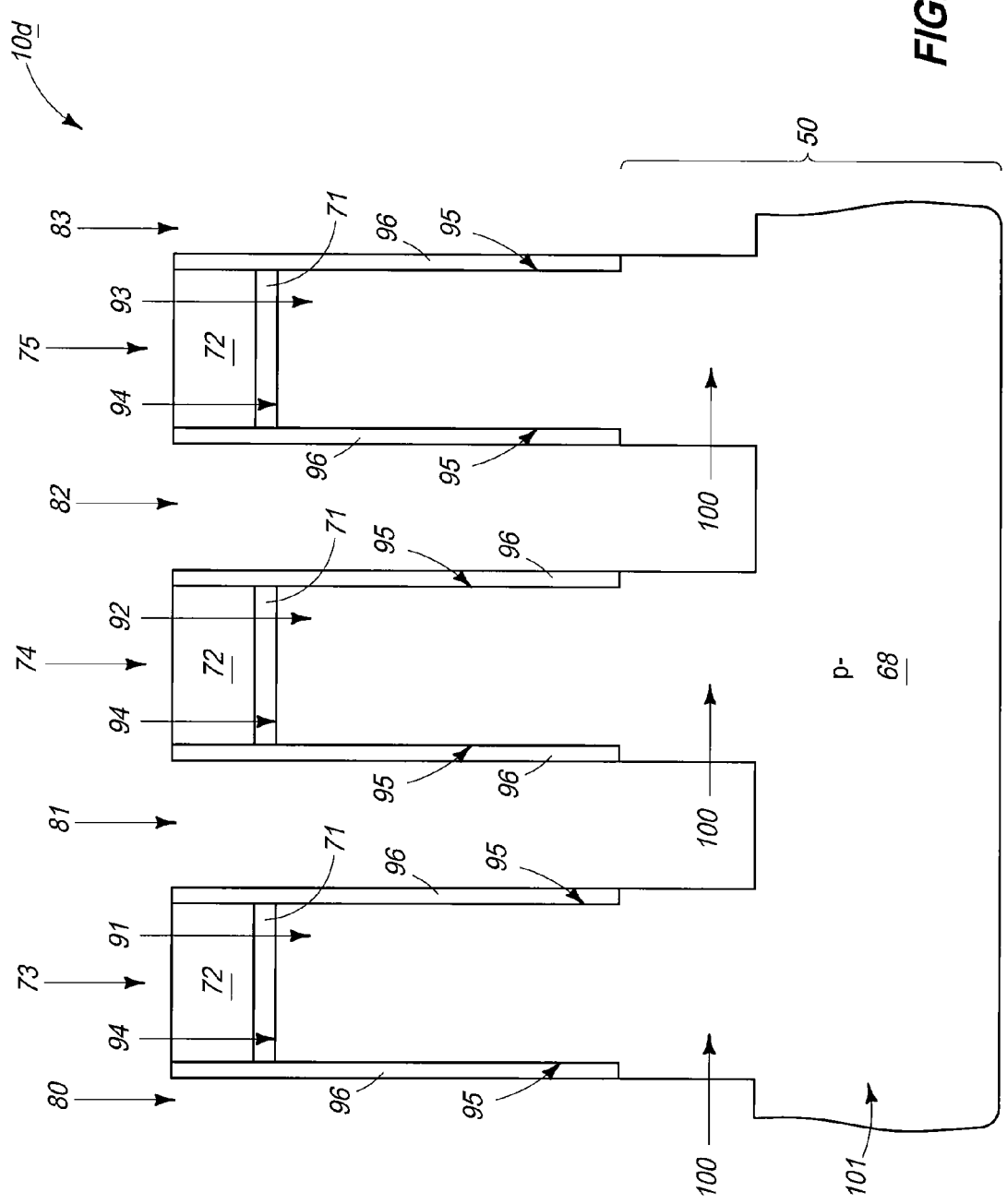
FIG. 16 is a diagrammatic cross-sectional side view of a portion of a semiconductor construction at a processing stage analogous to that of FIG. 15, but in accordance with an alternative embodiment to that of FIG. 15.

FIG. 15 shows an embodiment in which a significant amount of isotropic etching is utilized to extend cavities 98 to under the linear segments 91-93. FIG. 16 shows a construction 10d at a processing stage analogous to that of FIG. 15, but illustrating an alternative embodiment in which anisotropic etching alone is utilized to form footings 100. The embodiment of FIG. 16 illustrates that there may be little to no formation of cavities undercutting the linear segments 91-93 when anisotropic etching alone is utilized to form the footings.

Figure 17:
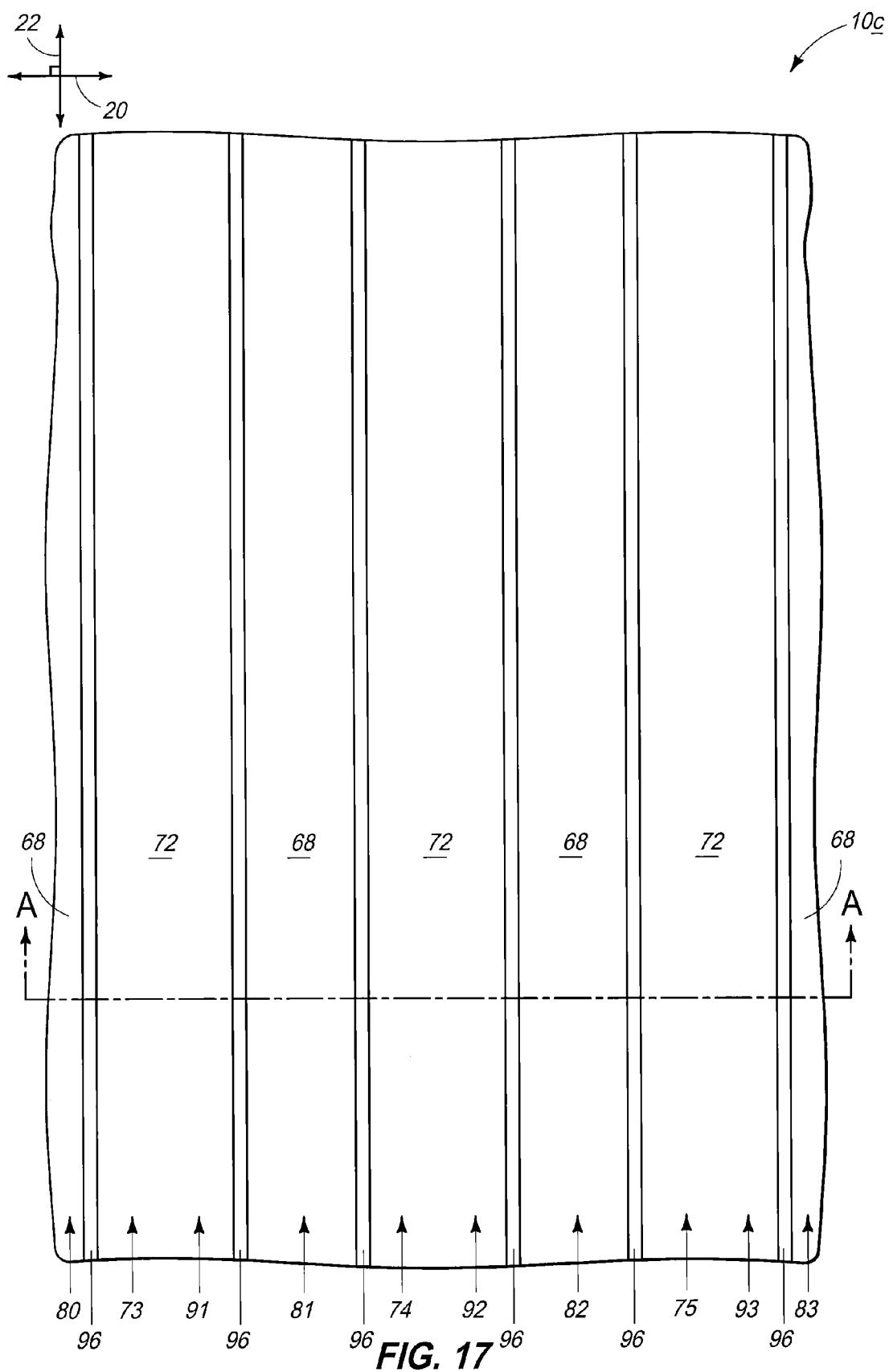
FIGS. 17 and 18 are a diagrammatic top view, and a cross-sectional side view of a portion of a semiconductor construction at a processing stage subsequent to that of FIGS. 14 and 15 of an example embodiment method of forming a memory array. The cross-sectional side view of FIG. 18 is along line A-A of FIG. 17.
Figure 18:
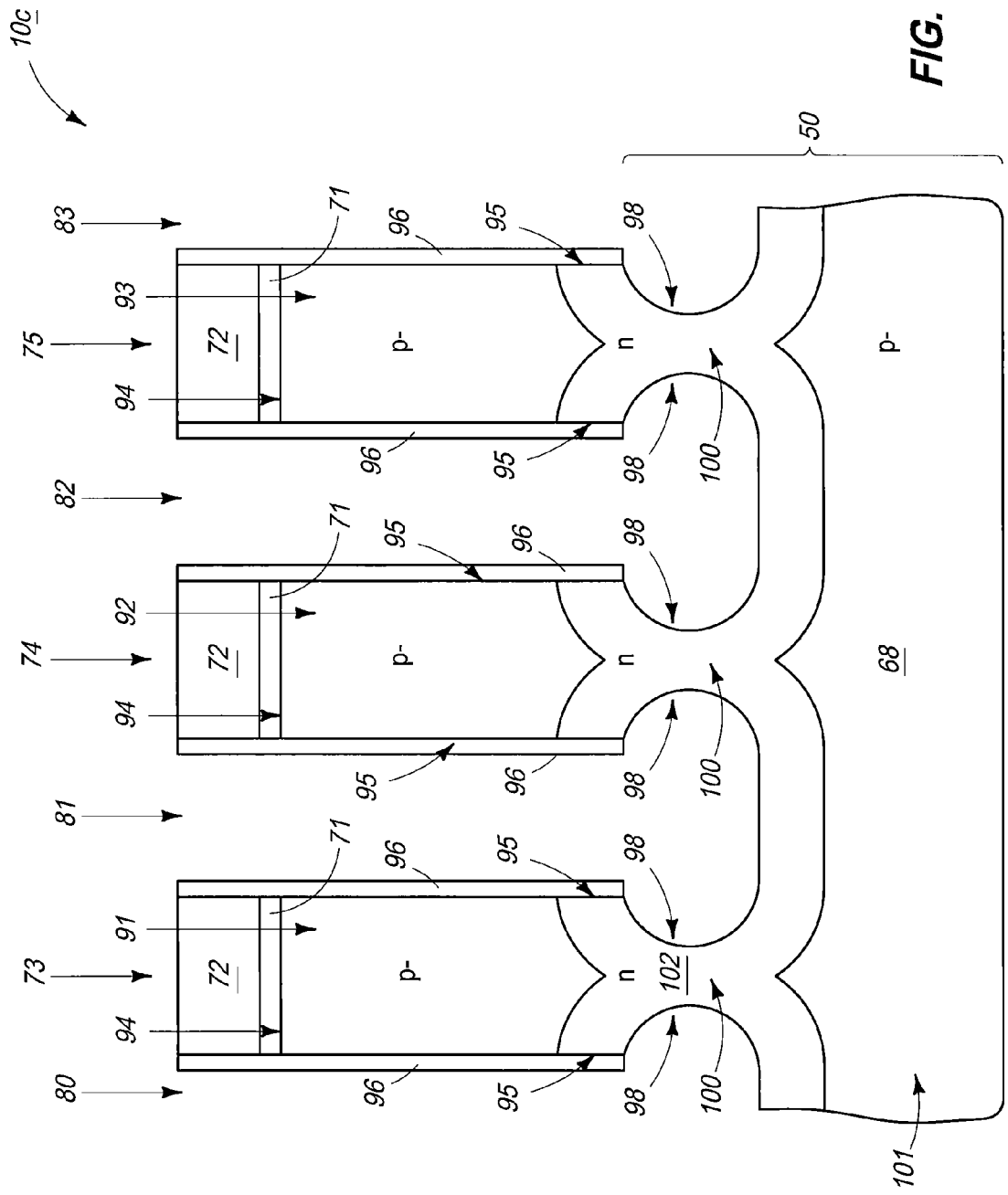

Referring to FIGS. 17 and 18, dopant is implanted into semiconductor material 68 to form an n-type doped region 102 that extends within the bottoms of linear segments 91-93, within footings 100, and within an upper region of the deck 101. The doped region 102 may be formed with any suitable processing, including, for example, gas phase doping, plasma doping (PLAD), arsenic glass (ASG) doping, phosphorus doping from phosphosilicate glass (PSG), out-diffusion from implanted regions initially formed along the deck, etc. The majority of the semiconductor material 68 within linear segments 91-93 remains p-type doped (specifically doped to a "p-" level in the shown embodiment) after the formation of n-type doped region 102.

Figure 19:
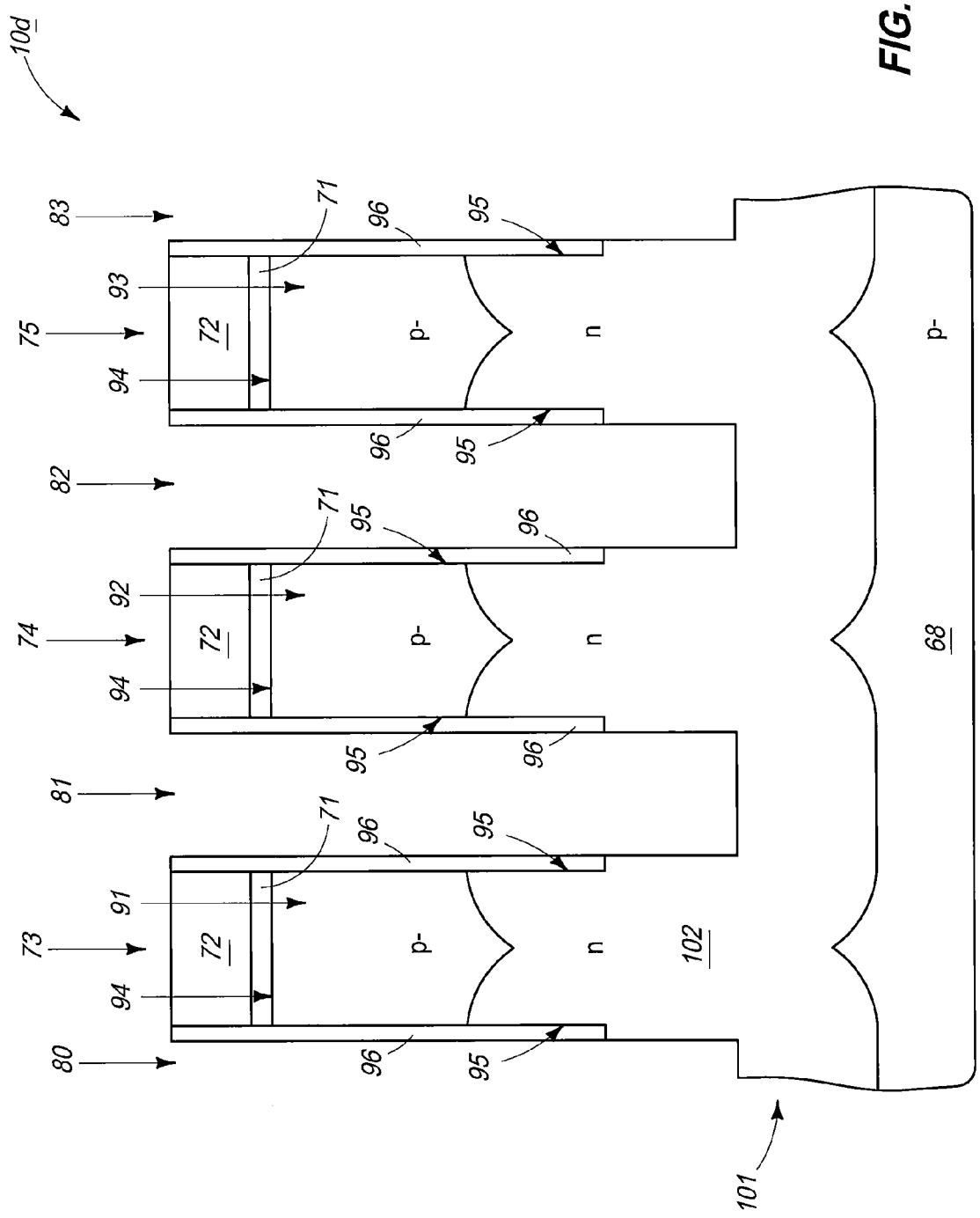
FIG. 19 is a diagrammatic cross-sectional side view of a portion of a semiconductor construction at a processing stage analogous to that of FIG. 18, but in accordance with an alternative embodiment to that of FIG. 18. The processing stage of FIG. 19 follows that of FIG. 16.

FIG. 19 shows the construction 10d of FIG. 16 at a processing stage subsequent to that of FIG. 16, and analogous to that of FIG. 18. Accordingly, n-type doped region 102 is shown extending within the bottoms of linear segments 91-93, within footings 100, and within an upper region of the deck 101.

Figure 20:
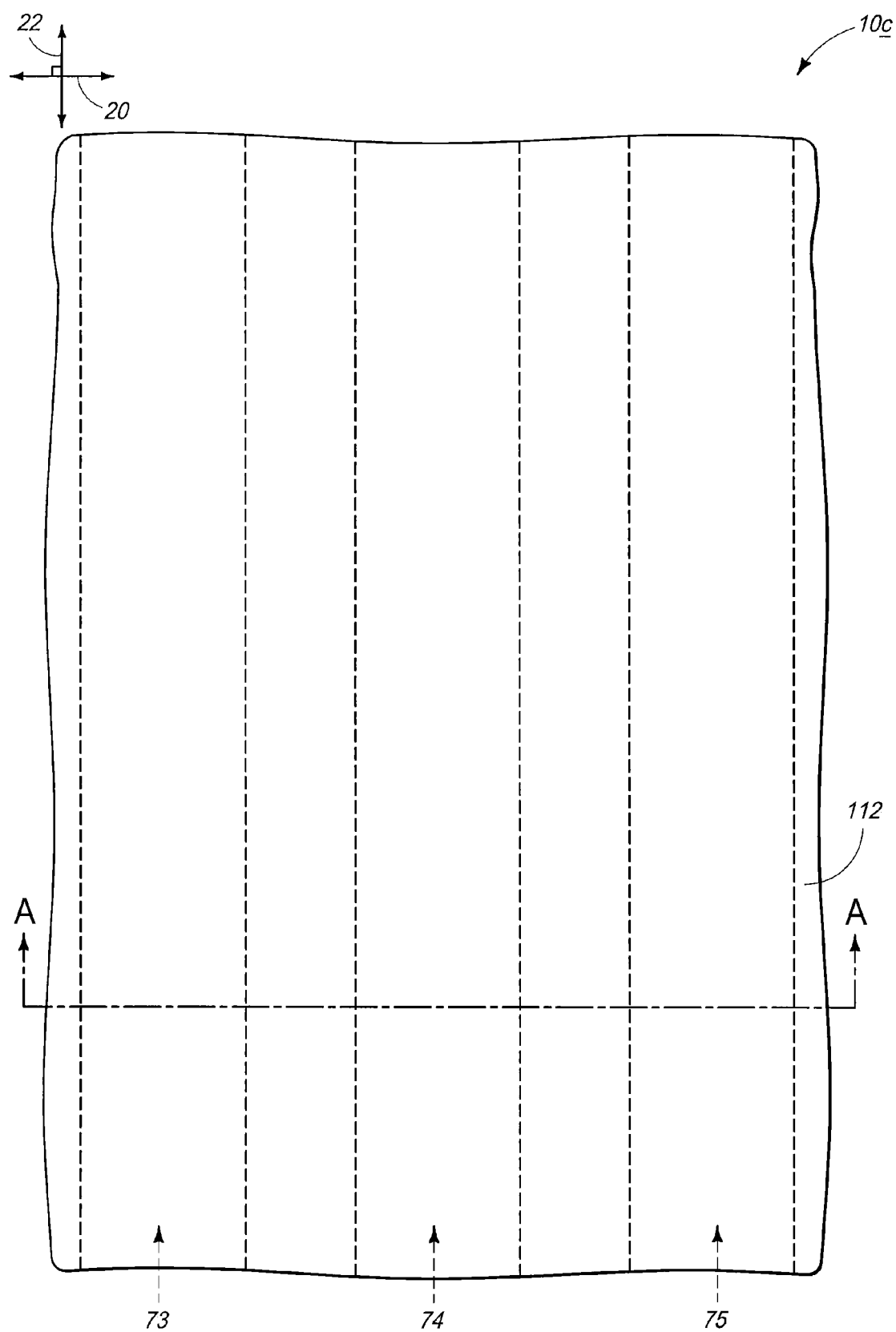
FIGS. 20 and 21 are a diagrammatic top view, and a cross-sectional side view of a portion of a semiconductor construction at a processing stage subsequent to that of FIGS. 17 and 18 of an example embodiment method of forming a memory array. The cross-sectional side view of FIG. 21 is along line A-A of FIG. 20.
Figure 21:
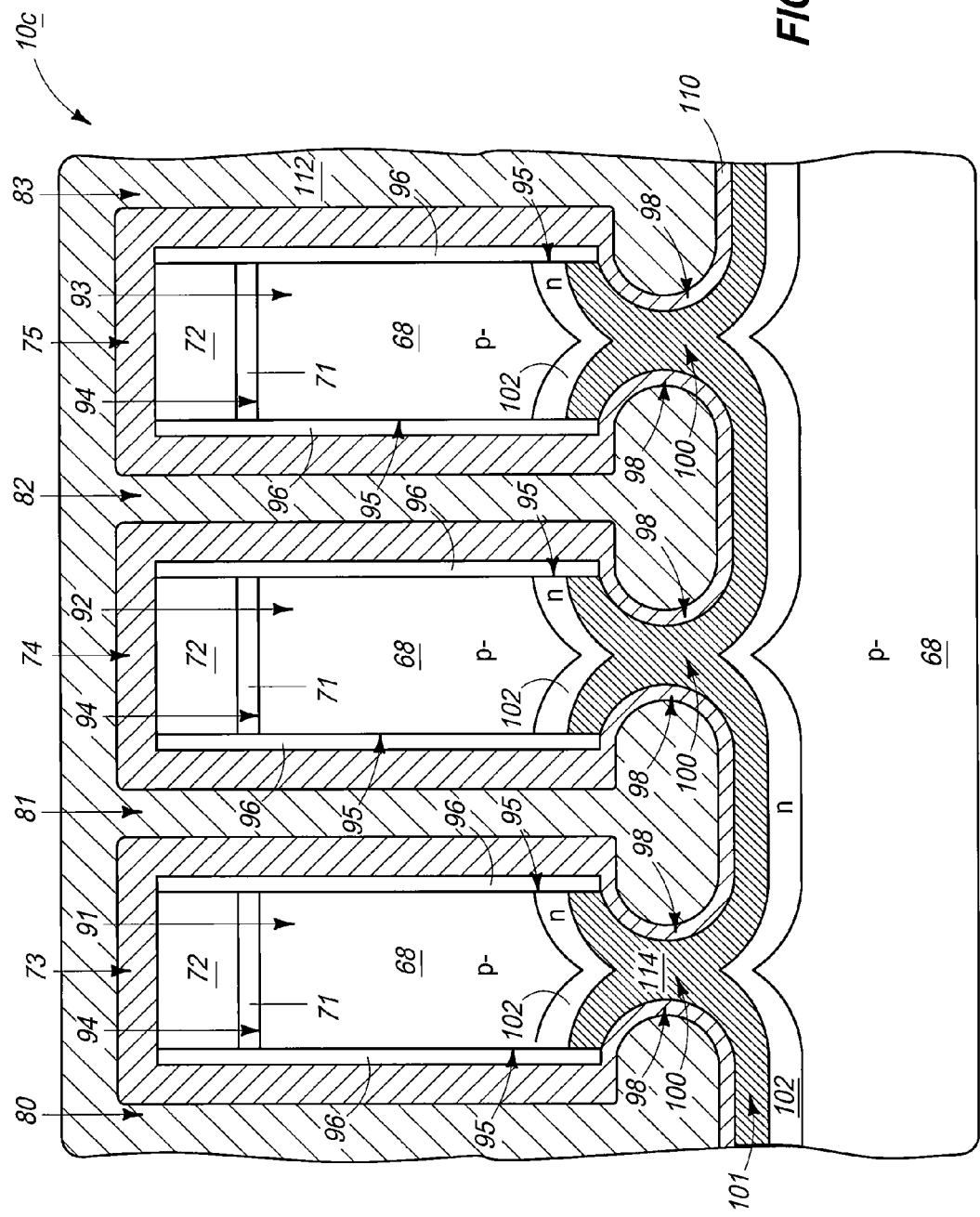

Referring to FIGS. 20 and 21, metal-containing materials 110 and 112 are formed over and between linear segments 91-93 (the patterned masking features 73-75 are shown in dashed-line in the top view of FIG. 20 to indicate that such features are beneath the metal-containing material 112).

Metal-containing material 110 may comprise any suitable composition. For instance, metal-containing material 110 may comprise one or more elemental metals, such as, for example, one or more of titanium, cobalt, etc. Such metals may be deposited utilizing any suitable methodology such as, for example, one or more of CVD, ALD, physical vapor deposition (PVD), etc. In the shown embodiment, the metal-containing material 110 extends across exposed surfaces of semiconductor material 68, across exposed surfaces of protective material 96, and across exposed surfaces of masking material 72. In other embodiments, the metal-containing material 110 may be deposited under conditions such that it forms selectively only along exposed surfaces of semiconductor material 68.

Portions of the n-type doped regions 102 of semiconductor material 68 that are proximate the metal-containing material 110 become converted into metal/semiconductor material 114. For instance, if semiconductor material 68 comprises, consists essentially of, or consists of silicon, the metal/semiconductor material 114 may comprise, consist essentially of, or consist of metal silicide. Alternatively, if semiconductor material 68 comprises, consists essentially of, or consists of germanium, the metal/semiconductor material 114 may comprise, consist essentially of, or consist of metal germanide.

The metal-containing material 110 extends into cavities 98, and the entirety of the footings 100 are converted into the metal/semiconductor material 114 in the shown embodiment.

The portions of metal-containing material 110 along semiconductor material 68 are illustrated to be thinner than other portions of the metal-containing material 110 (for instance, the portions along protective material 96) to indicate that some of the metal-containing material along the semiconductor material was consumed to form the metal/semiconductor material 114. In some embodiments, an entirety of the metal-containing material 110 along the semiconductor material 68 is consumed during the formation of the metal/semiconductor material, and accordingly there is no material 110 remaining along the semiconductor material 68 after the formation of the metal/semiconductor material. In other embodiments, some of the metal-containing material 110 may remain after formation of the metal/semiconductor material, as shown.

The metal-containing material 112 may comprise any suitable composition or combination of compositions, and in some embodiments may comprise, consist essentially of, or consist of metal nitride (for instance, titanium nitride).

Figure 22:
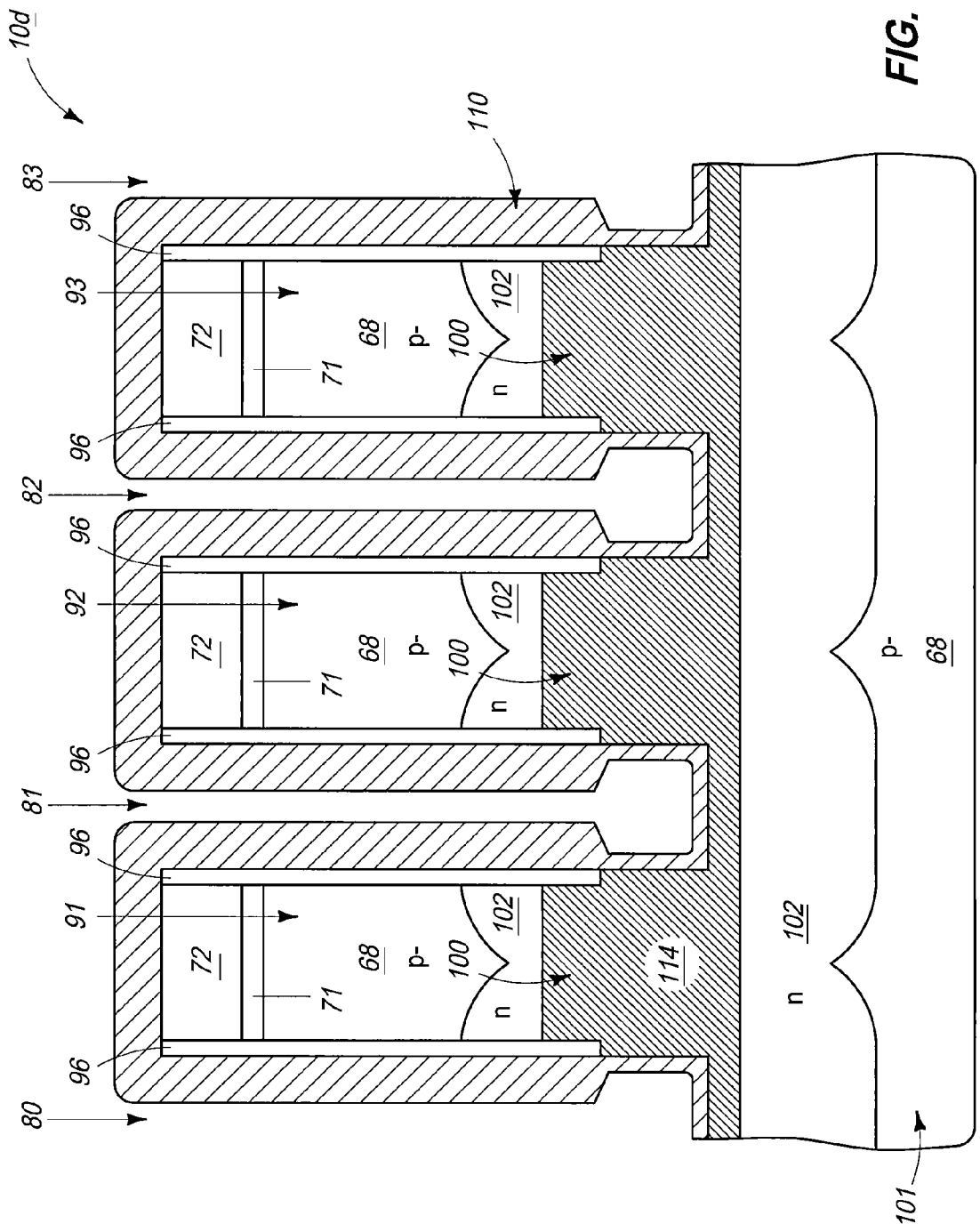
FIG. 22 is a diagrammatic cross-sectional side view of a portion of a semiconductor construction at a processing stage analogous to that of FIG. 21, but in accordance with an alternative embodiment to that of FIG. 21. The processing stage of FIG. 22 follows that of FIG. 19.

FIG. 22 shows the construction 10d of FIG. 16 at a processing stage subsequent to that of FIG. 19, and analogous to that of FIG. 21. Accordingly, metal-containing material 110 is shown extending over and between the linear segments 91-93. In the shown embodiment, a difference between the processing stage of FIG. 22 and that of FIG. 21 is that only metal-material 110 is provided at the processing stage of FIG. 22, rather than utilizing both of the metal-containing materials 110 and 112. The entirety of the thickness through the footings 100 of FIG. 22 is converted to metal/semiconductor material. Such may be accomplished, for example, in embodiments in which semiconductor material 68 comprises silicon, if linear segments 91-93 are suitably thin to enable penetration of metal from material 110 entirely through the thickness of the footings to react with the silicon throughout the footings and thereby convert the entire thickness of the footings to metal silicide.

Figure 23:
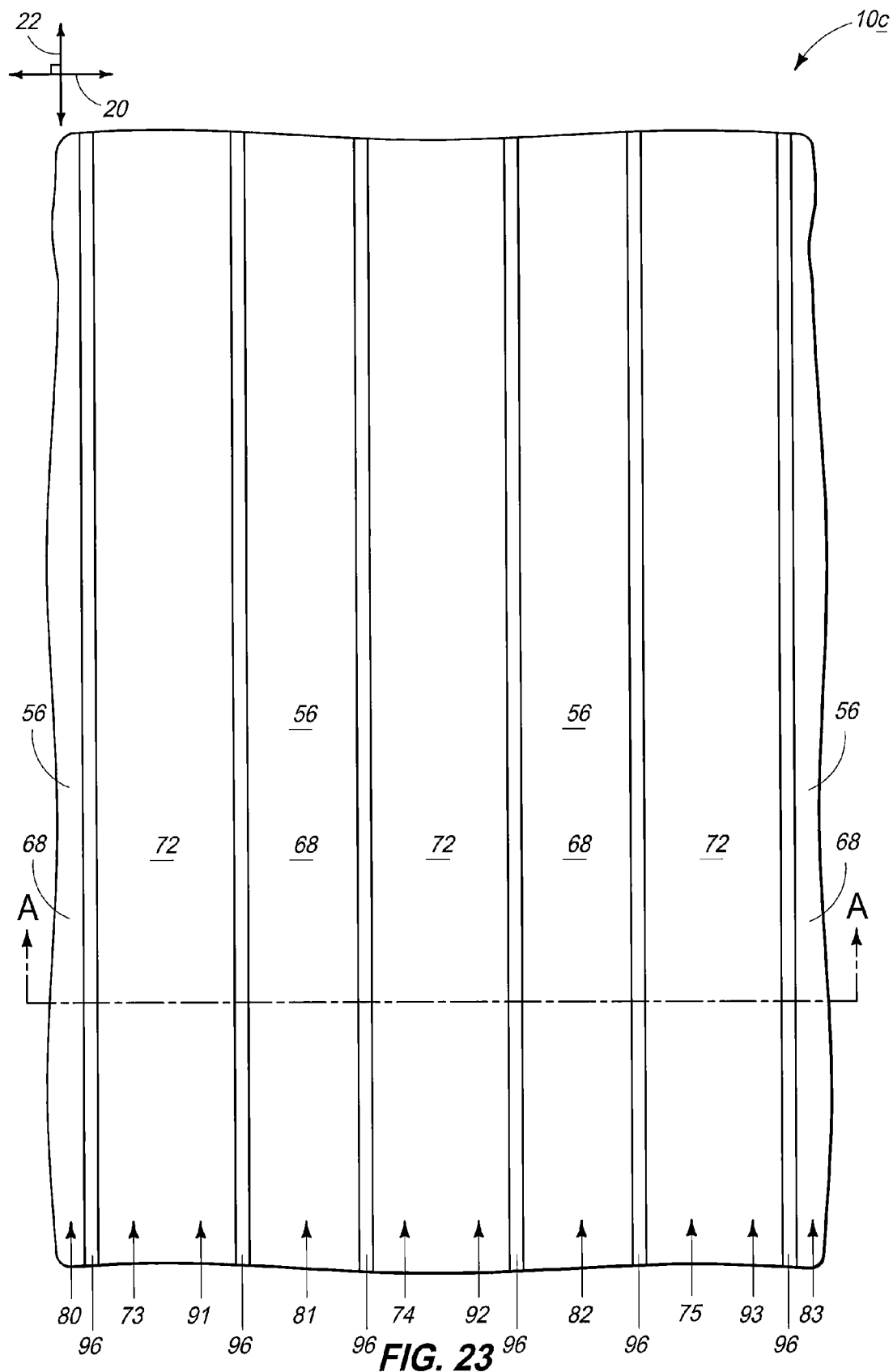
FIGS. 23 and 24 are a diagrammatic top view, and a cross-sectional side view of a portion of a semiconductor construction at a processing stage subsequent to that of FIGS. 20 and 21 of an example embodiment method of forming a memory array. The cross-sectional side view of FIG. 24 is along line A-A of FIG. 23.
Figure 24:
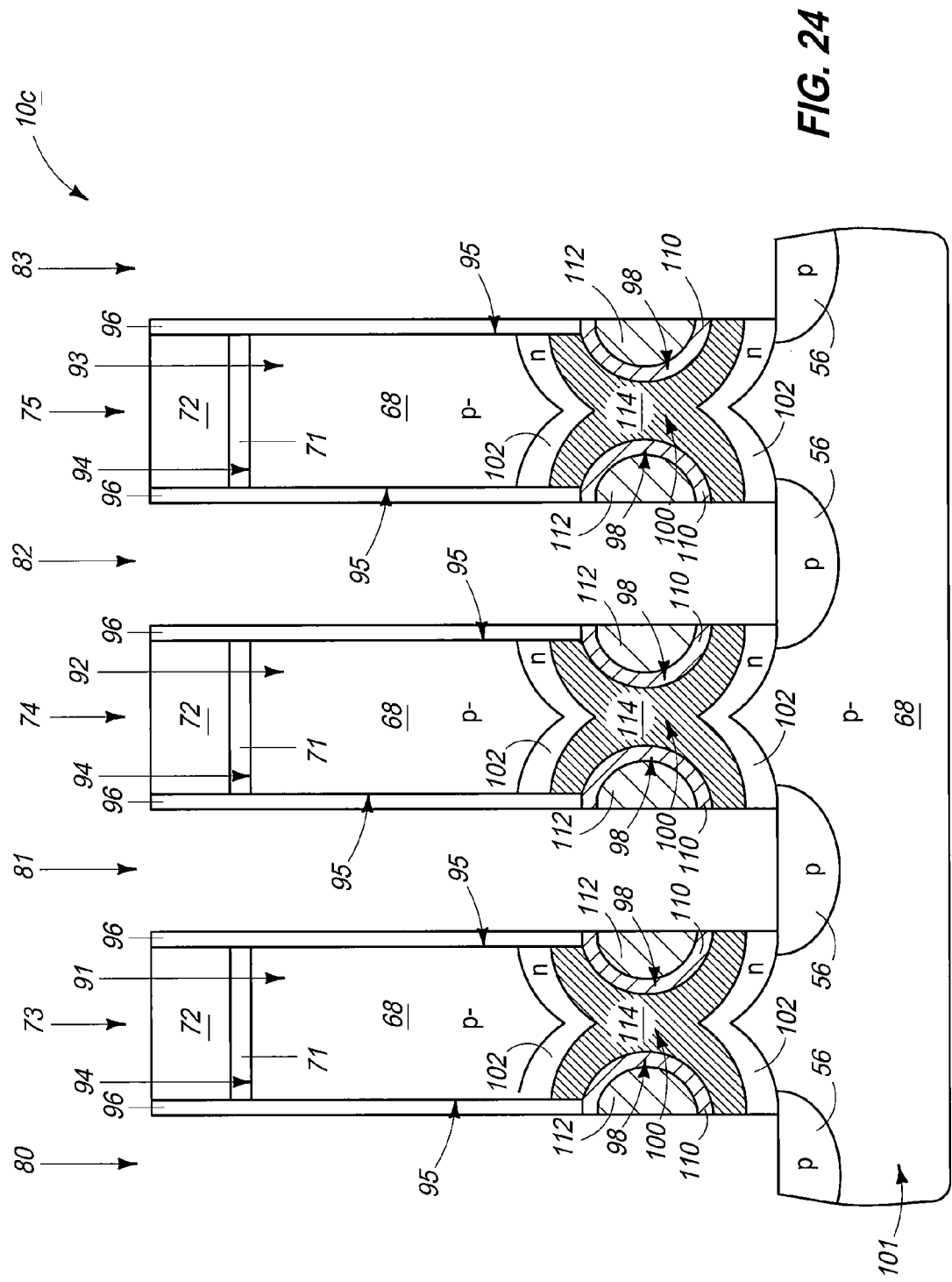

Referring to FIGS. 23 and 24, etching is conducted to remove metal-containing materials 110 and 112 from within trenches 80-83, and to punch through the metal/semiconductor material 114 and the n-type doped regions 102 at the bottoms of such trenches. Such etching exposes portions of semiconductor material 68 at the bottoms the trenches 80-83, and in some embodiments may be considered to expose regions of semiconductor material 68 along the deck 101 between the linear segments 91-93. The etching may comprise any suitable etch or combination of etches, and in some embodiments utilizes dry etching to anisotropically penetrate through the metal-containing materials to the underlying semiconductor material 68 without removing the metal-containing materials from within cavities 98.

The semiconductor material 68 exposed within deck 101 is subjected to a p-type dopant implant to form p-type doped regions 56 at the bottoms of trenches 80-83.

Figure 27:
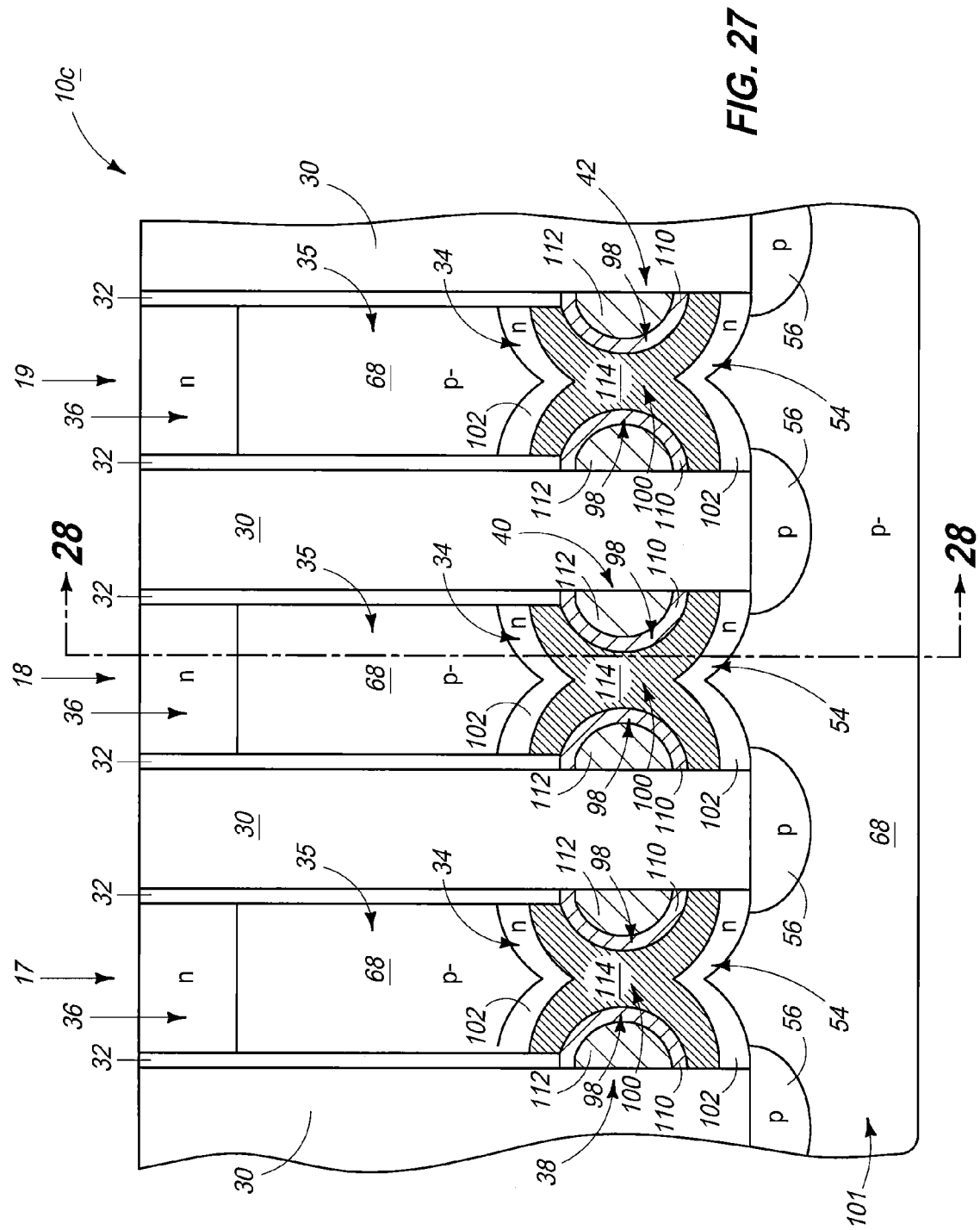

The p-type doped regions 56 form stripes extending the length of the linear segments 91-93, as can be understood with reference to the top view of FIG. 23. The n-type doped regions 102 also correspond to stripes extending the lengths of the segments 91-93. In some embodiments, the n-type doped regions 102 may be considered to be first doped stripes, with such first doped stripes ultimately being directly under digit lines (FIG. 27 shows the materials 114, 110 and 112 incorporated into digit lines 38, 40 and 42), and the doped regions 56 may be considered to correspond to second doped stripes which are directly between adjacent first doped stripes. The first and second doped stripes are doped to opposite conductivity types relative to one another; with the shown first doped stripes being doped to n-type conductivity, and the shown second doped stripes being doped to p-type conductivity. In other embodiments, the first doped stripes (i.e., the doped stripes corresponding to doped regions 102) may be doped to p-type conductivity, and the second doped stripes (i.e., the doped stripes corresponding to doped regions 56) may be doped to n-type conductivity.

Figure 25:
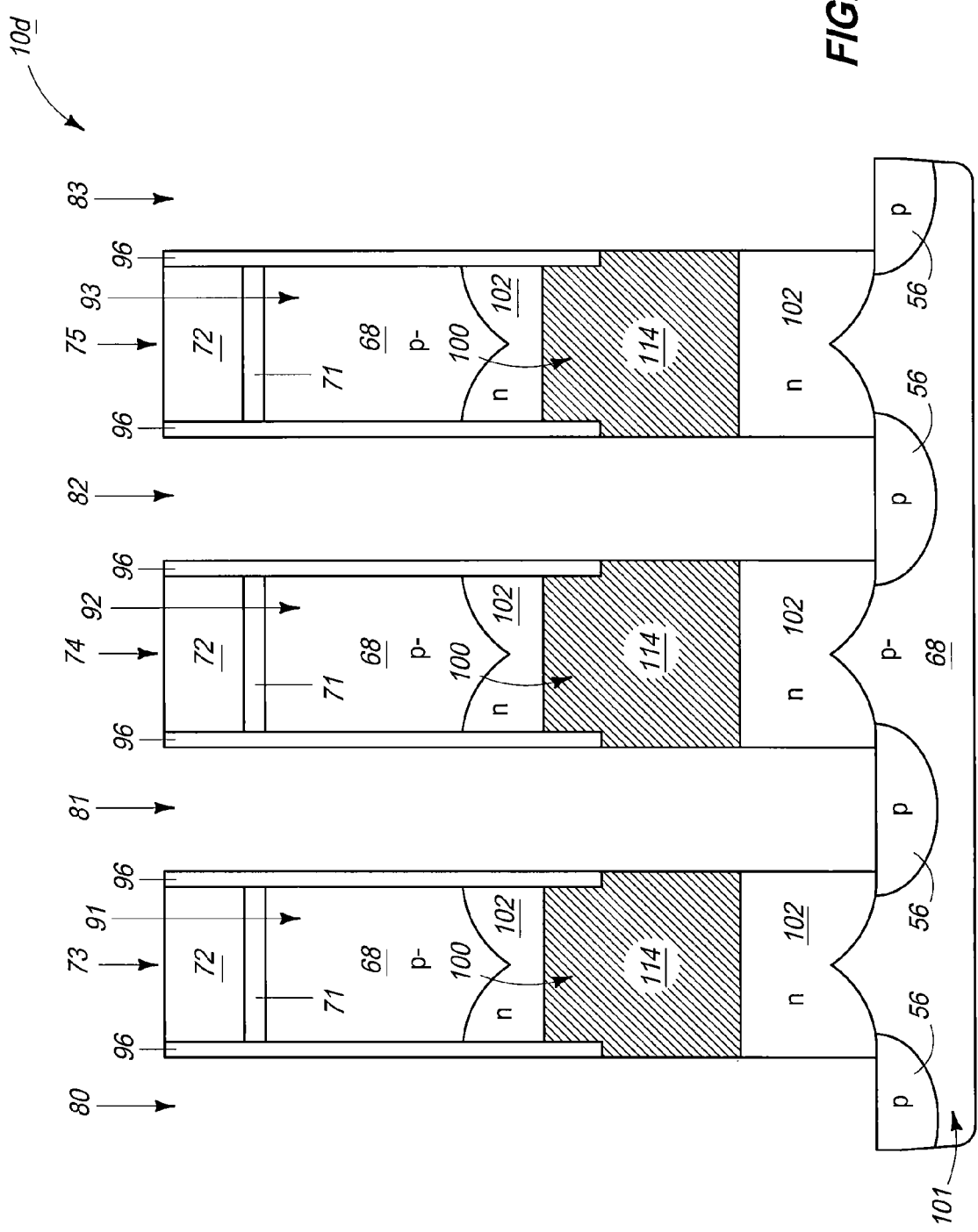
FIG. 25 is a diagrammatic cross-sectional side view of a portion of a semiconductor construction at a processing stage analogous to that of FIG. 24, but in accordance with an alternative embodiment to that of FIG. 24. The processing stage of FIG. 25 follows that of FIG. 22.

FIG. 25 shows the construction 10d of FIG. 16 at a processing stage subsequent to that of FIG. 22, and analogous to that of FIG. 24. Accordingly, portions of semiconductor material 68 are exposed at the bottoms the trenches 80-83, and p-type doped regions 56 are formed within such portions of the semiconductor material.

Figure 26:
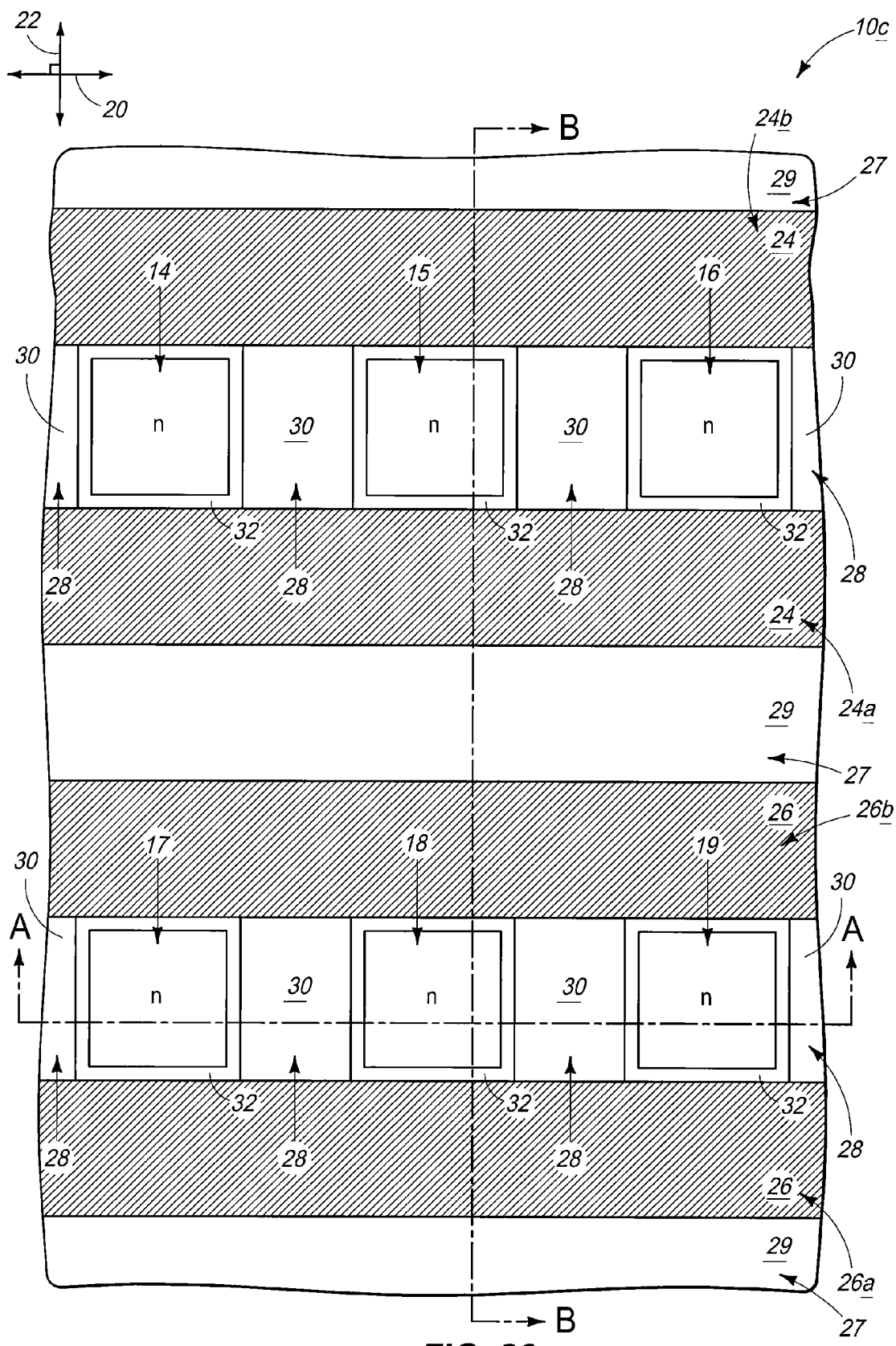
FIGS. 26-28 are a diagrammatic top view, and cross-sectional side views of a portion of a semiconductor construction at a processing stage subsequent to that of FIGS. 23 and 24 of an example embodiment method of forming a memory array. The cross-sectional side view of FIG. 27 is along line A-A of FIG. 26, and the cross-sectional side view of FIG. 28 is along line B-B of FIG. 26.
Figure 28:
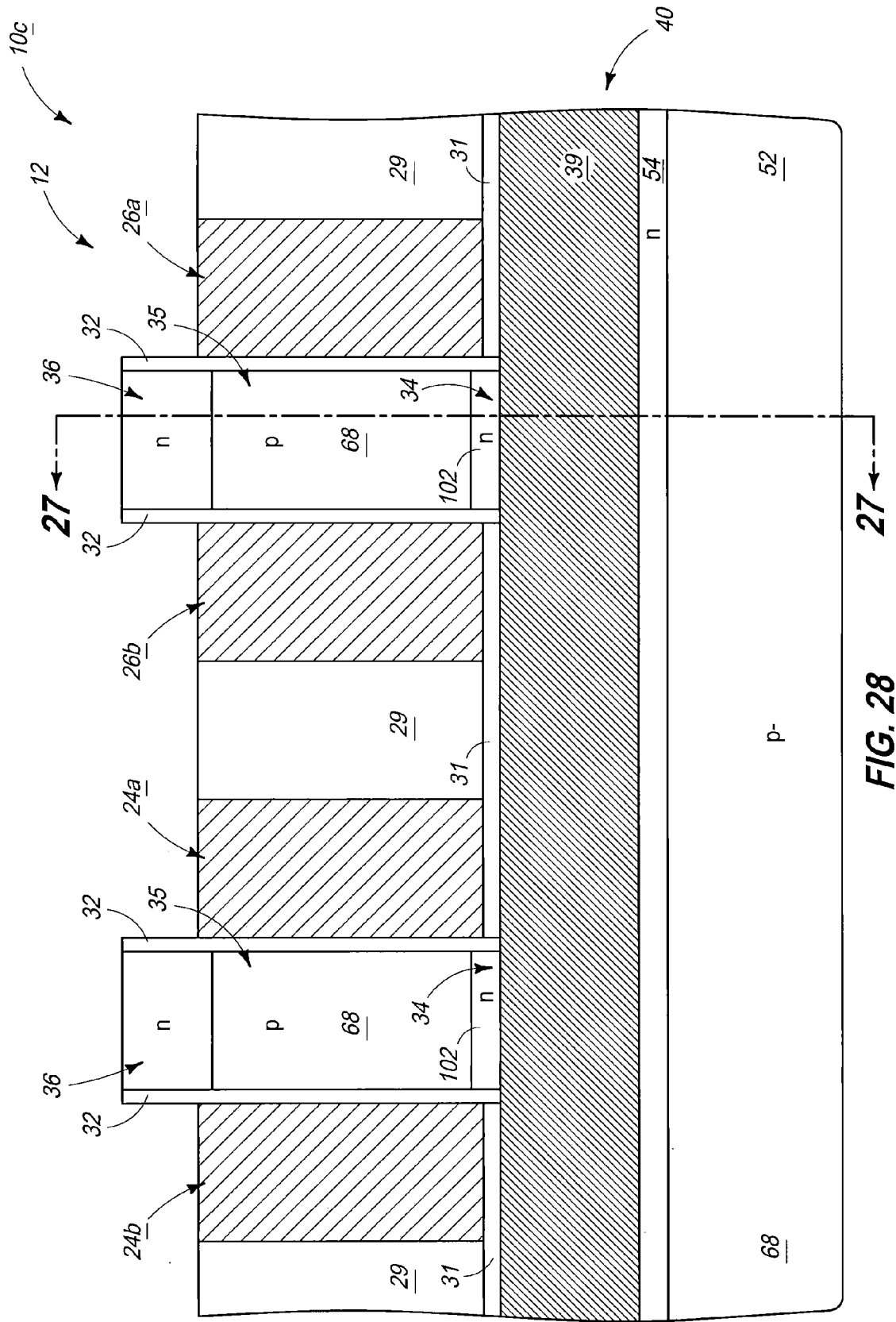

Referring to FIGS. 26-28, linear segments 91-93 (FIGS. 23 and 24) are patterned to subdivide such linear segments into vertically-oriented transistor pedestals 14-19 analogous to the pedestals discussed above with reference to FIG. 1. Specifically, linear segment 91 (FIGS. 23 and 24) is subdivided into transistor pedestals 14 and 17, linear segment 92 (FIGS. 23 and 24) is subdivided into transistor pedestals 15 and 18, and linear segment 93 (FIGS. 23 and 24) is subdivided into transistor pedestals 16 and 19.

The patterning and subdividing of the linear segments into the transistor pedestals may comprise any suitable processing, such as, for example, utilization of a patterned mask (which may be a photolithographically-patterned mask in some embodiments, a patterned mask formed utilizing pitch-multiplication methodologies in some embodiments, etc.) to define locations of the transistor pedestals, followed by one or more suitable etches to subdivide the linear segments into such transistor pedestals.

FIGS. 26-28 show construction 10c at a processing stage analogous to that described above with reference to FIGS. 1-3. FIG. 27 is along the line 27-27 of FIG. 28, and FIG. 28 is along the line 28-28 of FIG. 27.

The construction of FIGS. 26-28 has transistor pedestals 14-19 extending upwardly from metal/semiconductor material 114 of the footings 100 (as shown in FIGS. 27 and 28). In the embodiment of FIGS. 27 and 28, footings 100, together with metal-containing materials 110 and 112, form digit lines 38, 40 and 42 analogous to those discussed above with reference to FIGS. 2 and 3. Specifically, the metal/semiconductor material 114 is analogous to the metal silicide of the central composition 39 of the embodiment of FIGS. 2 and 3; and the metal-containing materials 110 and 112, in combination, are analogous to the outer metal-containing compositions 41 and 43 of the embodiment of FIGS. 2 and 3.

The n-type doped regions 102 beneath the digit lines 38, 40 and 42 are incorporated into regions 54 identical to those discussed above with reference to FIGS. 1-3, and the n-type doped regions above the digit lines are incorporated into bottom source/drain regions 34 identical to those discussed above with reference to FIGS. 1-3.

In the shown embodiment, the protective material 96 (FIGS. 23 and 24) is replaced with gate dielectric material 32. As discussed previously, there may also be embodiments in which at least some of the protective material remains to be incorporated into the gate dielectric material.

Electrically insulative material 30 is shown formed between adjacent transistor pedestals along rows of a memory array, analogously to the material 30 described above with reference to FIGS. 1-3.

Access lines 24 and 26 are shown formed along sides of the transistor pedestals analogous to the access lines 24 and 26 discussed above with reference to FIGS. 1-3, and insulative material 29 is shown formed between the adjacent access lines.

Upper n-type doped source/drain regions 36 are shown formed within the transistor pedestals 14-19. Such upper n-type doped source/drain regions may be formed after formation of the access lines, so that the upper source/drain regions are self-aligned to the access lines. Alternatively, the upper source/drain regions may be formed at any other suitable processing stage.

P-type doped channel regions 35 are between the bottom source/drain regions 34 and the upper source/drain regions 36. Such channel regions have a threshold voltage dopant level provided therein. The threshold voltage dopant may be provided at any suitable processing stage.

Although the transistor pedestals are shown comprising a pair of source/drain regions which are oppositely doped to the intervening channel region, in other embodiments the channel region and source/drain regions may all be similarly doped to one another. An example construction in which the channel region and source/drain regions are all similarly doped one another is described below with reference to FIG. 43.

In subsequent processing, charge storage devices may be electrically coupled with the top source/drain regions to incorporate the transistor pedestals into DRAM; or, alternatively, the transistor pedestals may be incorporated into ZRAM.

Figure 29:
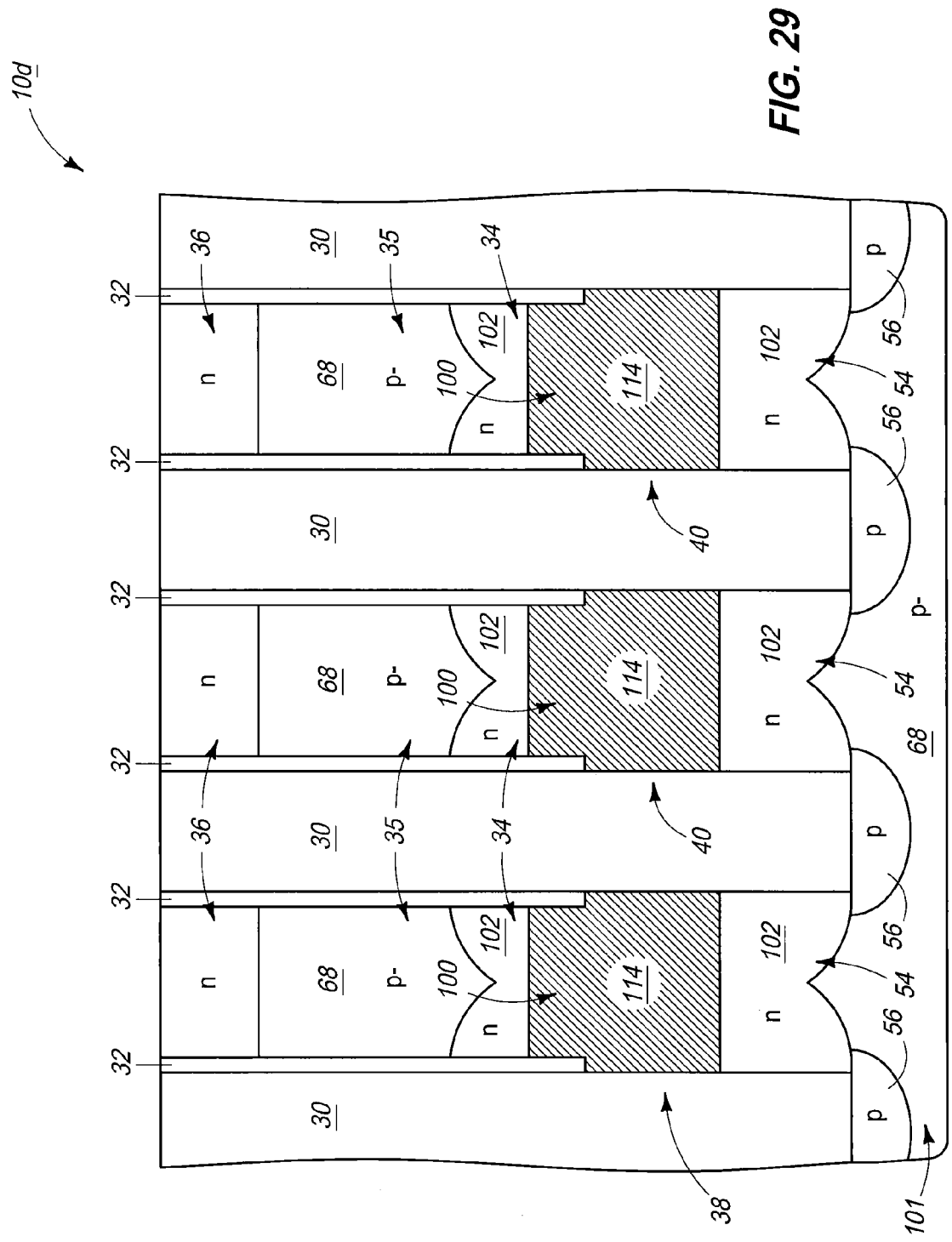
FIGS. 29 and 30 are diagrammatic cross-sectional side views along the lines A-A and B-B of FIG. 26 at a processing stage analogous to that of FIGS. 27 and 28, but in accordance with an alternative embodiment to that of FIGS. 27 and 28. The processing stage of FIGS. 29 and 30 follows that of FIG. 25.
Figure 30:
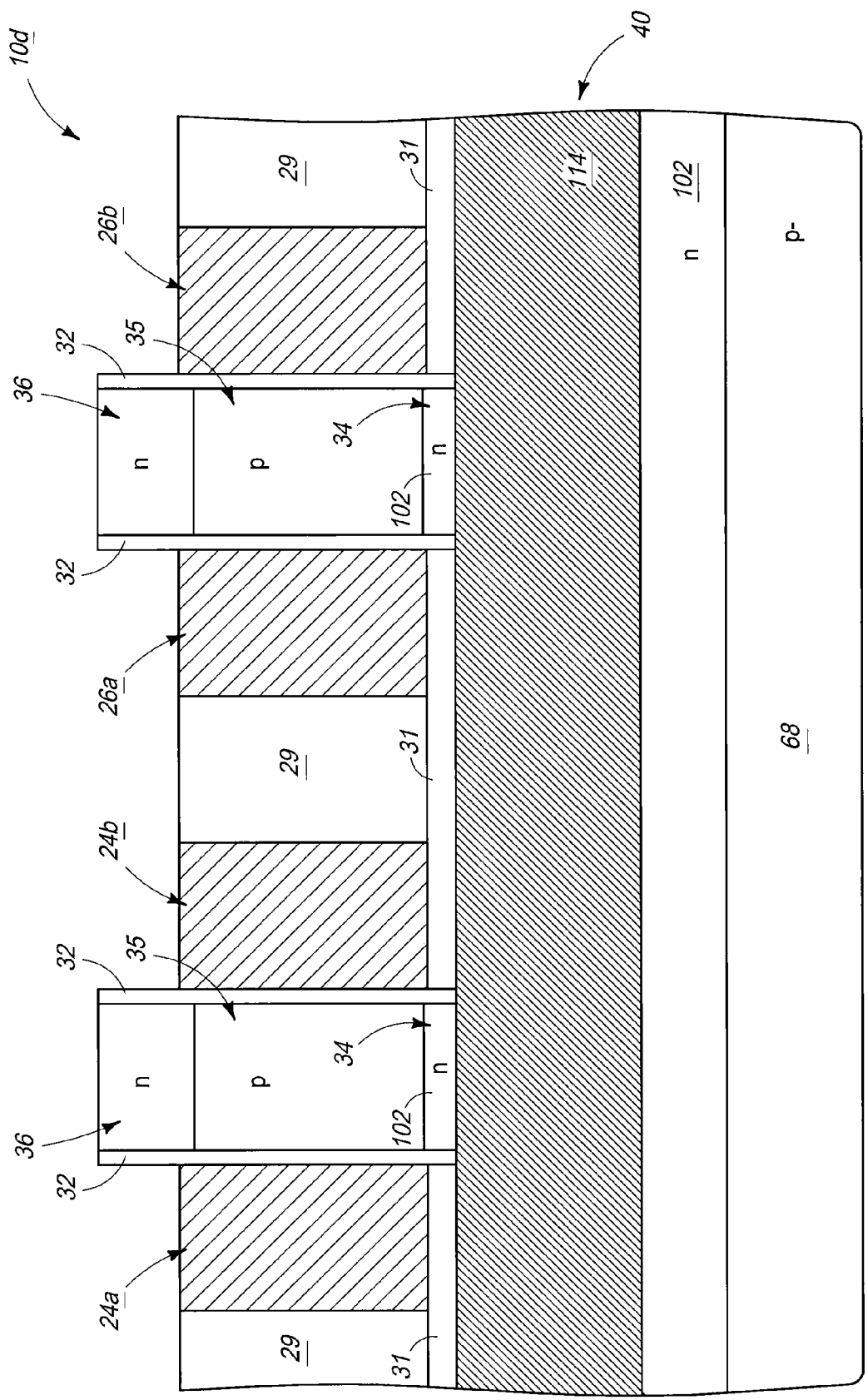

FIGS. 29 and 30 show construction 10d at a processing stage subsequent to that of FIG. 25, and analogous to that of FIGS. 27 and 28. FIG. 29 is along the line 29-29 of FIG. 30, and FIG. 30 is along the line 30-30 of FIG. 29. The digit lines 38, 40 and 42 are comprised entirely of the metal/semiconductor material 114 (i.e., material 114 is the only electrically conductive material of the digit lines) within the illustrated memory array region of the embodiment of FIGS. 29 and 30. It is noted that the digit lines may extend to regions outside of a memory array region (i.e., may extend to so-called peripheral regions). The embodiment of FIGS. 29 and 30 shows the digits lines comprising only material 114 within the memory array region, and it is to be understood that the digit lines may comprise other conductive materials besides, or in addition to, metal/semiconductor materials in the regions outside the memory array region in the embodiment of FIGS. 29 and 30.

Another example embodiment method of forming a memory array is described with reference to FIGS. 31-43.

Figure 31:
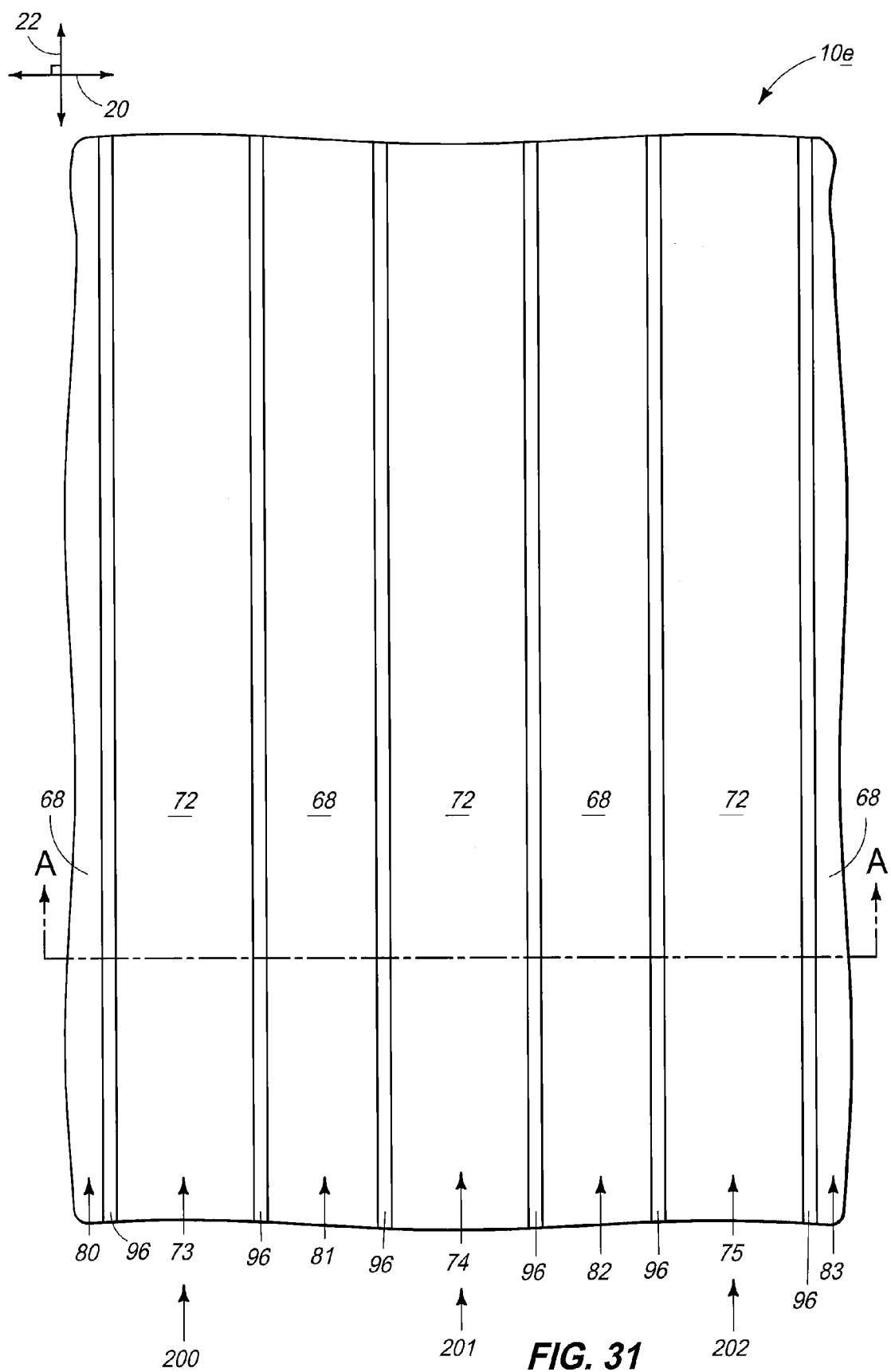
FIGS. 31 and 32 are a diagrammatic top view, and a cross-sectional side view of a portion of a semiconductor construction at a processing stage subsequent to that of FIGS. 12 and 13 in accordance with another example embodiment method of forming a memory array. The cross-sectional side view of FIG. 32 is along line A-A of FIG. 31.
Figure 32:
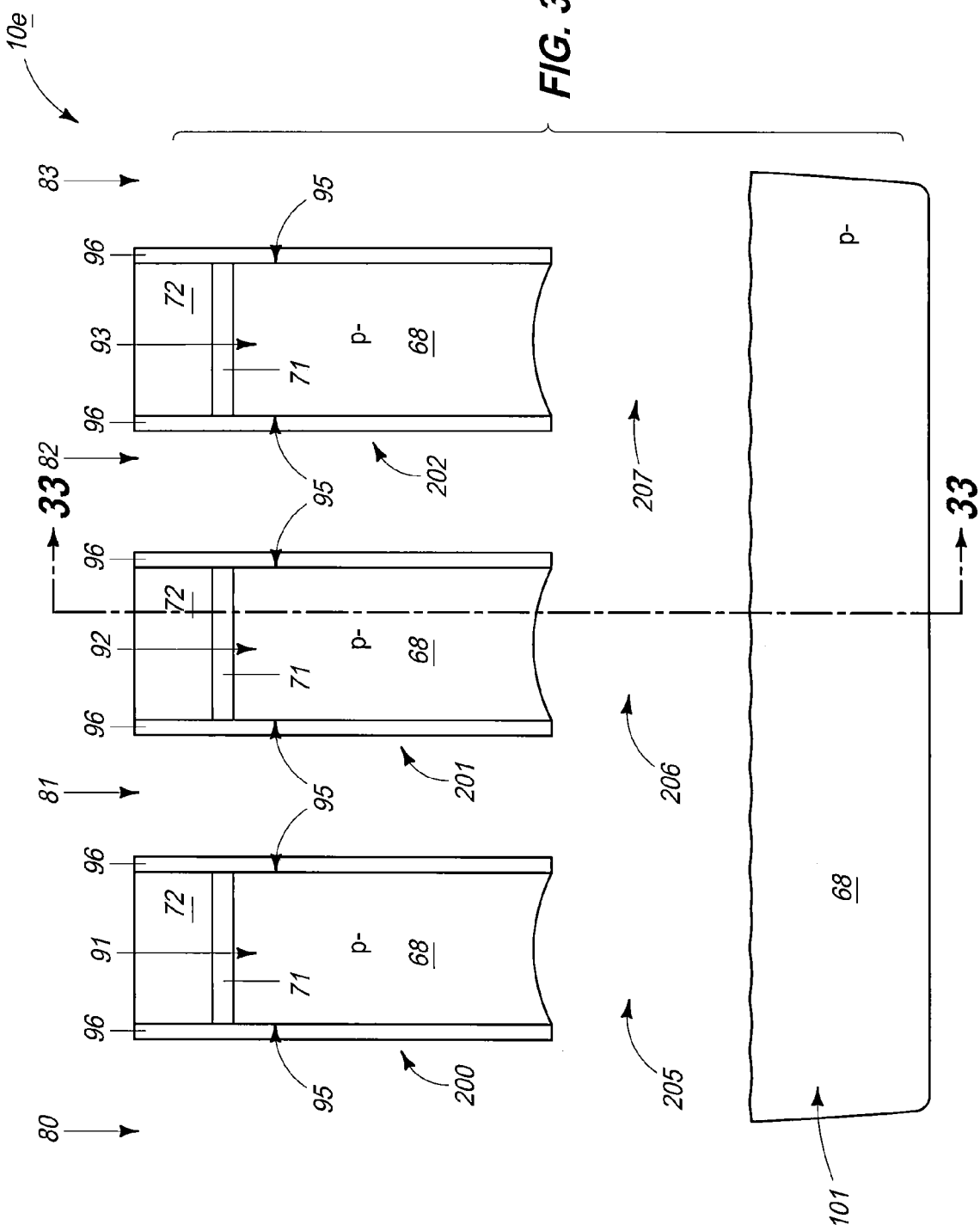

Referring to FIGS. 31 and 32, a semiconductor construction 10e is shown at a processing stage following that of FIGS. 12 and 13. The construction is similar to that of FIGS. 14 and 15, except that the etch into base 50 (FIG. 13) has completely undercut the linear segments 91-93. Such converts the linear segments into bridges 200-202 that are elevated over an underlying deck 101 of semiconductor material 68. More specifically, each of the bridges 200-202 is spaced from the underlying deck 101 by a gap, with the gaps under bridges 200-202 being labeled as gaps 205-207, respectively.

Figure 33:
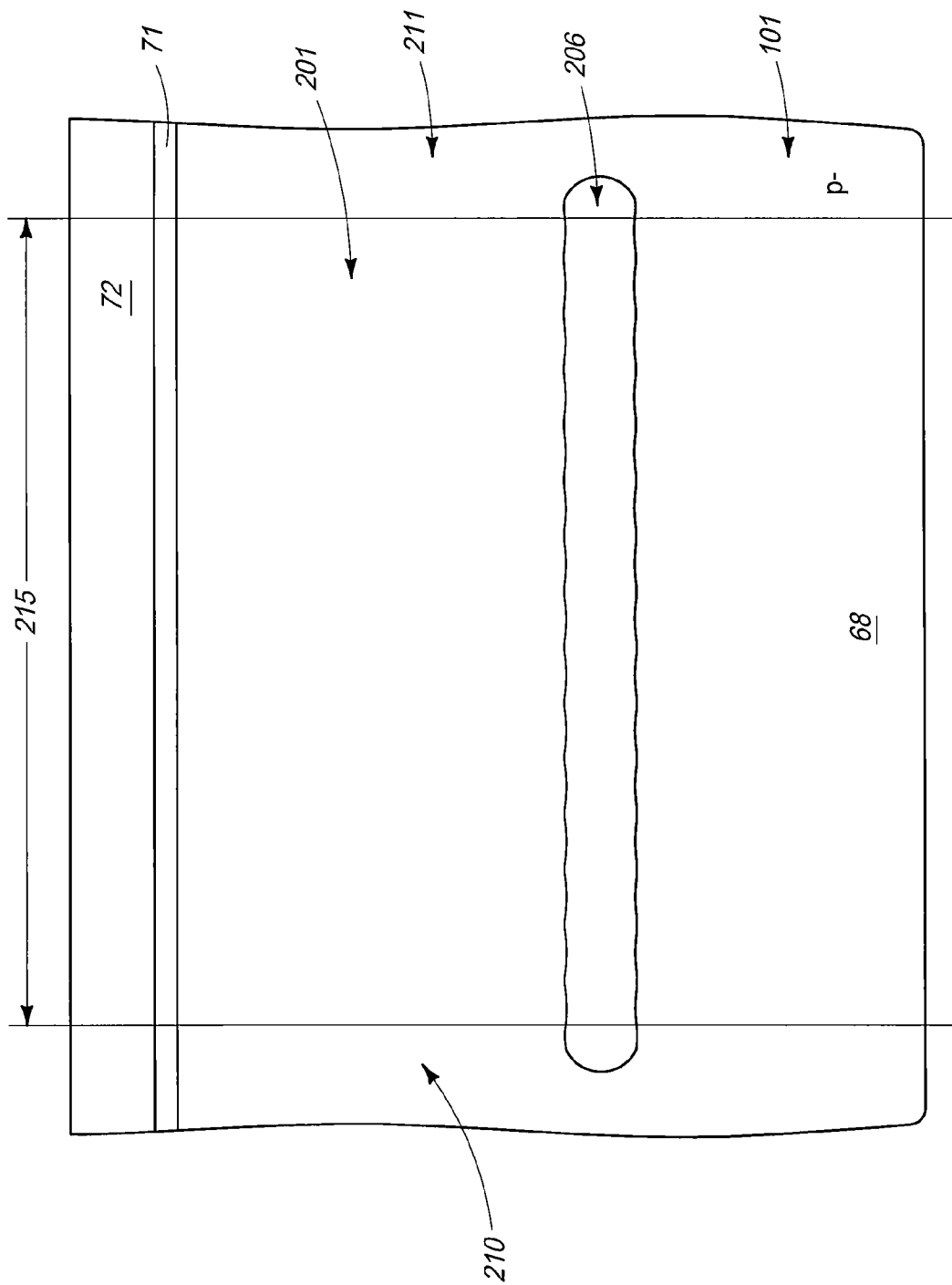
FIG. 33 is a diagrammatic cross-sectional side view along the line 33-33 of FIG. 32. The diagram of FIG. 33 is not to the same scale as the top view of FIG. 31, and shows a wider expanse of the semiconductor construction than is shown by FIG. 31.

Although the bridges 200-202 appear to be floating in space in the cross-section of view of FIG. 32, such bridges are actually connected to semiconductor material at the ends of the bridges. For instance, FIG. 33 shows a cross-section along the line 33-33 of FIG. 32, and shows the bridge 201 connected to semiconductor material 68 at opposing ends 210 and 211 of such bridge. The cross-section of FIG. 33 is not to the same scale as the top view of FIG. 31. Rather, the top view of FIG. 31 is within a memory array region (specifically a region where a memory array will be formed), and the cross-section of FIG. 33 extends beyond the memory array region. A memory array region is diagrammatically illustrated in FIG. 33 as a region 215, and the ends 210 and 211 are illustrated to be in regions peripheral to such memory array region. The bridge 201 may be considered to have a memory array section corresponding to the section of the bridge that is within the memory array region 215, and to have sections along the ends of such bridge that are peripheral to the memory array section of the bridge.

The cross-section of FIG. 33 shows the gap 206 to be a linear gap extending along a bottom of the linear bridge 201 over the deck 101, and extending the full length of the memory array section of the bridge 201. In some embodiments, additional support structures (not shown) may be provided to give additional support to bridge 201 beyond of the support provided by the semiconductor material at the ends 210 and 211.

Figure 34:
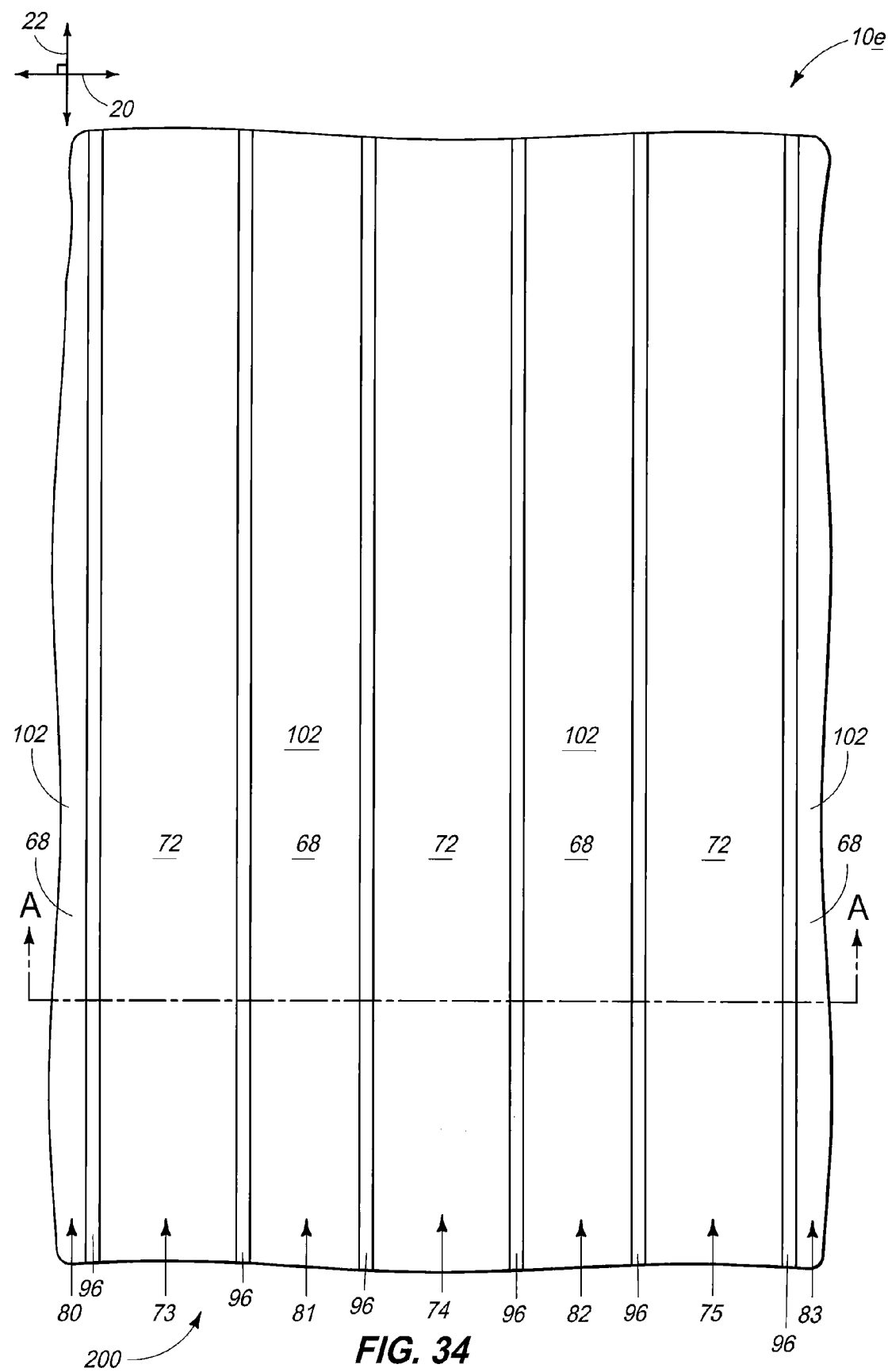
FIGS. 34 and 35 are a diagrammatic top view, and a cross-sectional side view of a portion of a semiconductor construction at a processing stage subsequent to that of FIGS. 31 and 32. The cross-sectional side view of FIG. 35 is along line A-A of FIG. 34.
Figure 35:
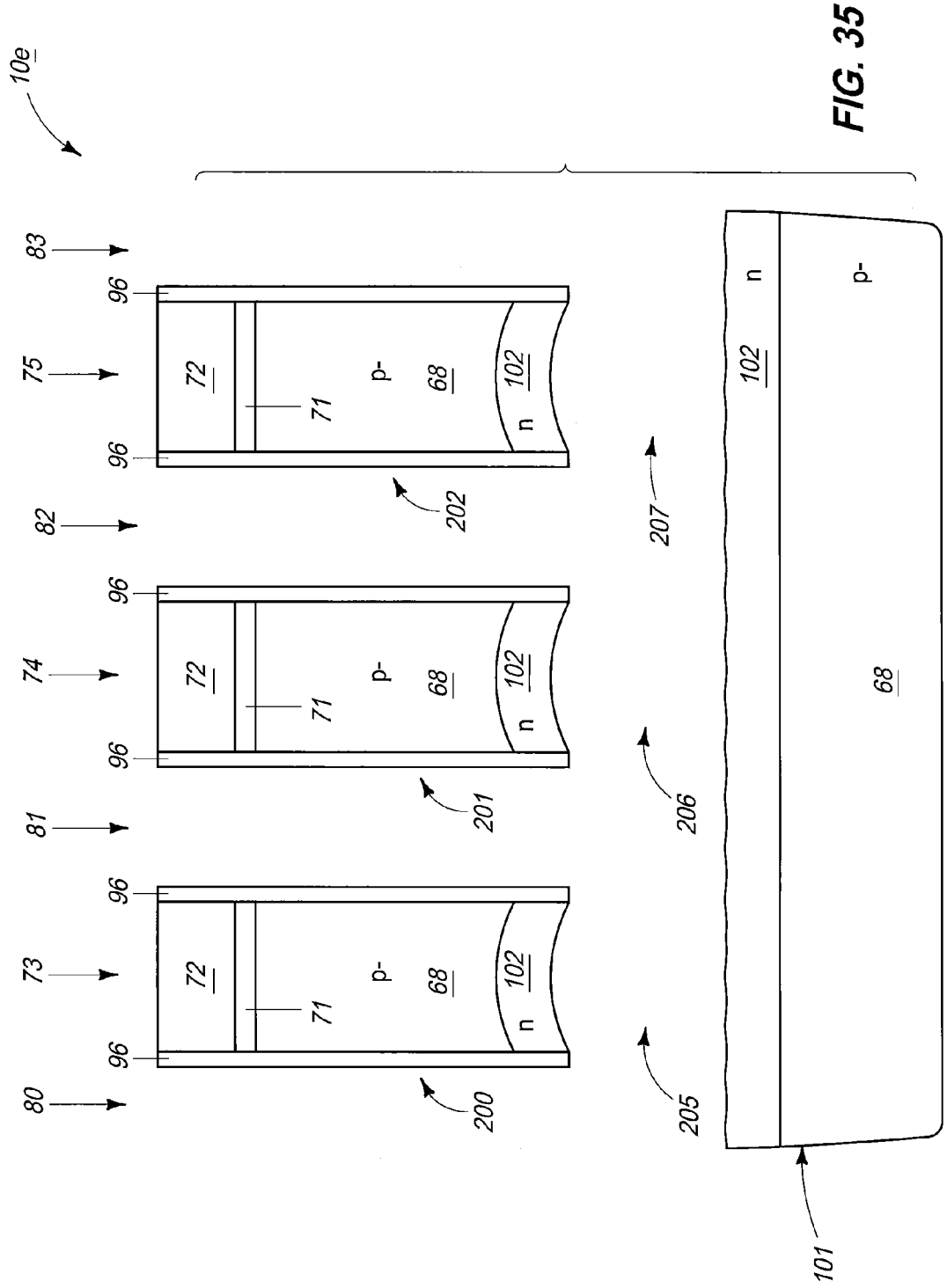

Referring to FIGS. 34 and 35, dopant is implanted into semiconductor material 68 to form n-type doped regions 102 that extend along the bottoms of the bridges 200-202, and within an upper region of the deck 101. The doped region 102 may be formed with any suitable processing, including, for example, any of the various processes described above with reference to FIG. 18.

Figure 36:
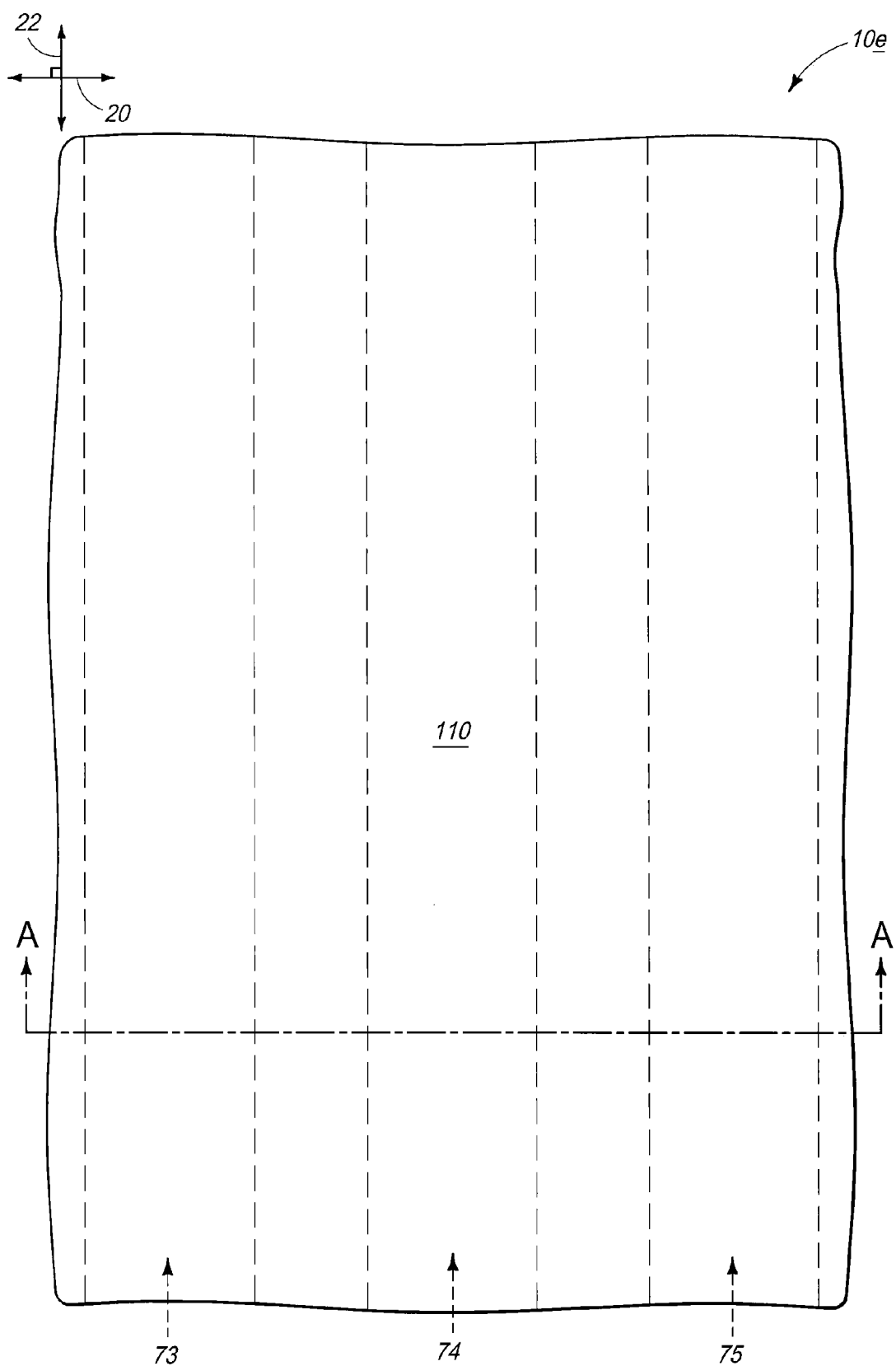
FIGS. 36 and 37 are a diagrammatic top view, and a cross-sectional side view of a portion of a semiconductor construction at a processing stage subsequent to that of FIGS. 34 and 35. The cross-sectional side view of FIG. 37 is along line A-A of FIG. 36.
Figure 37:
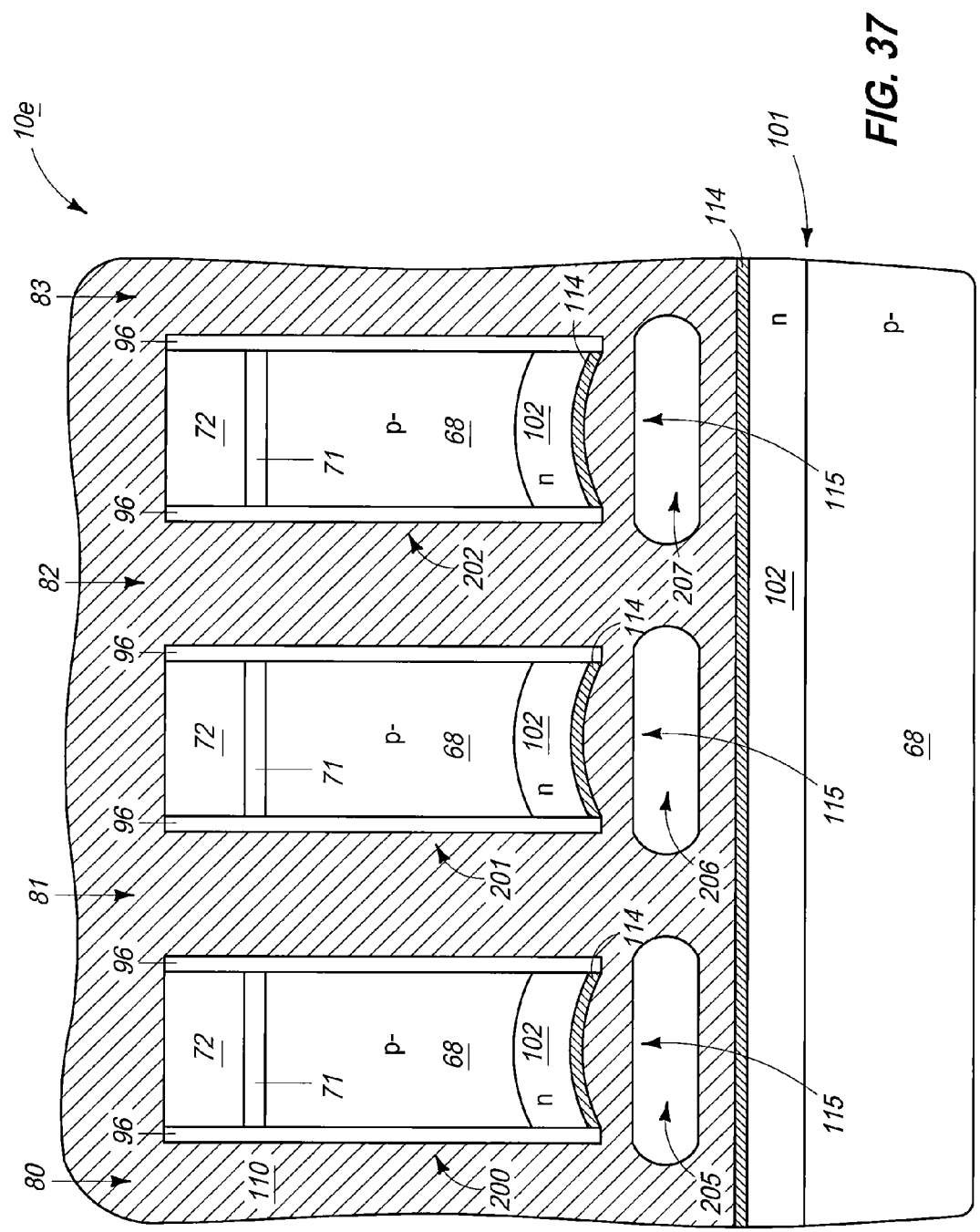

Referring to FIGS. 36 and 37, metal-containing material 110 is formed over and between the bridges 200-202 (the patterned masking features 73-75 are shown in dashed-line in the top view of FIG. 36 to indicate that such features are beneath the metal-containing material 110).

Metal-containing material 110 may comprise any suitable composition, such as, for example, one or more of the compositions discussed above with reference to FIGS. 20 and 21. Although only metal-containing material 110 is shown used in the embodiment of FIGS. 36 and 37, in other embodiments other metal-containing compositions (for instance, the metal nitride composition 112 discussed above with reference to FIGS. 20 and 21) may be used alternatively or in addition metal-containing material 110.

The areas of the n-type doped regions 102 of semiconductor material 68 that are exposed to the metal-containing material 110 become converted into metal/semiconductor material 114; and in some embodiments the metal/semiconductor material 114 may be a metal silicide.

Some of the metal-containing material 110 extends along the bottoms of the bridges in the shown embodiment to form metal/semiconductor material 114 along the bottoms of the bridges. Also, some of the metal-containing material 110 is beneath the gaps 205-207. In the shown embodiment, an expanse of metal/semiconductor material 114 is formed entirely across deck 101 beneath the bridges 200-202.

Some of the metal-containing material remains beneath and directly against the metal/semiconductor material 114 along the bottoms of the bridges to form electrically conductive lines (or rails) 115 along the bottoms of the bridges 200-202. Such lines may ultimately be incorporated into digit lines, as discussed below with reference to FIGS. 40-42.

The metal-containing material 110 does not completely fill the gaps 205-207 in the shown embodiment, and thus electrically insulative gaps remain below the bridges 200-202 after formation of metal-containing material 110. One way of avoiding having the metal-containing material fill the gaps 205-207 is to have the spacing between the bottoms of the bridges 200-202 and the top of the deck 101 be much larger than the widths of the trenches 80-83 (for instance, the spacing between the bottoms of the bridges and the top of the deck may be at least about 1.5 times larger than the widths of the trenches in some embodiments).

Figure 38:
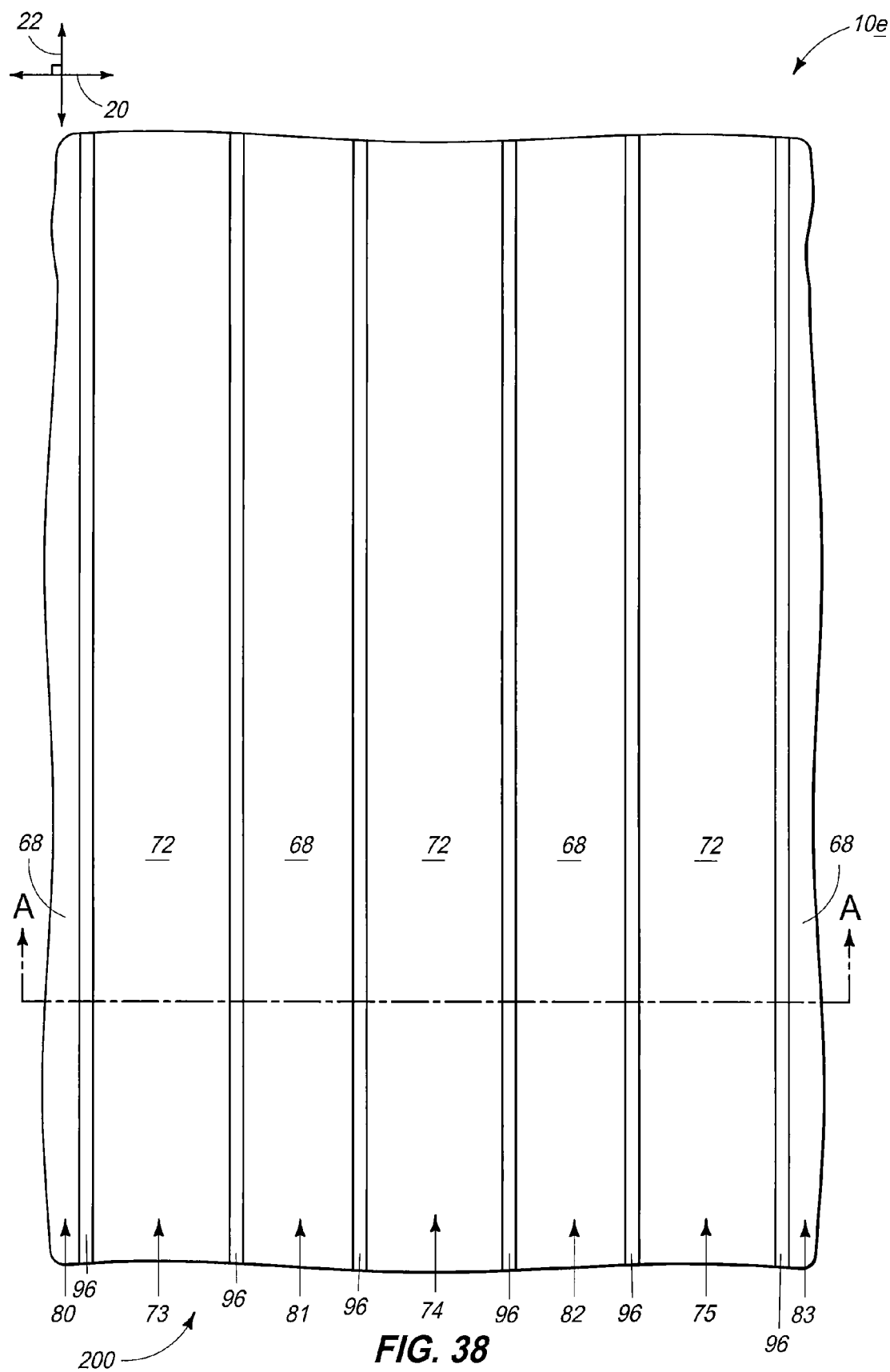
FIGS. 38 and 39 are a diagrammatic top view, and a cross-sectional side view of a portion of a semiconductor construction at a processing stage subsequent to that of FIGS. 36 and 37. The cross-sectional side view of FIG. 39 is along line A-A of FIG. 38.
Figure 39:
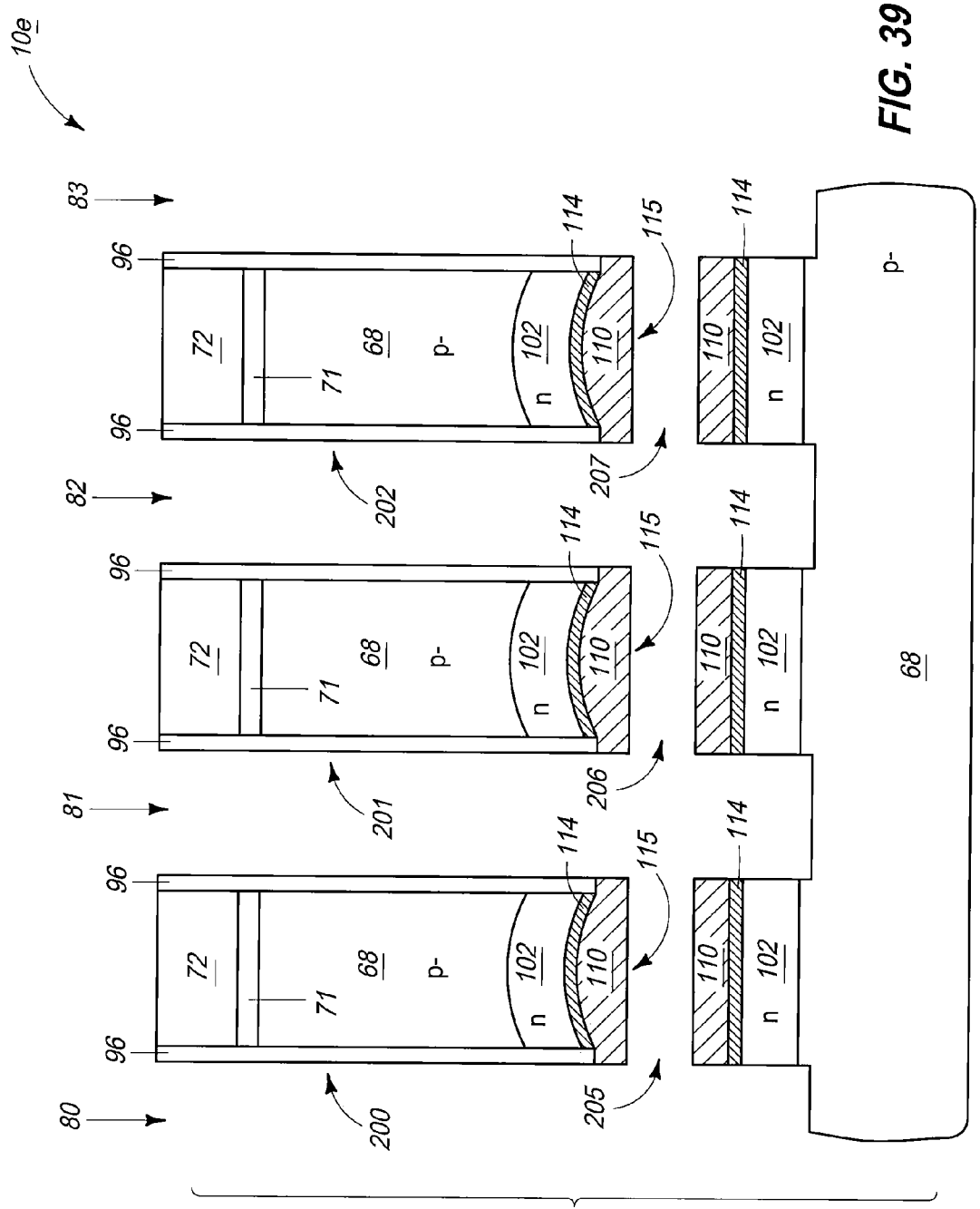

Referring to FIGS. 38 and 39, etching is conducted to remove metal-containing material 110 from within trenches 80-83, and to punch through the metal/semiconductor material 114 and the n-type doped regions 102 at the bottoms of such trenches. Such etching exposes portions of semiconductor material 68 at the bottoms the trenches 80-83. The etching may comprise any suitable etch or combination of etches, and in some embodiments utilizes dry etching to anisotropically penetrate through the metal.

Figure 40:
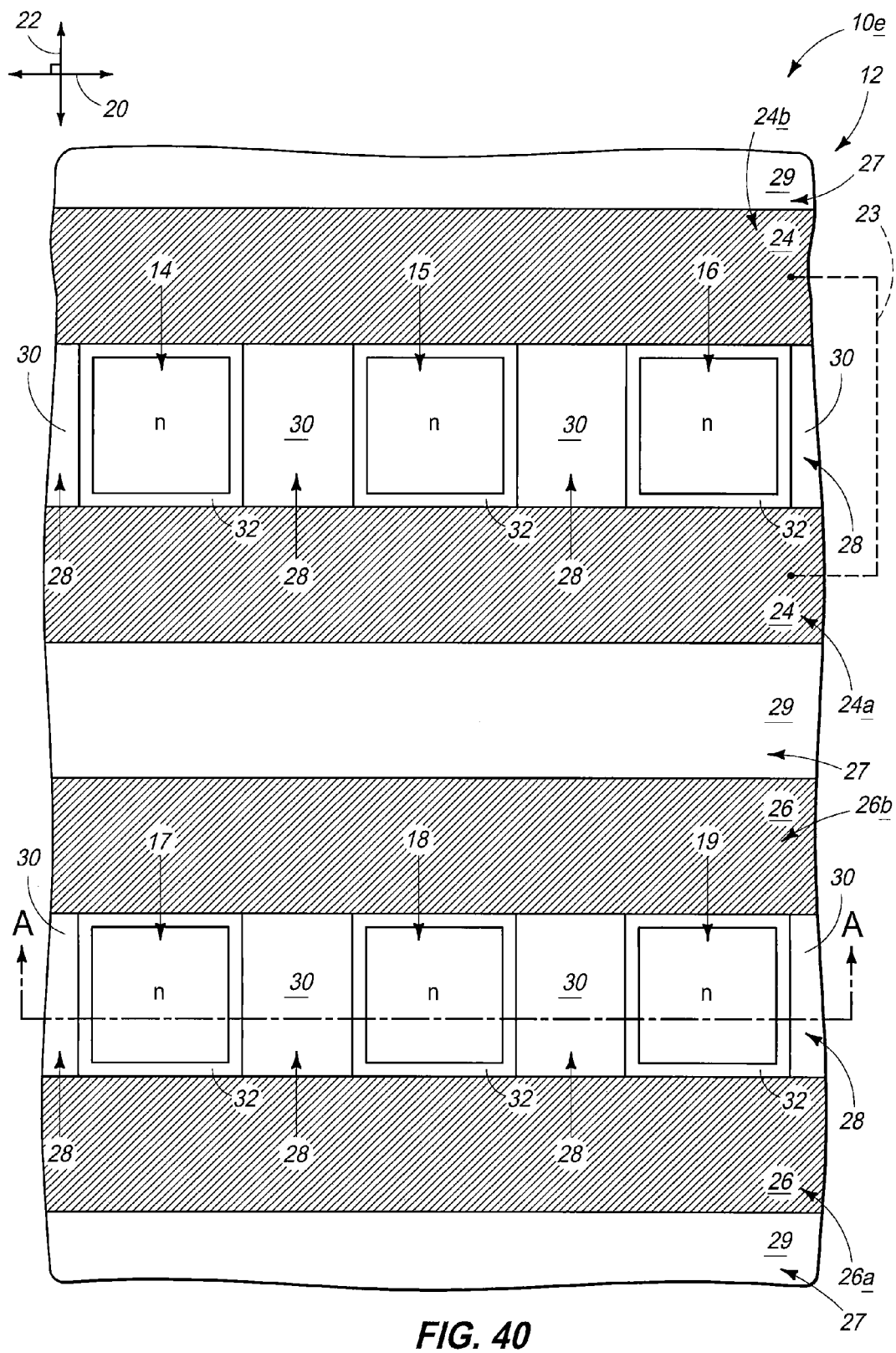
FIGS. 40 and 41 are a diagrammatic top view, and a cross-sectional side view of a portion of a semiconductor construction at a processing stage subsequent to that of FIGS. 38 and 39. The cross-sectional side view of FIG. 41 is along line A-A of FIG. 40.
Figure 41:
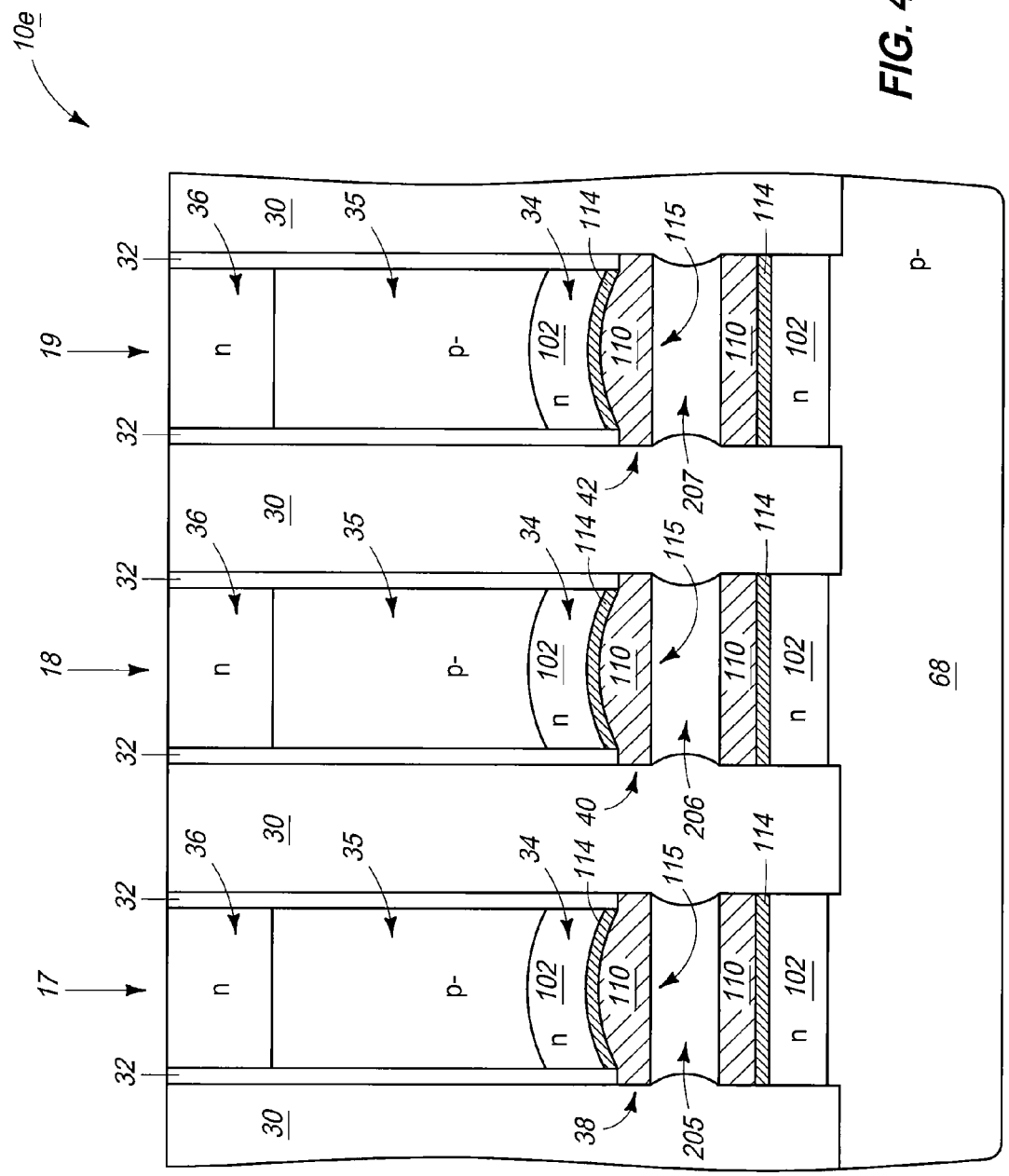

Referring to FIGS. 40 and 41, bridges 200-202 (FIGS. 38 and 39) are patterned to subdivide such bridges into vertically-oriented transistor pedestals 14-19 analogous to the pedestals discussed above with reference to FIG. 1. Specifically, bridge 200 (FIGS. 38 and 39) is subdivided into transistor pedestals 14 and 17, bridge 201 (FIGS. 38 and 39) is subdivided into transistor pedestals 15 and 18, and bridge 202 (FIGS. 38 and 39) is subdivided into transistor pedestals 16 and 19.

The patterning and subdividing of the bridges into the transistor pedestals may comprise any suitable processing, such as, for example, utilization of a patterned mask (which may be a photolithographically-patterned mask in some embodiments, a patterned mask formed utilizing pitch-multiplication methodologies in some embodiments, etc.) to define locations of the transistor pedestals, followed by one or more suitable etches to subdivide the bridges into such transistor pedestals. The patterning does not penetrate the metal-containing material 110 at the bottoms of the bridges, and accordingly such material can become digit lines 28, 40 and 42 analogous to those described above with reference to FIGS. 4 and 5. The etching may penetrate metal/semiconductor material 114 in some embodiments, and may not penetrate metal/semiconductor material in other embodiments. The metal/semiconductor material 114 forms structures analogous the metal silicide 58 discussed above with reference to FIGS. 4 and 5. If the etching utilized to subdivide the bridges into the transistor pedestals does not penetrate metal/semiconductor material 114, than the metal semiconductor material may remain as lines extending across the memory array region, and specifically as contiguous parts of the digit lines. If the etching utilized to subdivide the bridges into the transistor pedestals does penetrate metal/semiconductor material 114, than the metal semiconductor material will be subdivided into separated blocks. Each of such blocks will be associated with an individual transistor, and the contiguous parts of the digit lines will not comprise the metal/semiconductor material 114. The contiguous parts of the digit lines may thus comprise only the rails 115 of the metal-containing material 110 in some embodiments.

The construction of FIGS. 40 and 41 has the protective material 96 (FIGS. 38 and 39) replaced with gate dielectric material 32. As discussed previously, there may also be embodiments in which at least some of the protective material remains to be incorporated into the gate dielectric material.

The construction of FIGS. 40 and 41 has electrically insulative material 30 formed between adjacent transistor pedestals along rows of a memory array, analogously to the material 30 described above with reference to FIGS. 1, 4 and 5; has access lines 24 and 26 formed along sides of the transistor pedestals analogous to the access lines 24 and 26 discussed above with reference to FIGS. 1, 4 and 5; and has insulative material 29 formed between the adjacent access lines.

The n-type doped regions 102 above the digit lines are incorporated into bottom source/drain regions 34 identical to those discussed above with reference to FIGS. 1, 4 and 5. Upper n-type doped source/drain regions 36 are shown formed within the transistor pedestals 14-19. Such upper n-type doped source/drain regions may be formed after formation of the access lines, so that the upper source/drain regions are self-aligned to the access lines. Alternatively, the upper source/drain regions may be formed at any other suitable processing stage. P-type doped channel regions 35 are provided between the bottom source/drain regions 34 and the upper source/drain regions 36. Such channel regions have a threshold voltage dopant level provided therein. The threshold voltage dopant may be provided at any suitable processing stage.

In the embodiment of FIG. 41, the gaps 205-207 remain between the digit lines and the deck 101 after formation of insulative material 30. Such gaps may be considered to correspond to gas-filled cavities directly beneath the digit lines 38, 40 and 42, and in direct contact with such digit lines. The gas-filled cavities may extend the full length of a memory array section of a digit line (i.e., the portion of the digit line within the memory array region 215 that was described above with reference to FIG. 33) in some embodiments.

Figure 42:
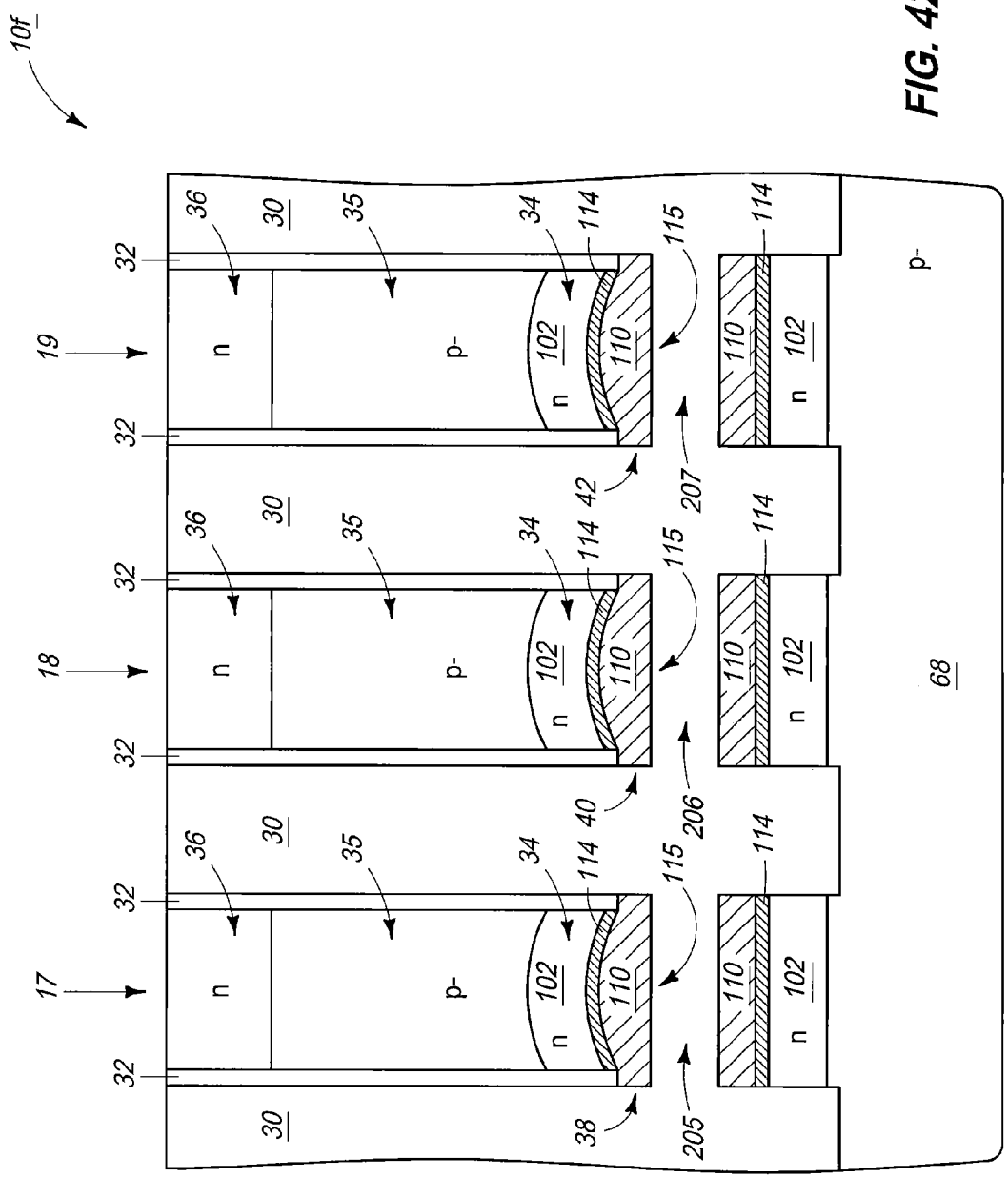
FIG. 42 is a diagrammatic cross-sectional side view of a portion of a semiconductor construction at a processing stage analogous to that of FIG. 41, but in accordance with an alternative embodiment to that of FIG. 41.

FIG. 42 shows a construction 10f analogous to the construction 10e of FIG. 41, but illustrating an alternative embodiment in which insulative material 30 extends within gaps 205-207 to fill such gaps. The insulative material 30 may comprise a solid or semisolid material, such as, for example, one or more of silicon dioxide, silicon nitride, silicon oxynitride, borophosphosilicate glass, phosphosilicate glass, etc. Accordingly, gaps 205-207 may be considered to be filled with electrically insulative material that is at least semisolid (i.e., which is semisolid or solid) in the embodiment of FIG. 42.

Figure 43:
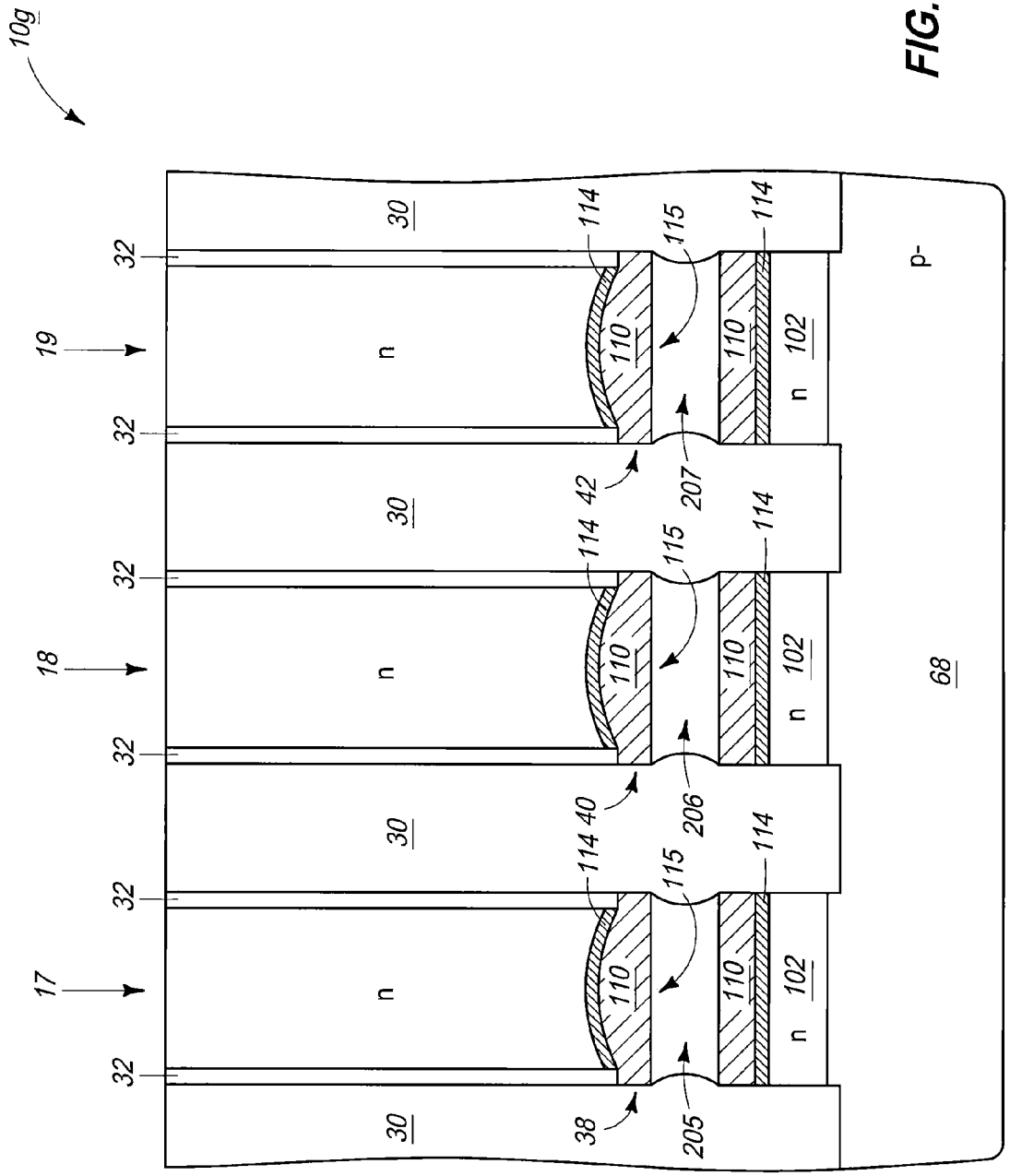
FIG. 43 is a diagrammatic cross-sectional side view of a portion of a semiconductor construction at a processing stage analogous to that of FIG. 41, but in accordance with another alternative embodiment relative to that of FIG. 41.

FIG. 43 shows a construction 10g analogous to the construction 10e of FIG. 41, but illustrating an alternative embodiment in which the transistor pedestals are entirely n-type doped; rather than being doped with a pair of n-type source/drain regions spaced from one another by a p-type channel region. The transistor pedestals can still function in transistor devices, provided that the pedestals are thin enough and otherwise appropriately configured to enable gated interconnection between the top regions of the pedestals and the bottom regions of the pedestals with appropriate access lines (for instance, access lines analogous to the access lines 24 and 26 of FIG. 40).

The constructions of FIGS. 40-43 may be incorporated into DRAM or ZRAM with appropriate subsequent processing.

Any of the various constructions described above may be utilized in memory array integrated circuitry, or other appropriate circuitry, and may be utilized in electronic systems. The electronic systems may be used in any of a diverse array of applications, such as, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

In this document, a primary surface relative to which a substrate is processed during fabrication may be considered to define a generally horizontal direction, "vertical" is a direction generally orthogonal to such horizontal direction. Further, "vertical" and "horizontal" as used herein are generally perpendicular directions relative to one another independent of orientation of the substrate in three-dimensional space.

Some of the figures show various different dopant levels, and utilize some or all of the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the term "p-type doped" and "n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a semiconductor construction, comprising:
    patterning a semiconductor material to form a plurality of linear segments of the semiconductor material extending upwardly from a base of the semiconductor material, the segments being spaced from one another by intervening trenches; individual linear segments comprising sidewall surfaces;
    forming protective material along the sidewall surfaces;
    while the protective material is along the sidewall surfaces, etching into the base to form cavities under the linear segments;
    forming metal-containing lines within the cavities;
    patterning each of the linear segments into a plurality of vertically-oriented transistor pedestals; the transistor pedestals extending upwardly from the metal-containing lines; the transistor pedestals forming an array comprising rows and columns; the metal-containing lines extending along columns of the array to interconnect transistor pedestals along said columns, and the metal-containing lines thus being incorporated into digit lines; the digit lines only comprising metal-containing materials; and
    forming access lines extending along rows of the array to interconnect transistor pedestals along said rows.

2. The method of claim 1 further comprising forming top and bottom source/drain regions within the individual transistor pedestals, with the top and bottom source/drain regions of individual transistor pedestals being spaced from one another by channel regions within the individual transistor pedestals.

3. The method of claim 2 wherein the bottom source/drain regions are formed by implanting dopant into bottoms of the linear segments prior to forming the metal-containing lines.

4. The method of claim 2 wherein the top source/drain regions are formed by implanting dopant into tops of the transistor pedestals after forming the access lines.

5. The method of claim 1 wherein the cavities completely undercut the linear segments to convert the segments into bridges having gaps thereunder, wherein the metal-containing lines are formed along the bottoms of the bridges and do not eliminate the gaps under the bridges, and wherein the patterning of the segments into the vertically-oriented transistor pedestals comprises patterning the bridges into the vertically-oriented transistor pedestals.

6. The method of claim 5 further comprising filling the gaps under the bridges with electrically insulative material after forming the metal-containing lines, with said electrically insulative material being at least semisolid.

7. The method of claim 5 wherein gas-filled gaps remain under the metal-containing lines after forming the access lines.

8. The method of claim 1 wherein the semiconductor material comprises silicon; wherein the cavities extend only partially under the linear segments to leave silicon-containing footings under the linear segments; and further comprising converting the silicon of the silicon-containing footings into metal silicide by reacting silicon from the silicon-containing footings with metal from the metal-containing lines.

9. A method of forming a semiconductor construction, comprising:
    patterning a silicon-containing material to form a plurality of linear segments of the silicon-containing material extending upwardly from a base of the silicon-containing material, the segments being spaced from one another by intervening trenches; individual linear segments comprising sidewall surfaces;
    forming protective material along the sidewall surfaces;
    while the protective material is along the sidewall surfaces, etching into the base to form silicon-containing footings under the linear segments;
    converting the footings into metal silicide;
    patterning each of the linear segments into a plurality of vertically-oriented transistor pedestals; the transistor pedestals extending upwardly from the metal silicide footings;
    forming top and bottom source/drain regions within the transistor pedestals, with the top and bottom source/drain regions of individual pedestals being spaced from one another by channel regions within the individual pedestals; the transistor pedestals forming an array comprising rows and columns; the metal silicide footings extending along columns of the array to interconnect transistor pedestals along said columns; and
    forming access lines extending along rows of the array to interconnect transistor pedestals along said rows, the access lines extending across the channel regions and forming gates across the channel regions.

10. The method of claim 9 wherein the metal silicide footings are utilized as digit lines extending under the array, and wherein the metal silicide of the footings is the only electrically conductive material of the digit lines under the array.

11. The method of claim 9 further comprising forming metal-containing lines on opposing sides of individual metal silicide footings to form digit lines comprising the footings in combination with the metal-containing lines.

12. The method of claim 9 wherein the protective material is electrically insulative, and remains along sidewalls of the transistor pedestals as gate dielectric.

13. The method of claim 9 further comprising removing the protective material and replacing it with gate dielectric.

14. The method of claim 1 wherein the semiconductor material comprises germanium; wherein the cavities extend only partially under the linear segments to leave germanium-containing footings under the linear segments; and further comprising reacting at least some of the germanium of the germanium-containing footings with metal.

* * * * *